US012696799B2

(12) United States Patent
Yamauchi

(10) Patent No.: US 12,696,799 B2
(45) Date of Patent: Jul. 28, 2026

(54) BONDING METHOD, BONDED ARTICLE, AND BONDING DEVICE

(71) Applicant: BONDTECH CO., LTD., Kyoto (JP)

(72) Inventor: Akira Yamauchi, Kyoto (JP)

(73) Assignee: BONDTECH CO., LTD., Kyoto (JP)

( * ) Notice: Subject to any disclaimer, the term of this patent is extended or adjusted under 35 U.S.C. 154(b) by 793 days.

(21) Appl. No.: 17/788,957

(22) PCT Filed: Feb. 7, 2020

(86) PCT No.: PCT/JP2020/004863
§ 371 (c)(1),
(2) Date: Jun. 24, 2022

(87) PCT Pub. No.: WO2021/131081
PCT Pub. Date: Jul. 1, 2021

(65) Prior Publication Data
US 2023/0030272 A1     Feb. 2, 2023

(30) Foreign Application Priority Data
Dec. 27, 2019     (JP) ................................. 2019-238011

(51) Int. Cl.
*H01L 23/00*          (2006.01)
*H01L 25/075*        (2006.01)
(52) U.S. Cl.
CPC .............. *H01L 24/80* (2013.01); *H01L 24/05* (2013.01); *H01L 24/08* (2013.01); *H01L 24/74* (2013.01);
(Continued)

(58) Field of Classification Search
CPC ......... H01L 24/80; H01L 24/05; H01L 24/08; H01L 24/74; H01L 25/0753;
(Continued)

(56) References Cited

U.S. PATENT DOCUMENTS 7,660,389  B1    2/2010  Becker
2007/0145551 A1   6/2007  Yamaji et al.
(Continued)

FOREIGN PATENT DOCUMENTS

CN          101411251  A      4/2009
CN          101432861  A      5/2009
(Continued)

OTHER PUBLICATIONS

US Office Action issued in U.S. Appl. No. 17/295,857, filed Mar. 14, 2023, USPTO, USA, 17 pages.
(Continued)

*Primary Examiner* — John P. Dulka
(74) *Attorney, Agent, or Firm* — ASLAN LAW, P.C.

(57)          ABSTRACT

A bonding device measures a position deviation amount of the chip with respect to the substrate in a state where the chip and the substrate are in contact, and corrects and moves the chip relatively to the substrate in such a way as to reduce the position deviation amount, based on the measured position deviation amount. Then, the bonding device fixes the chip to the substrate by irradiating a resin portion of the chip with an ultraviolet ray and curing the resin portion when the position deviation amount of the chip with respect to the substrate is equal to or less than a position deviation amount threshold value.

14 Claims, 35 Drawing Sheets

(52) U.S. Cl.

CPC ................... *H01L 25/0753* (2013.01); *H01L 2224/05578* (2013.01); *H01L 2224/05647* (2013.01); *H01L 2224/05687* (2013.01); *H01L 2224/0569* (2013.01); *H01L 2224/08225* (2013.01); *H01L 2224/80123* (2013.01); *H01L 2224/8013* (2013.01); *H01L 2224/80132* (2013.01); *H01L 2224/80203* (2013.01); *H01L 2224/8083* (2013.01); *H01L 2224/80874* (2013.01); *H01L 2224/80893* (2013.01); *H01L 2224/80895* (2013.01); *H01L 2224/80896* (2013.01); *H01L 2224/80907* (2013.01); *H01L 2224/80908* (2013.01); *H01L 2224/80986* (2013.01); *H01L 2924/12041* (2013.01); *H01L 2924/35121* (2013.01); *H01L 2924/3656* (2013.01)

(58) Field of Classification Search

CPC . H01L 2224/05578; H01L 2224/05647; H01L 2224/05687; H01L 2224/0569; H01L 2224/08225; H01L 2224/80123; H01L 2224/8013; H01L 2224/80132; H01L 2224/80203; H01L 2224/8083; H01L 2224/80874; H01L 2224/80893; H01L 2224/80895; H01L 2224/80896; H01L 2224/80907; H01L 2224/80908; H01L 2224/80986; H01L 2924/12041; H01L 2924/35121; H01L 2924/3656; H01L 2224/75251; H01L 2224/75262; H01L 2224/75702; H01L 2224/75753; H01L 24/743; H01L 24/75; H01L 22/12; H01L 2223/54426; H01L 2223/54486; H01L 21/67103; H01L 21/67248; H01L 21/67253; H01L 21/681; H01L 21/67092

See application file for complete search history.

(56) References Cited

U.S. PATENT DOCUMENTS

| | | | |
|---|---|---|---|
| 2009/0078746 | A1 | 3/2009 | Karashima et al. |
| 2009/0102064 | A1 | 4/2009 | Sawada et al. |
| 2012/0127485 | A1 | 5/2012 | Yamauchi |
| 2016/0172254 | A1 | 6/2016 | Wimplinger |
| 2017/0033071 | A1 | 2/2017 | Ichikawa |
| 2019/0109034 | A1 | 4/2019 | Fehkuhrer |
| 2020/0006099 | A1 | 1/2020 | Yamauchi |

FOREIGN PATENT DOCUMENTS

| | | | | | |
|---|---|---|---|---|---|
| JP | 11-97489 | A | 4/1999 | | |
| JP | 2000-332054 | A | 11/2000 | | |
| JP | 2002-373914 | A | 12/2002 | | |
| JP | 2006-69863 | A | 3/2006 | | |
| JP | 2007-180384 | A | 7/2007 | | |
| JP | 2008-084951 | A | 4/2008 | | |
| JP | 2009-220151 | A | 10/2009 | | |
| JP | 2011-66287 | A | 3/2011 | | |
| JP | 2012-138423 | A | 7/2012 | | |
| JP | 2012-238775 | A | 12/2012 | | |
| JP | 2013-4609 | A | 1/2013 | | |
| JP | 2013004609 | A | * | 1/2013 | |
| JP | 2013-251405 | A | 12/2013 | | |
| JP | 2014-113633 | A | 6/2014 | | |
| JP | 2015-8228 | A | 1/2015 | | |
| JP | 2015-211130 | A | 11/2015 | | |
| JP | 2017-028216 | A | 2/2017 | | |
| JP | 2019-79893 | A | 5/2019 | | |
| JP | 2019-204832 | A | 11/2019 | | |
| JP | 2019-204971 | A | 11/2019 | | |
| TW | 200723990 | A | 6/2007 | | |
| WO | WO-2018147147 | A1 | * | 8/2018 | ........... H01L 23/544 |

OTHER PUBLICATIONS

International Search Report issued in PCT Application No. PCT/JP2019/045689, Jan. 7, 2020, JPO, Japan, 3 pages.
EP Search Report issued in EP Application No. 19 886 782.2, Sept 8, 2022, EPO, Germany, 8 pages.
JP Office Action issued in JP Application No. 2020-557644, Oct. 18, 2022, JPO, Japan, 4 pages.
Japanese Office Action, issued for the corresponding JP patent application No. 2021-566778, Japan, 8 pages, Sep. 6, 2022.
US Office Action issued in U.S. Appl. No. 17/295,854, filed Mar. 28, 2023, USPTO, USA, 30 pages.
International Search Report issued in PCT Application No. PCT/JP2019/045685, Feb. 18, 2020, JPO, Japan, 3 pages.
EP Search Report issued in EP Application No. 19 887 578.3, 8 pages, Sep. 19, 2022, EPO, Germany.
JP Office Action issued in JP patent application No. 2020-557640, Jan. 10, 2023, JPO, Japan, 4 pages.
JP Office Action (Decision of Refusal) issued in JP patent application No. 2020-557640, JPO Japan, Apr. 18, 2023, 2 pages.
US Office Action issued in U.S. Appl. No. 17/295,855, filed Mar. 13, 2023, USPTO, USA, 16 pages.
International Search Report issued in PCT Application No. PCT/JP2019/045686, Feb. 18, 2020, JPO, Japan, 2 pages.
EP Search Report issued in EP Application No. 19 886 916.6, 9 pages, Sep. 14, 2022, EPO, Germany, 9 pages.
JP Office Action issued in JP patent application No. 2020-557641, Jan. 10, 2023, JPO, Japan, 4 pages.
JP Office Action (Decision of Refusal) issued in JP Application No. 2020-557641, Apr. 18, 2023, JPO., Japan, 2 pages.
Extended European Search Report (EESR) of Dec. 5, 2023, issued for the corresponding EP patent application No. 20907074.7, EPO, Munich Germany, 8 pages.
Taiwanese Office Action dated Aug. 29, 2023, issued for the corresponding TW patent application No. 109102999, Taiwan, 29 pages.

* cited by examiner

BONDING METHOD, BONDED ARTICLE,
AND BONDING DEVICE

CROSS-REFERENCE TO RELATED
APPLICATIONS

This application claims priority to JP Patent Application
No. 2019-238011 filed on Dec. 27, 2019, and this applica-
tion claims priority to and is a 371 of international PCT
Application No. PCT/JP2020/004863 filed on Feb. 7, 2020,
the entire contents of which are hereby incorporated by
reference.

TECHNICAL FIELD

The present disclosure relates to a bonding method, a
bonded article, and a bonding device.

BACKGROUND ART

A bonding device that measures a position deviation
amount of two bonded articles in a state where one of the
bonded articles is held by a stage and the other is held by a
head, performs positioning of the bonded articles, based on
the position deviation amount, and then bonds the bonded
articles together has been proposed (for example, see Patent
Literature 1).

CITATION LIST

Patent Literature

Patent Literature 1: Unexamined Japanese Patent Appli-
cation Publication No. 2011-066287

SUMMARY OF INVENTION

Technical Problem

However, in a bonding method described in Patent Lit-
erature 1, when two bonded articles are bonded together, the
two bonded articles are bonded by pressurizing while heat-
ing the bonded articles. Therefore, a position deviation may
occur due to thermal expansion of the two bonded articles.
The present disclosure has been made in view of the
circumstances described above, and an objective of the
present disclosure is to provide a bonding method and a
bonding device that can bond bonded articles together with
high position accuracy.

Solution to Problem

In order to achieve the objective described above, a
bonding method according to the present disclosure is a
bonding method for bonding a first bonded article and a
second bonded article, the second bonded article including
a second bonding portion bonded to a first bonding portion
of the first bonded article, and a resin portion located in a
region other than the second bonding portion on a side
bonded to the first bonded article, and formed of an ultra-
violet curing resin, and the bonding method includes:
    a positioning step of determining a relative position of the
        second bonded article with respect to the first bonded
        article in such a way as to reduce a position deviation
        amount of the second bonded article with respect to the first bonded article while maintaining the first bonded
    article and the second bonded article at a same preset
    prescribed temperature;
    a contact step of bringing the second bonding portion and
        the resin portion of the second bonded article into
        contact with the first bonded article after the position-
        ing step;
    a fixing step of fixing the second bonded article to the first
        bonded article by irradiating the resin portion with an
        ultraviolet ray and curing the resin portion in a state
        where the first bonded article and the second bonded
        article are maintained at the prescribed temperature and
        the resin portion of the second bonded article is in
        contact with the first bonded article; and
    a bonding step of bonding the second bonding portion of
        the second bonded article to the first bonding portion of
        the first bonded article by heating the first bonded
        article and the second bonded article in a state where
        the second bonded article is fixed to the first bonded
        article.
    A bonding method according to the present disclosure
viewed from another viewpoint is a bonding method for
bonding a first bonded article formed of a glass containing
an alkaline ion and a second bonded article formed of a
metal or a semiconductor, and the bonding method includes:
    a positioning step of determining a relative position of the
        second bonded article with respect to the first bonded
        article in such a way as to reduce a position deviation
        amount of the second bonded article with respect to the
        first bonded article while maintaining the first bonded
        article and the second bonded article at a same preset
        prescribed temperature;
    a contact step of bringing the second bonded article into
        contact with the first bonded article after the position-
        ing step;
    a measurement step of measuring a position deviation
        amount of the first bonded article with respect to the
        second bonded article in a state where the first bonded
        article and the second bonded article are in contact;
    a correction movement step of correcting and moving the
        second bonded article relatively to the first bonded
        article in such a way as to reduce the position deviation
        amount, based on the position deviation amount; and
    a bonding step of bonding the second bonded article to the
        first bonded article by applying a DC voltage between
        the first bonded article and the second bonded article in
        a state where the first bonded article and the second
        bonded article are maintained at the prescribed tem-
        perature and the second bonded article is in contact
        with the first bonded article, wherein,
    when the position deviation amount is equal to or less than
        a preset position deviation amount threshold value, the
        bonding step is performed, and, when the position
        deviation amount is greater than the position deviation
        amount threshold value, the measurement step and the
        correction movement step are performed again.
    A bonding method according to the present disclosure
viewed from another viewpoint is a bonding method for
bonding a first bonded article and a second bonded article
including a second bonding portion bonded to a first bonding
portion of the first bonded article, and the bonding method
includes:
    a positioning step of determining a relative position of the
        second bonded article with respect to the first bonded
        article in such a way as to reduce a position deviation
        amount of the second bonded article with respect to the first bonded article while maintaining the first bonded article and the second bonded article at a same preset prescribed temperature;

a contact step of bringing the first bonding portion and the second bonding portion into contact after the positioning step;

a measurement step of measuring a position deviation amount of the first bonded article with respect to the second bonded article in a state where the first bonding portion and the second bonding portion are in contact;

a correction movement step of correcting and moving the second bonded article relatively to the first bonded article in such a way as to reduce the position deviation amount, based on the position deviation amount; and a fixing step of fixing the second bonded article to the first bonded article by pressurizing with pressure equal to or more than preset reference pressure in a direction of close adhesion between the first bonded article and the second bonded article in a state where the first bonded article and the second bonded article are maintained at the prescribed temperature and the first bonding portion and the second bonding portion are in contact, wherein, when the position deviation amount is equal to or less than a preset position deviation amount threshold value, the fixing step is performed, and, when the position deviation amount is greater than the position deviation amount threshold value, the measurement step and the correction movement step are performed again.

A bonding method according to the present disclosure viewed from another viewpoint is a bonding method for bonding a first bonded article and a second bonded article including a second bonding portion bonded to a first bonding portion of the first bonded article, and the bonding method includes:

a hydrophilic treatment step of performing hydrophilic treatment on at least one of the first bonding portion and the second bonding portion;

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the first bonding portion and the second bonding portion into contact after the positioning step;

a measurement step of measuring a position deviation amount of the first bonded article with respect to the second bonded article in a state where the first bonded article and the second bonded article are in contact;

a correction movement step of correcting and moving the second bonded article relatively to the first bonded article in such a way as to reduce the position deviation amount, based on the position deviation amount; and a temporary bonding step of temporarily bonding the second bonded article to the first bonded article by pressurizing in a direction of close adhesion between the first bonding portion of the first bonded article and the second bonding portion of the second bonded article in a state where the first bonding portion and the second bonding portion are in contact, wherein, when the position deviation amount is equal to or less than a preset position deviation amount threshold value, the temporary bonding step is performed, and, when the position deviation amount is greater than the position deviation amount threshold value, the measurement step and the correction movement step are performed again.

A bonded article according to the present disclosure viewed from another viewpoint includes:

a second bonding portion bonded to a first bonding portion of another bonded article, and a resin portion located in a region other than the second bonding portion on a side bonded to the another bonded article, and formed of an ultraviolet curing resin.

A bonding device according to the present disclosure viewed from another viewpoint is a bonding device that bonds a first bonded article and a second bonded article, the second bonded article including a second bonding portion bonded to a first bonding portion of the first bonded article, and a resin portion located in a region other than the second bonding portion on a side bonded to the first bonded article, and formed of an ultraviolet curing resin, and the bonding device includes:

a first bonded article holder that holds the first bonded article;

a second bonded article holder that holds the second bonded article;

a first holder driver that moves the second bonded article holder relatively to the first bonded article holder in a direction closer to the first bonded article holder or a direction farther from the second bonded article holder in a first direction in which the first bonded article holder and the second bonded article holder face each other;

a measurement unit that measures a position deviation amount of the second bonded article with respect to the first bonded article in a state where the first bonded article and the second bonded article are maintained at a same preset prescribed temperature;

a second holder driver that moves the second bonded article holder relatively to the first bonded article holder in a second direction orthogonal to the first direction;

an ultraviolet ray irradiation source that irradiates the first bonded article and the second bonded article with an ultraviolet ray; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by irradiating the resin portion with an ultraviolet ray and curing the resin portion by controlling the ultraviolet ray irradiation source when the position deviation amount is equal to or less than a preset position deviation amount threshold value.

A bonding device according to the present disclosure viewed from another viewpoint is a bonding device that bonds a first bonded article formed of a glass containing an alkaline ion and a second bonded article formed of a metal or a semiconductor, and the bonding device includes:

a first bonded article holder that holds the first bonded article;

a second bonded article holder that holds the second bonded article;

a first holder driver that moves the second bonded article holder relatively to the first bonded article holder in a direction closer to the first bonded article holder or a direction farther from the second bonded article holder in a first direction in which the first bonded article holder and the second bonded article holder face each other;

a temperature adjuster that adjusts a temperature of the first bonded article and a temperature of the second bonded article;

a measurement unit that measures a position deviation amount of the second bonded article with respect to the first bonded article in a state where the first bonded article and the second bonded article are maintained at a same preset prescribed temperature by the temperature adjuster;

a second holder driver that moves the second bonded article holder relatively to the first bonded article holder in a second direction orthogonal to the first direction;

a DC power source that applies a DC voltage between the first bonded article and the second bonded article; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by applying a DC voltage between the first bonded article and the second bonded article by controlling the DC power source when the position deviation amount is equal to or less than a preset position deviation amount threshold value.

A bonding device according to the present disclosure viewed from another viewpoint is a bonding device that bonds a first bonded article and a second bonded article including a second bonding portion bonded to a first bonding portion of the first bonded article, and the bonding device includes:

a first bonded article holder that holds the first bonded article;

a second bonded article holder that holds the second bonded article;

a first holder driver that moves the second bonded article holder relatively to the first bonded article holder in a direction closer to the first bonded article holder or a direction farther from the second bonded article holder in a first direction in which the first bonded article holder and the second bonded article holder face each other;

a temperature adjuster that adjusts a temperature of the first bonded article and a temperature of the second bonded article;

a measurement unit that measures a position deviation amount of the second bonded article with respect to the first bonded article in a state where the first bonded article and the second bonded article are maintained at a same preset prescribed temperature by the temperature adjuster;

a second holder driver that moves the second bonded article holder relatively to the first bonded article holder in a second direction orthogonal to the first direction; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by pressing the second bonded article against the first bonded article with pressure equal to or more than preset reference pressure when the position deviation amount is equal to or less than a preset position deviation amount threshold value.

Advantageous Effects of Invention

According to the present disclosure, a relative position of a second bonded article with respect to a first bonded article is determined, the second bonded article is then brought into contact with the first bonded article, and the second bonded article is then fixed to the first bonded article in a state where the first bonded article and the second bonded article are maintained at the same prescribed temperature. In this way, after that, when the first bonded article and the second bonded article are heated, the second bonded article is fixed in advance to the first bonded article, and thus an occurrence of a position deviation caused by thermal expansion of the first bonded article and the second bonded article can be suppressed. Therefore, the first bonded article and the second bonded article can be bonded together with high position accuracy.

DESCRIPTION OF EMBODIMENTS

Embodiment 1

Hereinafter, a bonding device according to the embodiments of the present disclosure is described with reference to drawings. The bonding device according to the present embodiment is a device that bonds an electronic part onto a substrate. The electronic part is, for example, a semiconductor chip (hereinafter simply referred to as a "chip") supplied from a diced substrate. The bonding device bonds the chip to the substrate by bringing a first metal portion (electrode) of the substrate into contact with a second metal portion (electrode) of the chip, and pressurizing and heating the metal portions. Further, a resin portion formed of an ultraviolet curing resin is provided on a part of the chip on a side bonded to the substrate.

Figure 1:
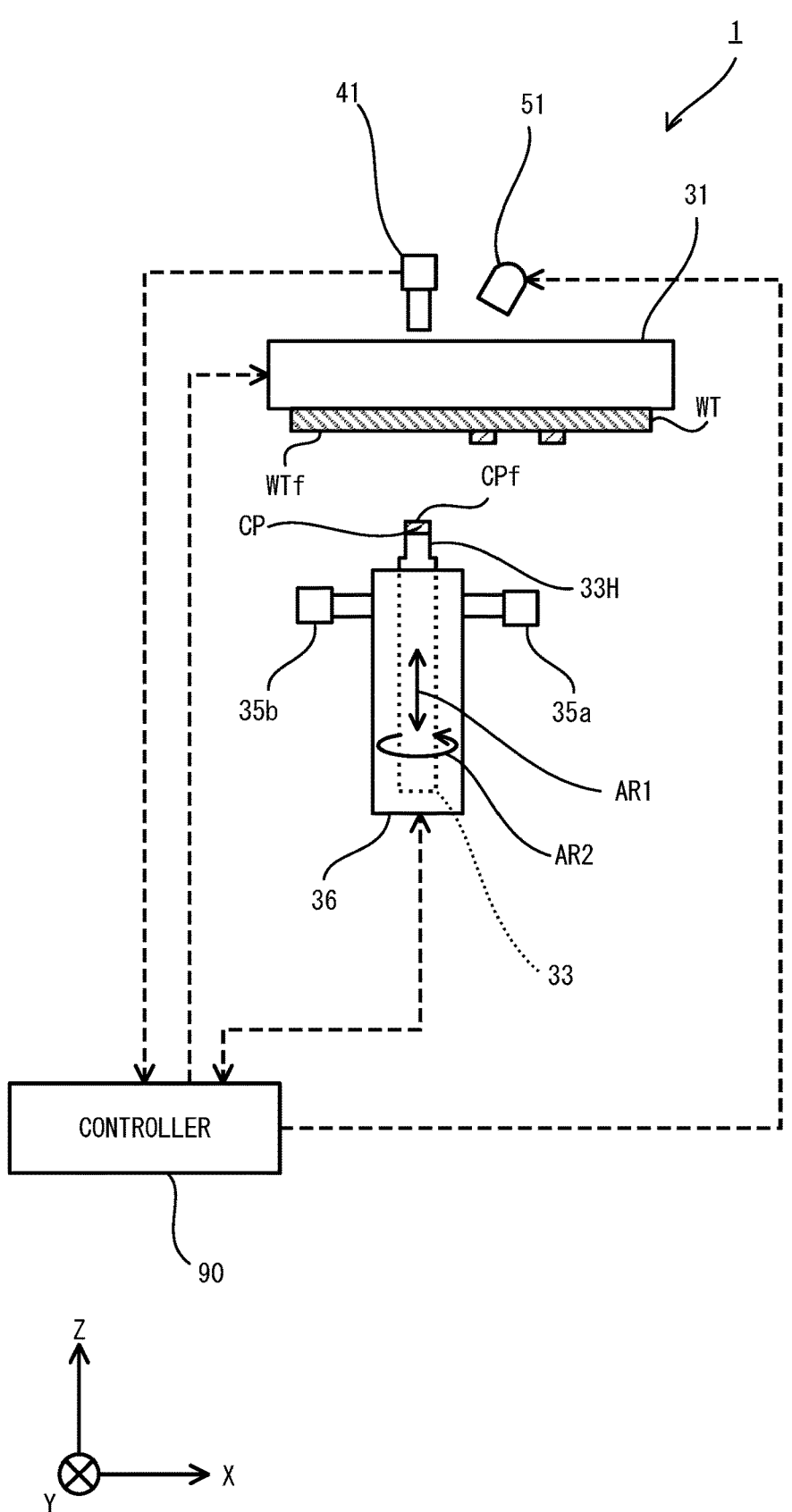
FIG. 1 is a schematic front view of the inside of a bonding device according to Embodiment 1 of the present disclosure.
Figure 2:
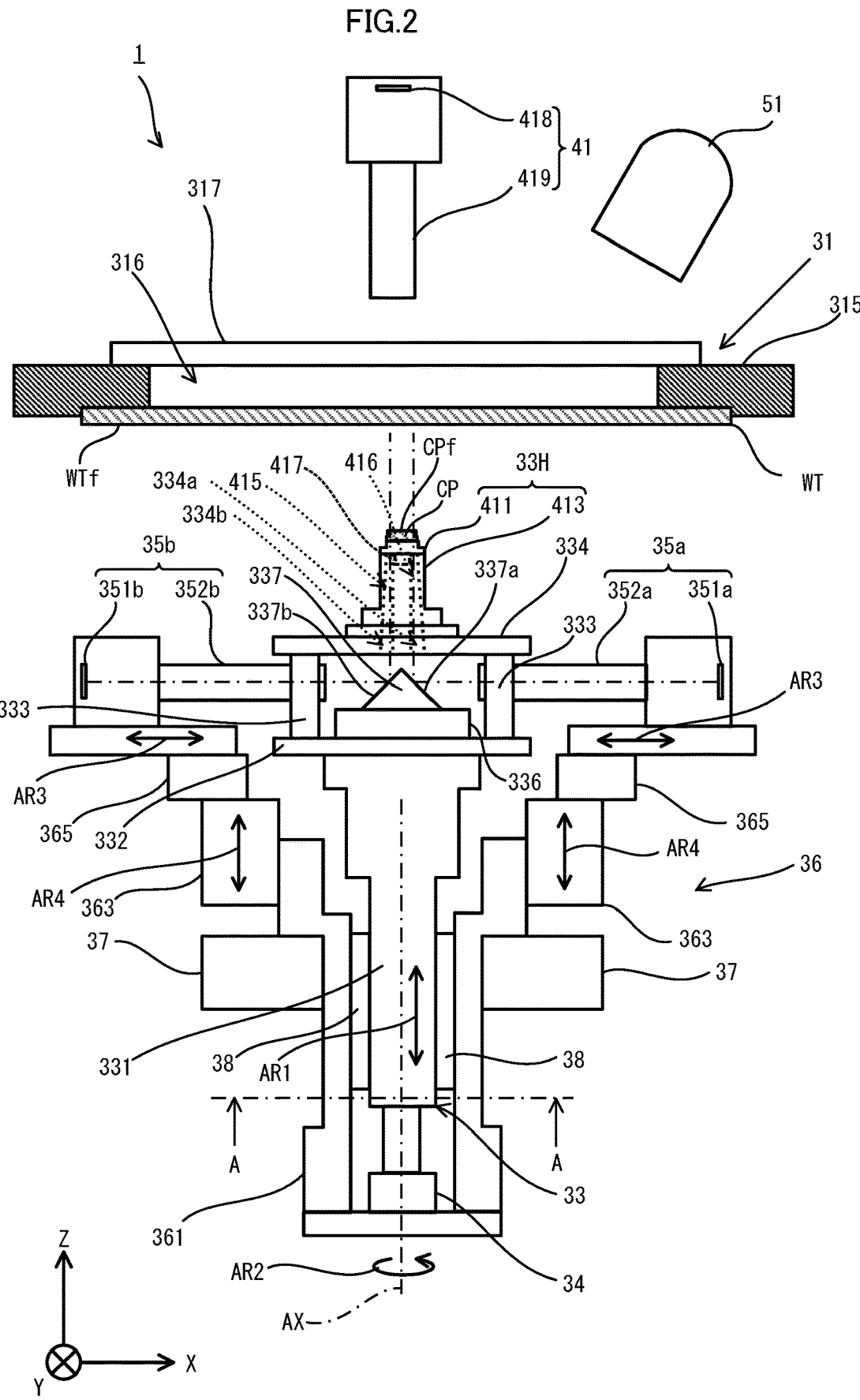
FIG. 2 is a schematic configuration diagram of a part of the bonding device according to Embodiment 1.

As illustrated in FIG. 1, a bonding device 1 according to the present embodiment is a so-called chip mounter that mounts a chip CP on a substrate WT, and includes a stage 31, a bonding unit 33 including a head 33H, a head driver 36 that drives the head 33H, capturing units 35a, 35b, and 41, and an ultraviolet ray irradiation source 51. Further, as illustrated in FIG. 2, the bonding device 1 includes a camera F direction driver 365 and a camera Z direction driver 363.

Figure 3A:
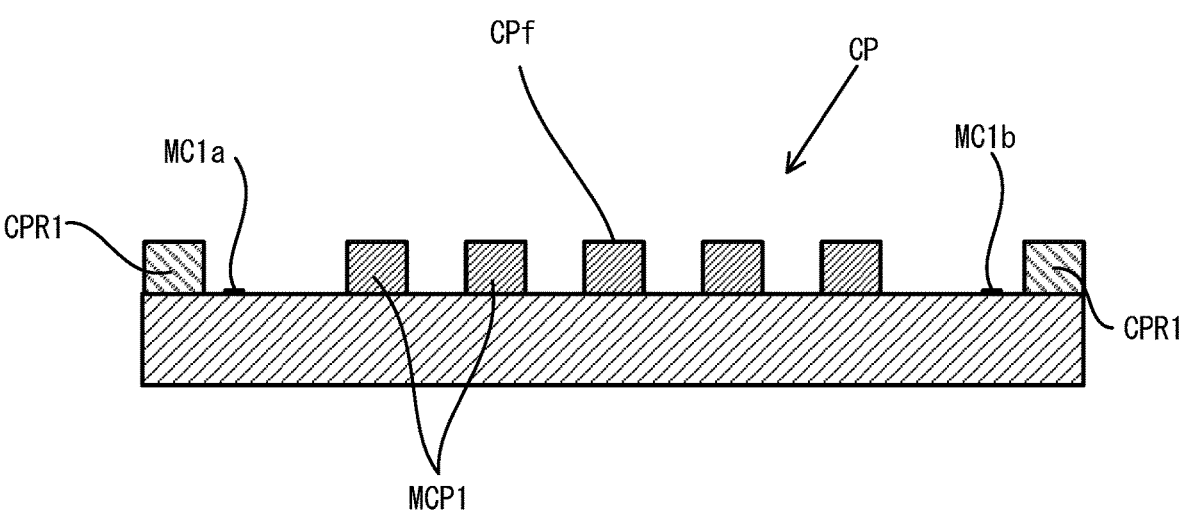
FIG. 3A is a schematic diagram of a chip.

The substrate WT is a first bonded article acquired by providing a metal portion on a substrate having property of transmitting light in a wavelength region of at least a part of a wavelength band of an ultraviolet region, such as a sapphire substrate, an alumina substrate, and a glass substrate, for example. Here, the metal portion is a first metal portion formed of various metals such as solder, Au, Cu, and Al, and corresponds to a first bonding portion of the substrate WT. For example, as illustrated in FIG. 3A, the chip CP is a second bonded article including a metal portion MCP1 and a resin portion CPR1 that are provided on a side bonded to the substrate WT. The metal portion MCP1 is a second metal portion formed of various metals such as solder, Au, Cu, and Al, and corresponds to a second bonding portion of the chip CP. The resin portion CPR1 is formed of an ultraviolet curing resin. As the ultraviolet curing resin, an acrylic-based ultraviolet curing resin, an epoxy-based ultraviolet curing resin, and the like are adopted. Here, in the chip CP, a surface of the resin portion CPR1 fixed to the substrate WT and a surface of the second metal portion bonded to the substrate WT are flush with each other.

Figure 3B:
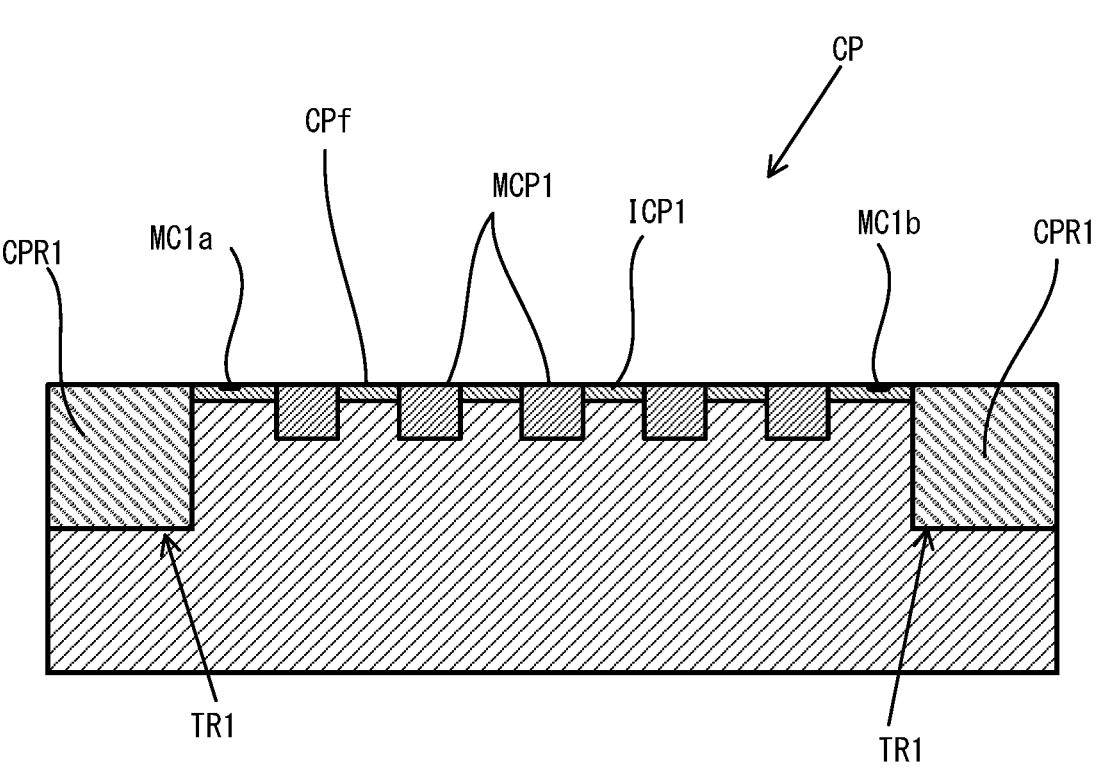
FIG. 3B is a schematic diagram of the chip.

Alternatively, the resin portion CPR1 of the chip CP may protrude further than the second metal portion to a degree that the resin portion CPR1 does not enter a portion of the chip CP bonded to the substrate WT when the chip CP is pressed against the substrate WT. Since the resin portion CPR1 has property of contracting during curing, the resin portion CPR1 is suitable for close adhesion between the bonding portion of the chip CP and the bonding portion of the substrate WT. Note that, for example, as illustrated in FIG. 3B, the chip CP may be embedded in a recessed portion TR1 provided in a region other than the metal portion MCP1 on a side on which the resin portion CPR1 is bonded to the substrate WT. Here, the bonding portion of the chip CP is polished by a chemical mechanical polishing (CMP) method, and is made flat. For example, the bonding portion has flatness of Ra of equal to or less than 1 nm.

The bonding unit 33 includes a Z-axis direction movement member 331, a first disc member 332, a piezoelectric actuator 333, a second disc member 334, a mirror fixing member 336, a mirror 337, and the head 33H. The first disc member 332 is fixed to an upper end portion of the Z-axis direction movement member 331. Further, the second disc member 334 is disposed on an upper side of the first disc member 332. The first disc member 332 and the second disc member 334 are connected to each other via the piezoelectric actuator 333. Furthermore, the head 33H is fixed on an upper surface side of the second disc member 334. The head 33H adsorbs and holds the chip CP.

Figure 4:
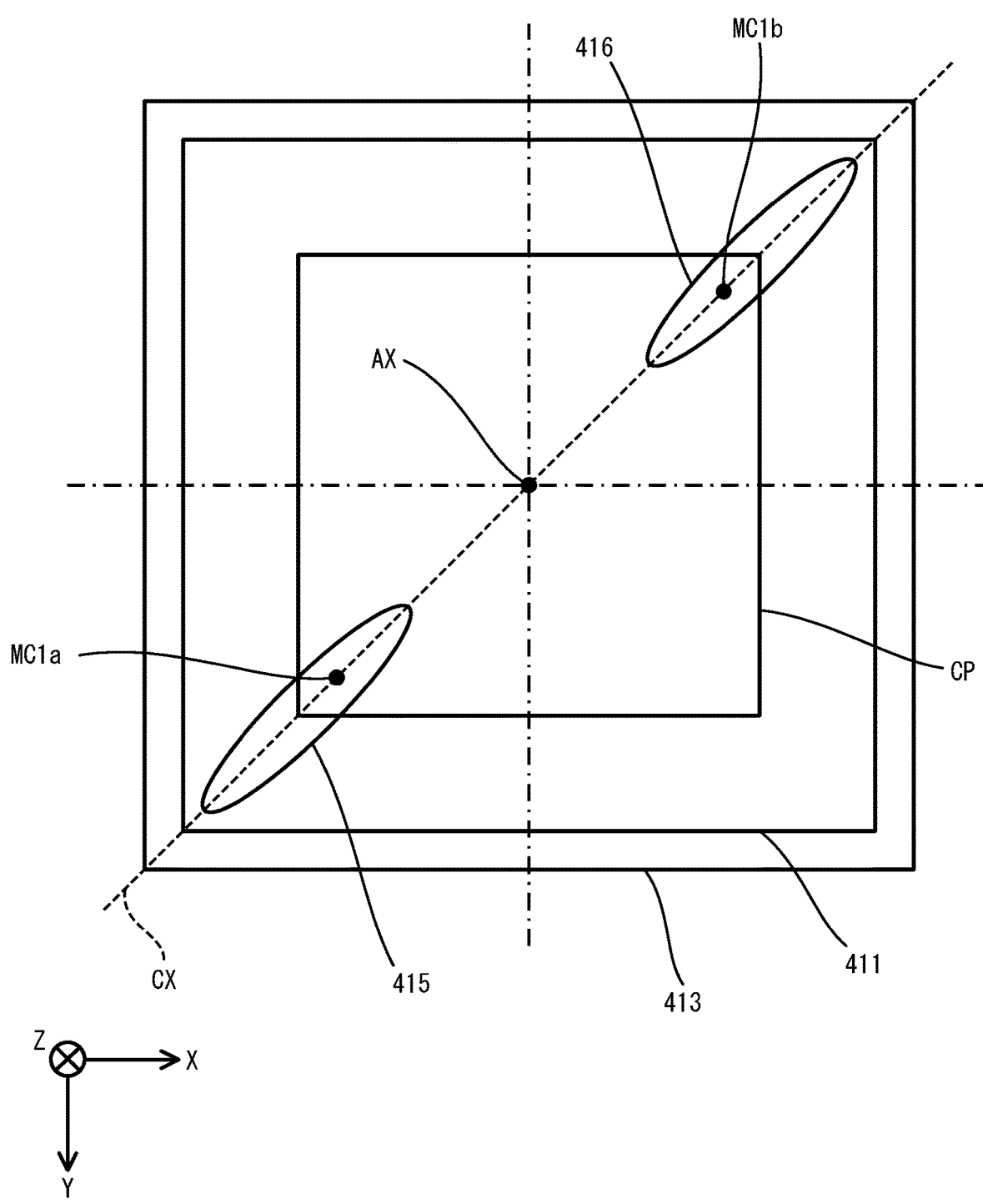
FIG. 4 is a diagram illustrating a positional relationship between alignment marks of the chip and a hollow portion of a head according to Embodiment 1.

The head 33H is a second bonded article holder that holds the chip CP from a vertically downward direction (–Z direction). The head 33H includes a chip tool 411 and a head main body 413. The chip tool 411 is formed of a material (for example, silicon (Si)) that transmits capturing light (such as infrared light). Further, a temperature adjuster 417 that adjusts a temperature of the chip CP held by the chip tool 411 is built in the head main body 413. The temperature adjuster 417 includes a ceramic heater, a coil heater, or the like. Further, the head main body 413 is provided with hollow portions 415 and 416 for transmitting (passing) capturing light. Each of the hollow portions 415 and 416 is a transmission portion that transmits capturing light, and is provided in such a way as to penetrate the head main body 413 in a vertical direction (Z-axis direction). Further, as illustrated in FIG. 4, each of the hollow portions 415 and 416 has an elliptical shape in a top view. The two hollow portions 415 and 416 are disposed in such a way as to have point symmetry about an axis AX as the center in diagonal portions of the head main body 413 having a substantially square shape in the top view. Note that, holes 334a and 334b are also provided in portions corresponding to the hollow portions 415 and 416 in the second disc member 334 in order to transmit capturing light.

Figure 5A:
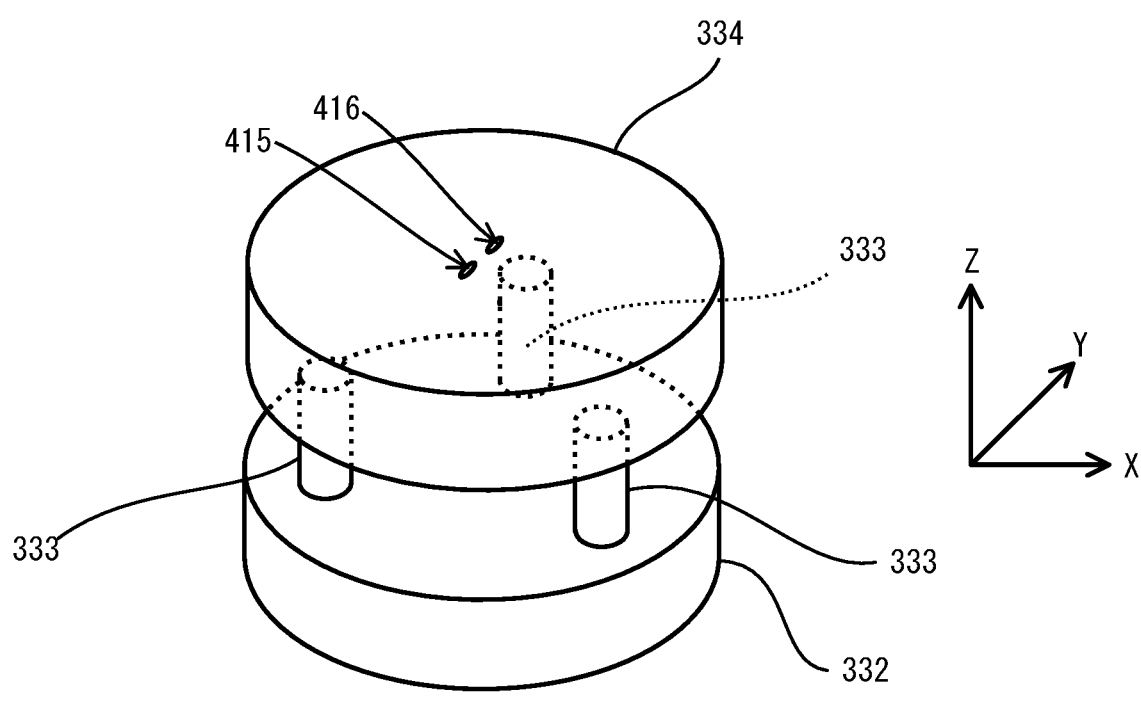
FIG. 5A is a schematic perspective view illustrating a part of a bonding unit according to Embodiment 1.

The piezoelectric actuator 333 adjusts at least one of a distance between a surface WTf of the substrate WT on which the metal portion is formed and a surface CPf of the chip CP on which the metal portion MCP1 is formed, and an inclination of the chip CP with respect to the surface WTf of the substrate WT. As illustrated in FIG. 5A, three piezoelectric actuators 333 are present between the first disc member 332 and the second disc member 334, and can expand and contract in each Z direction. Then, by controlling a degree of expansion and contraction of each of the three piezoelectric actuators 333, an inclination angle of the second disc member 334 and thus the head 33H with respect to a horizontal plane is adjusted. Then, at least one of a distance between the surface CPf of the chip CP held by the head 33H and the surface WTf of the substrate WT, and an inclination of the surface CPf of the chip CP held by the head 33H with respect to the surface WTf of the substrate WT is adjusted. Note that, the three piezoelectric actuators 333 are disposed in a position that does not block illumination light (including reflected light) related to the capturing units 35a and 35b.

As illustrated in FIG. 2, the mirror 337 is fixed to the first disc member 332 via the mirror fixing member 336, and is disposed in a space between the first disc member 332 and the second disc member 334. The mirror 337 includes inclination surfaces 337a and 337b having an inclination angle of 45 degrees in an obliquely downward direction. Capturing light incident on the inclination surfaces 337a and 337b of the mirror 337 from the capturing units 35a and 35b is reflected upward.

The head driver 36 is a first holder driver that brings the head 33H close to the stage 31 by moving, in a vertically upward direction (+Z direction), the head 33H that holds the chip CP, and brings the metal portion MCP1 of the chip CP into contact with the metal portion of the substrate WT. More specifically, the head driver 36 brings the head 33H close to the stage 31 by moving, in the vertically upward direction (+Z direction), the head 33H that holds the chip CP, and brings the metal portion MCP1 of the chip CP into contact with the metal portion of the substrate WT. Herein, as described below, the metal portion of the substrate WT and the metal portion MCP1 of the chip CP are subjected to surface activation treatment by a surface activation treatment device (not illustrated) that activates a surface of a metal portion by irradiating the metal portion with Ar particles, for example.

The head driver 36 includes a Z direction driver 34, a rotation member 361, and a θ direction driver 37. The Z direction driver 34 includes a servomotor, a ball screw, and the like. The Z direction driver 34 is provided on a lower end side of the rotation member 361 described later, and drives the Z-axis direction movement member 331 of the bonding unit 33 in the Z-axis direction as indicated by an arrow AR1. When the Z direction driver 34 moves the Z-axis direction movement member 331 in the Z direction, the head 33H provided on an upper end portion of the bonding unit 33 accordingly moves in the Z direction. In other words, the head 33H is driven by the Z direction driver 34 in the Z direction.

Figure 5B:
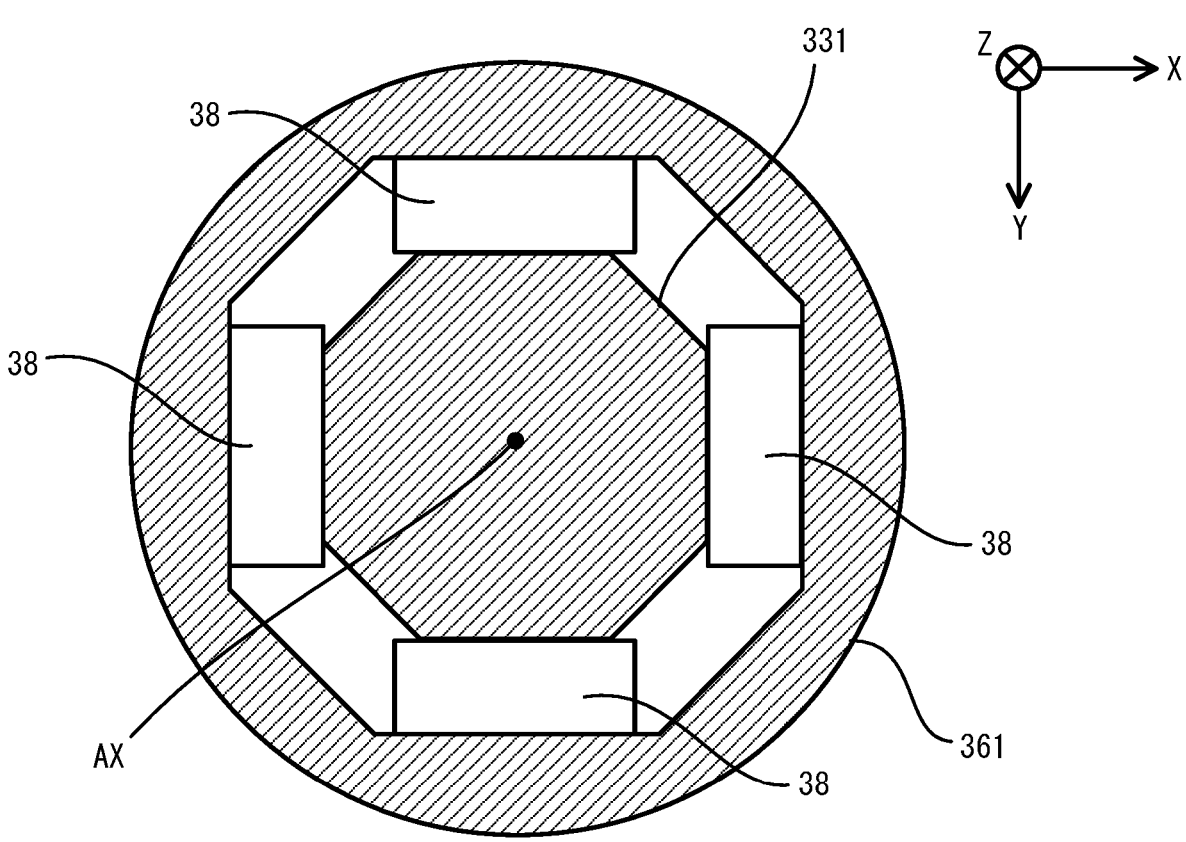
FIG. 5B is an arrow cross-sectional view of the bonding device according to Embodiment 1 taken along an A-A line in FIG. 2.

The rotation member 361 has a cylindrical shape, and a cross-sectional shape of a hollow portion therein is an octagon as illustrated in FIG. 5B. On the other hand, the Z-axis direction movement member 331 has a stick-shaped portion whose cross-sectional shape is an octagon, and is inserted in the rotation member 361. Further, a linear guide 38 in which the Z-axis direction movement member 331 is disposed in such a way as to slide with respect to the rotation member 361 in the Z-axis direction is provided between four side surfaces of eight side surfaces of the Z-axis direction movement member 331 and an inner surface of the rotation member 361. When the rotation member 361 rotates about the rotation axis AX, the Z-axis direction movement member 331 rotates in conjunction with the rotation member 361. In other words, the bonding unit 33 and the rotation member 361 rotate in conjunction about the rotation axis AX as indicated by an arrow AR2.

The θ direction driver 37 includes a servomotor, a speed reducer, or the like, and is fixed to a fixing member 301 provided in a bonding apparatus 30 as illustrated in FIG. 2. The θ direction driver 37 supports the rotation member 361 in such a way that the rotation member 361 can rotate about the axis AX. Then, the θ direction driver 37 is a second holder driver that rotates the rotation member 361 about the rotation axis AX in response to a control signal input from a controller 90.

The capturing units 35a and 35b capture the chip CP from the vertically downward direction of the chip CP, that is, the –Z direction in a state where the chip CP is disposed in a position in the substrate WT in which the chip CP is mounted. The capturing unit 35a is fixed to the rotation member 361 via the camera Z direction driver 363 and the camera F direction driver 365. The capturing unit 35b is also fixed to the rotation member 361 via the camera Z direction driver 363 and the camera F direction driver 365. In this way, the capturing units 35a and 35b rotate together with the rotation member 361. Here, as described above, the mirror 337 is fixed to the Z-axis direction movement member 331, and the rotation member 361 and the Z-axis direction movement member 331 rotate in conjunction. Therefore, a relative positional relationship between the capturing units 35a and 35b and the mirror 337 is invariable, and thus capturing light reflected by the mirror 337 is guided to the capturing units 35a and 35b regardless of a rotation operation of the rotation member 361.

Figure 6A:
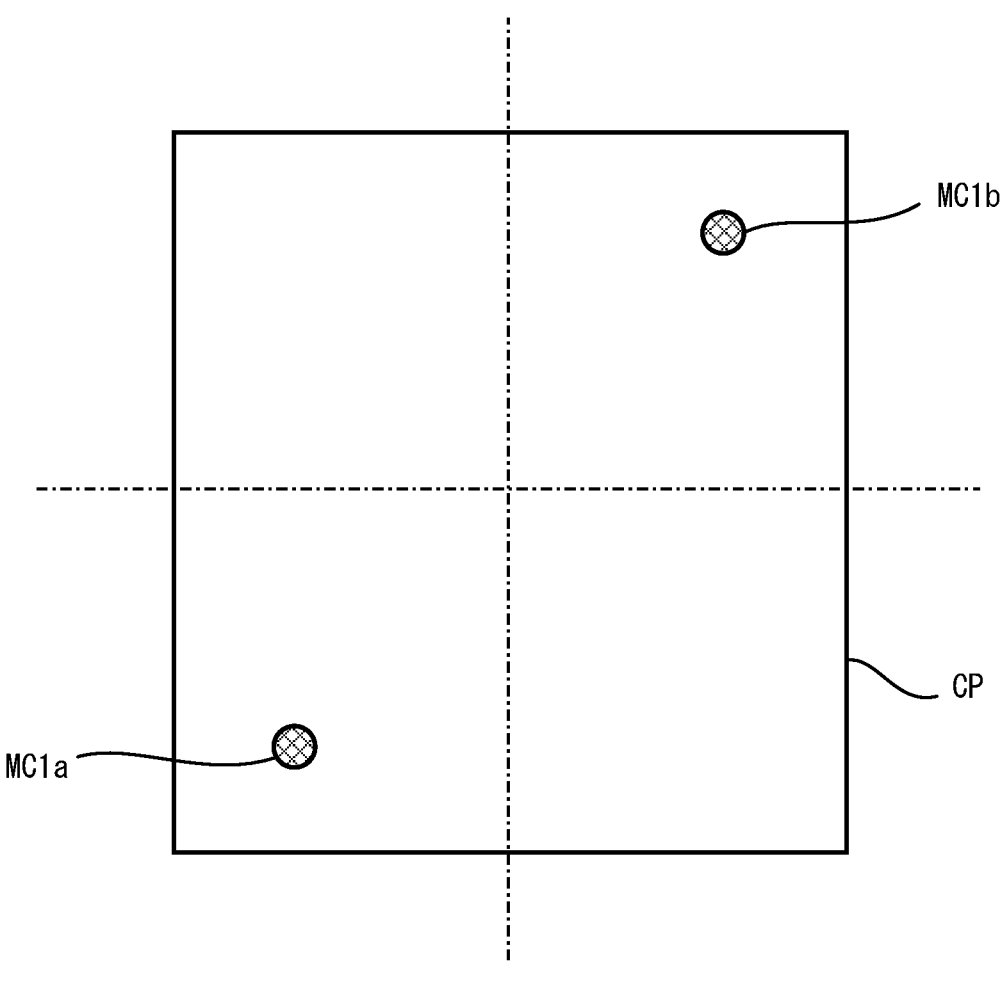
FIG. 6A is a diagram illustrating two alignment marks provided on the chip.
Figure 6B:
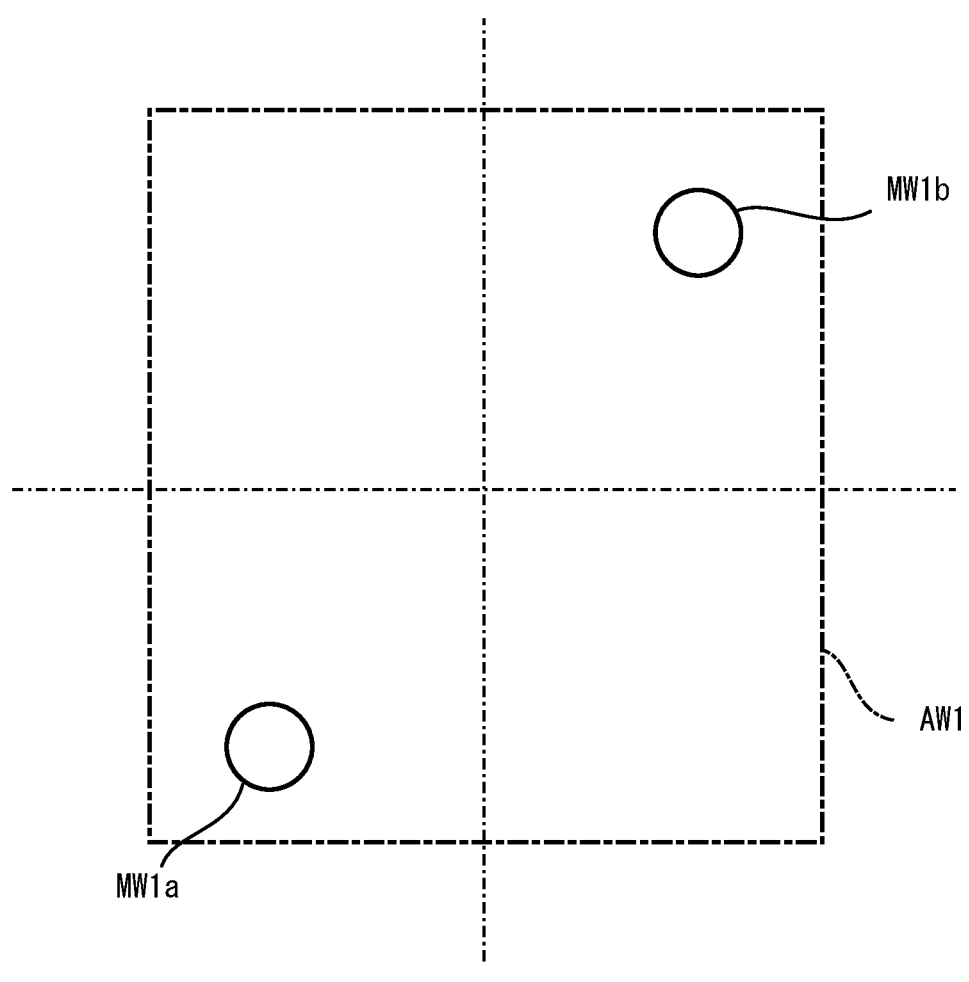
FIG. 6B is a diagram illustrating two alignment marks provided on a substrate.

The chip CP is provided with two alignment marks MC1*a* and MC1*b* as illustrated in FIG. 6A, for example. Further, at least one region AW1 in the substrate WT where the chip CP is mounted is each provided with two alignment marks MW1*a* and MW1*b* as illustrated in FIG. 6B, for example. Then, the capturing units 35*a* and 35*b* each acquire image data including an image of the alignment marks MC1*a* and MC1*b* provided on the chip CP and an image of the alignment marks MW1*a* and MW1*b* provided on the substrate WT and described later.

Further, the controller 90 recognizes a relative position of each chip CP with respect to the substrate WT in a direction parallel to the surface of the substrate WT on which the chip CP is mounted, based on the image data acquired by the capturing units 35*a* and 35*b*. As illustrated in FIG. 2, the capturing units 35*a* and 35*b* include image sensors 351*a* and 351*b*, optical systems 352*a* and 352*b*, and coaxial illumination systems (not illustrated), respectively. The capturing units 35*a* and 35*b* each acquire image data related to reflected light of illumination light (for example, infrared light) emitted from a light source (not illustrated) of the coaxial illumination system. Note that, illumination light emitted in a horizontal direction from the coaxial illumination systems of the capturing units 35*a* and 35*b* is reflected by the inclination surfaces 337*a* and 337*b* of the mirror 337, and has a traveling direction being changed to the vertically upward direction. Then, the light reflected by the mirror 337 travels toward a capturing target portion including the chip CP held by the head 33H and the substrate WT disposed in such a way as to face the chip CP, and is reflected by each capturing target portion. Here, the capturing target portion of the chip CP is provided with the alignment marks MC1*a* and MC1*b* described later, and the capturing target portion of the substrate WT is provided with alignment marks MW1*a* and MW1*b* described later. The reflected light from the capturing target portion of each of the chip CP and the substrate WT travels in the vertically downward direction, is then reflected by the inclination surfaces 337*a* and 337*b* of the mirror 337 again, has a traveling direction being changed to the horizontal direction, and reaches the capturing units 35*a* and 35*b*. In this way, the capturing units 35*a* and 35*b* acquire image data of the capturing target portion of each of the chip CP and the substrate WT. Herein, the hollow portions 415 and 416 of the head 33H rotate about the axis AX in conjunction with the rotation of the rotation member 361. For example, as illustrated in FIG. 4, when the capturing units 35*a* and 35*b* are located on a diagonal line connecting two corners provided with the alignment marks MC1*a* and MC1*b* of the chip CP, the capturing units 35*a* and 35*b* can acquire capturing data of the alignment marks MC1*a* and MC1*b* through the hollow portions 415 and 416.

The camera F direction driver 365 adjusts a focal position of the capturing units 35*a* and 35*b* by driving the capturing units 35*a* and 35*b* in a focus direction as indicated by an arrow AR3 in FIG. 2. The camera Z direction driver 363 drives the capturing units 35*a* and 35*b* in the Z-axis direction as indicated by an arrow AR4. Here, the camera Z direction driver 363 normally moves the capturing units 35*a* and 35*b* in such a way that a movement amount of the Z-axis direction movement member 331 in the Z-axis direction and a movement amount of the capturing units 35*a* and 35*b* in the Z-axis direction are the same. In this way, during a movement of the head 33H in the Z-axis direction, a capturing target portion of the capturing units 35*a* and 35*b* is set to be unchanged before and after the movement. However, the camera Z direction driver 363 may move the capturing units 35*a* and 35*b* in such a way that a movement amount of the capturing units 35*a* and 35*b* in the Z-axis direction is different from a movement amount of the Z-axis direction movement member 331 in the Z-axis direction. In this case, relative positions of the capturing units 35*a* and 35*b* and the mirror 337 in the Z direction each change, and thus the capturing target portion in the chip CP and the substrate WT by the capturing units 35*a* and 35*b* changes.

Figure 7A:
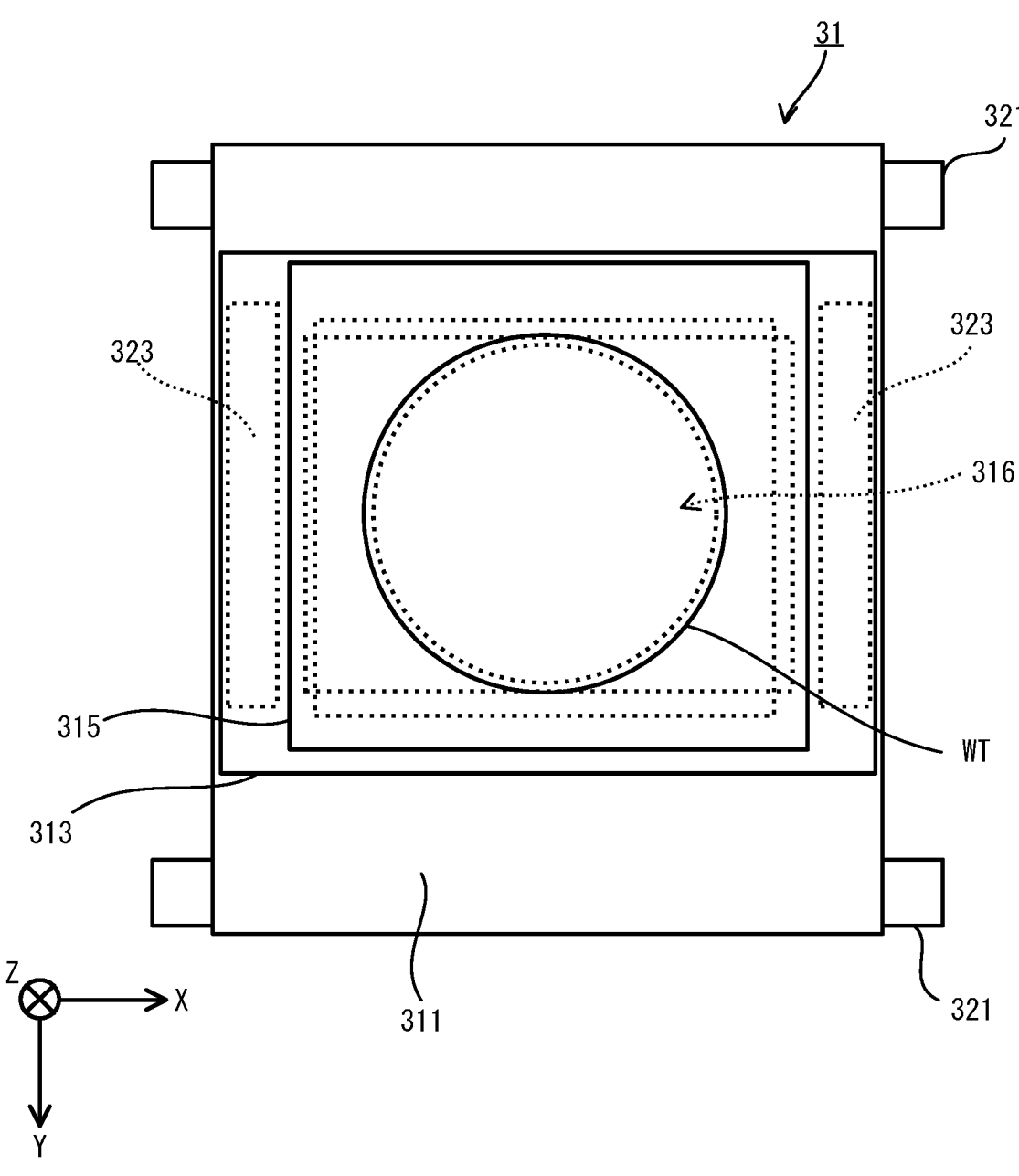
FIG. 7A is a plan view of a stage according to Embodiment 1.
Figure 7B:
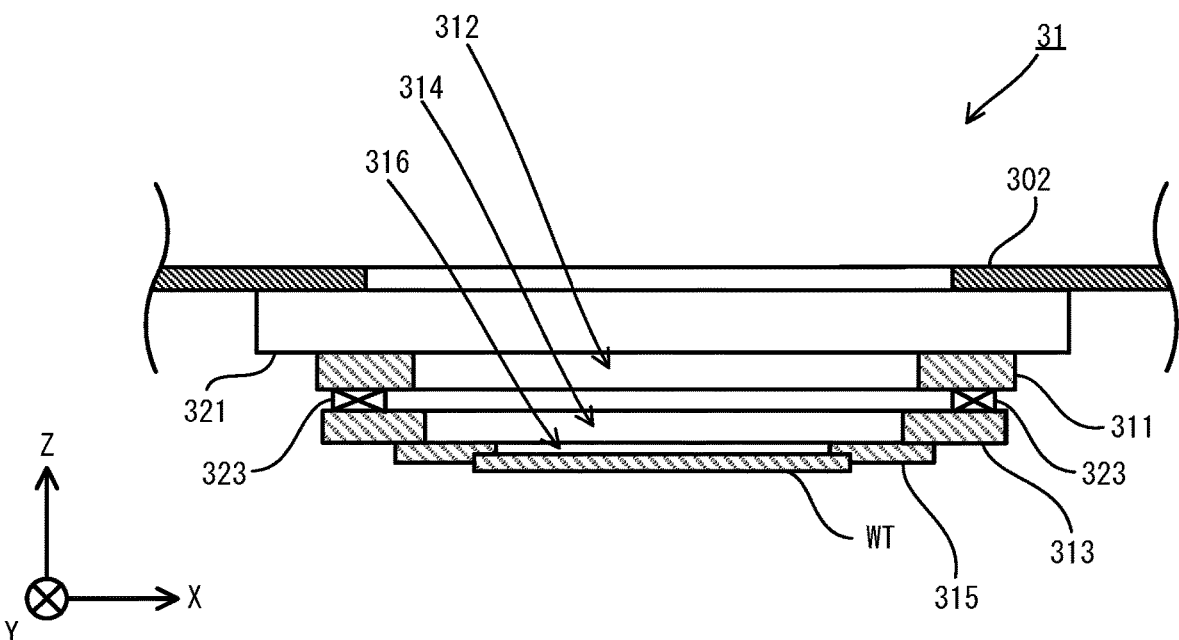
FIG. 7B is a side view of the stage according to Embodiment 1.

The stage 31 is a first bonded article holder that holds the substrate WT in a posture that the surface WTf of the substrate WT on which the chip CP is mounted faces in the vertically downward direction, that is, the −Z direction. The stage 31 can move in an X direction, a Y direction, and a rotation direction. In this way, a relative positional relationship between the bonding unit 33 and the stage 31 can be changed, and a mounting position of each chip CP on the substrate WT can be adjusted. The stage 31 includes a temperature adjuster 317 that adjusts a temperature of the substrate WT held by the stage 31. The temperature adjuster 317 is, for example, an infrared heater. Further, as illustrated in FIGS. 7A and 7B, the stage 31 includes an X direction mover 311, a Y direction mover 313, a substrate placer 315, an X direction driver 321, and a Y direction driver 323. The X direction driver 311 is a second holder driver fixed to a base member 302 of the bonding apparatus 30 via two X direction drivers 321. The two X direction drivers 321 each extend in the X direction, and are disposed away from each other in the Y direction. The X direction driver 321 includes a linear motor and a slide rail, and moves the X direction mover 311 in the X direction with respect to the fixing member 301.

The Y direction mover 313 is a second holder driver disposed below (−Z direction) the X direction mover 311 via two Y direction drivers 323. The two Y direction drivers 323 each extend in the Y direction, and are disposed away from each other in the X direction. The Y direction driver 323 includes a linear motor and a slide rail, and moves the Y direction mover 313 in the Y direction with respect to the X direction mover 311. The substrate placer 315 is fixed to the Y direction mover 313. The substrate placer 315 moves in the X direction and the Y direction in response to a movement of the X direction driver 321 and the Y direction driver 323. Further, an opening 312 having a rectangular shape in a plan view is provided in a central portion of the X direction mover 311, and an opening 314 having a rectangular shape in the plan view is also provided in a central portion of the Y direction mover 313. An opening 316 having a circular shape in the plan view is provided in a central portion of the substrate placer 315. Then, the capturing unit 41 recognizes a mark on the substrate WT through the openings 312, 314, and 316.

As illustrated in FIGS. 1 and 2, the capturing unit 41 is disposed above the stage 31. Then, the capturing unit 41 captures the alignment marks MW1*a* and MW1*b* of the substrate WT from the vertically upward direction (+Z direction) of the substrate WT in a state where the chip CP is disposed in the position in the substrate WT in which the chip CP is mounted. In this way, the capturing unit 41 acquires image data including an image of the alignment marks MW1*a* and MW1*b* of the substrate WT. The controller 90 recognizes a relative position of the mounting position of the chip CP with respect to the head 33H in the direction parallel to the surface of the substrate WT on which the chip CP is mounted, based on the image data acquired by the capturing unit 41. The capturing unit 41 includes an image sensor 418, an optical system 419, and a coaxial illumination system (not illustrated). The capturing unit 41 acquires image data related to reflected light of illumination light (for example, infrared light) emitted from a light source (not illustrated) of the coaxial illumination system.

The ultraviolet ray irradiation source 51 is disposed in the vertically upward direction of the stage 31, that is, on the +Z direction side, and irradiates the substrate WT with an ultraviolet ray from the +Z direction side of the substrate WT. As the ultraviolet ray irradiation source 51, for example, a component including a light emitting element that applies light in a wavelength band of an ultraviolet region or a component including a laser source that applies laser light in a wavelength band of an ultraviolet region can be adopted. The ultraviolet ray applied to the substrate WT from the +Z direction side of the substrate WT is transmitted through the substrate WT and applied to the resin portion CPR1 and a resin portion WTR1.

Figure 8A:
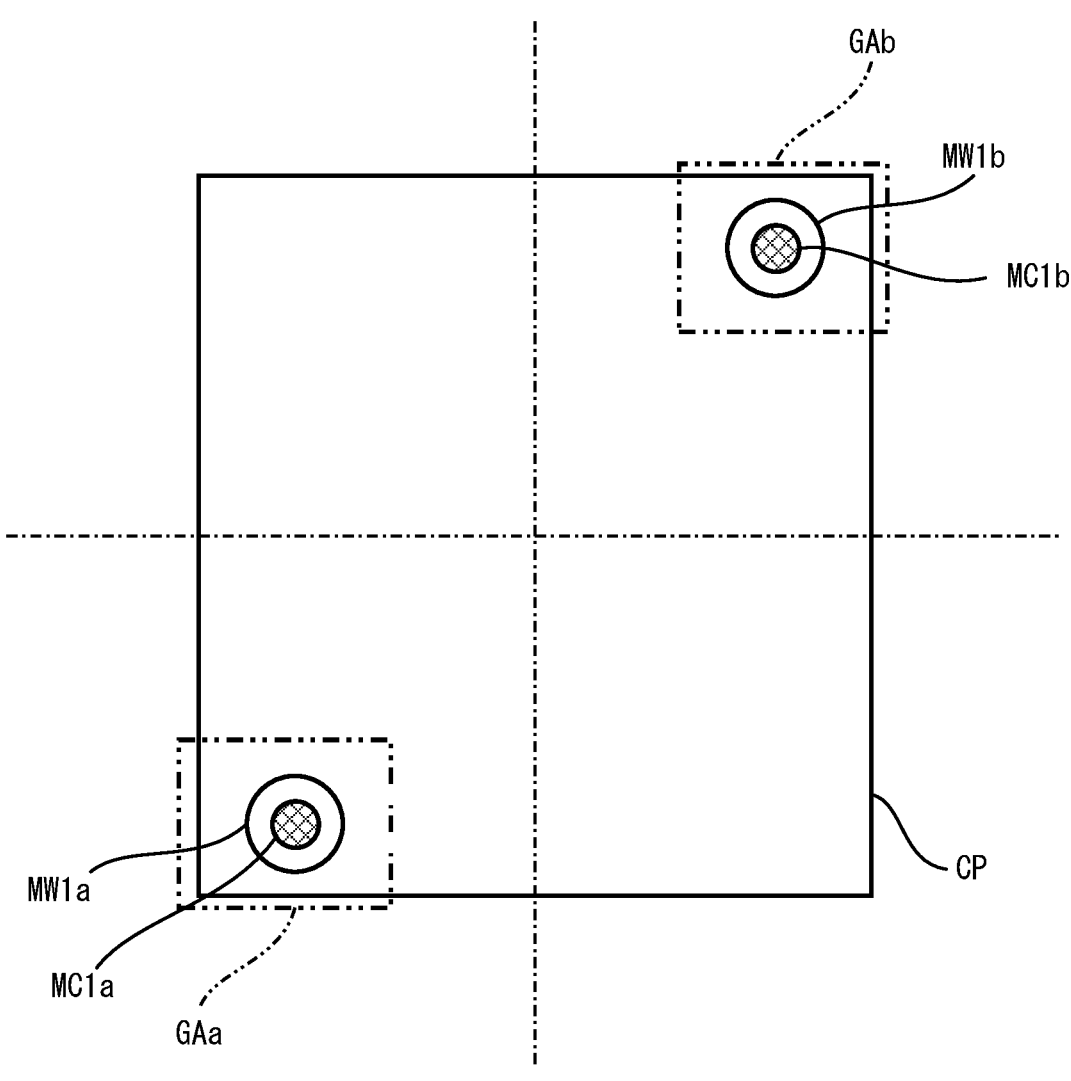
FIG. 8A is a schematic diagram illustrating a capturing image of the alignment marks.
Figure 8B:
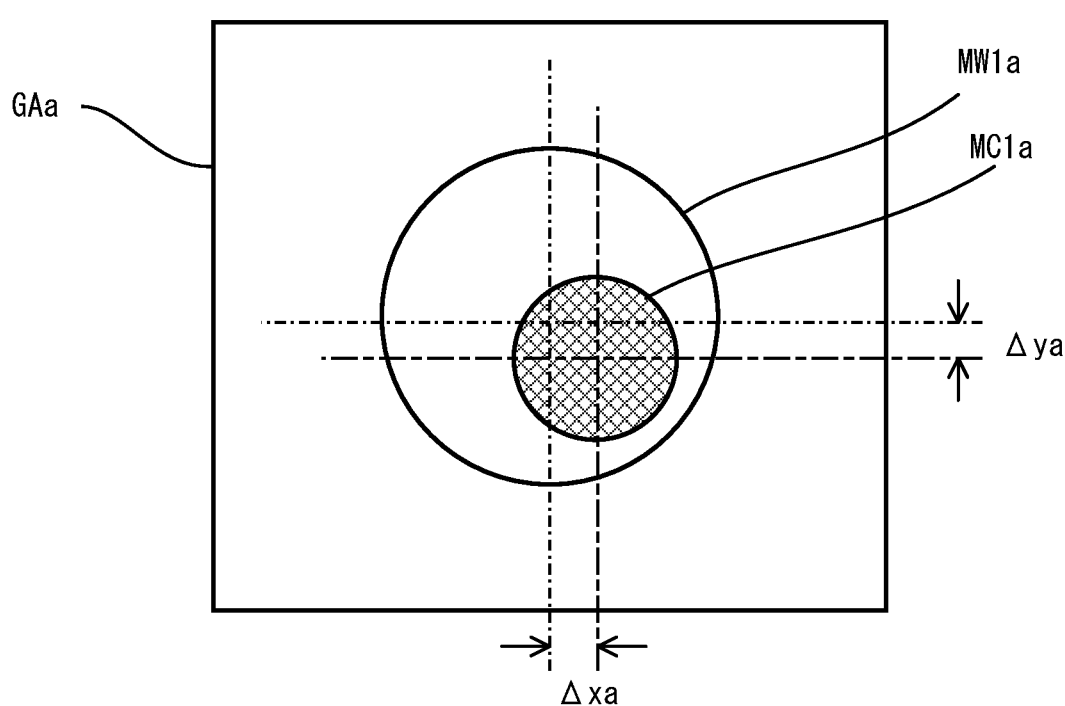
FIG. 8B is a schematic diagram illustrating a state where the alignment marks deviate from each other.

The controller 90 controls the entire bonding device 1, and includes a micro processing unit (MPU), a main storage, an auxiliary storage, an interface, and a bus that connects the components. The main storage is formed of a volatile memory, and is used as an operation region of the MPU. The auxiliary storage is formed of a non-volatile memory, and stores a program executed by the MPU. Further, the auxiliary storage also stores information indicating position deviation amount threshold values $\Delta$xth, $\Delta$yth, and $\Delta\theta$th being preset for calculated relative position deviation amounts $\Delta$x, $\Delta$y, and $\Delta\theta$ of the chip CP with respect to the substrate WT, which is described later. The interface converts a capturing image signal input from the capturing units 35a, 35b, and 41 into capturing image information, and outputs the capturing image information to the bus. Further, the MPU reads and executes, on the main storage, the program stored in the auxiliary storage, and thus outputs a control signal to each of the Z direction driver 34, the $\theta$ direction driver 37, the piezoelectric actuator 333, the X direction driver 321, and the Y direction driver 323 via the interface. As illustrated in FIG. 8A, the controller 90 acquires a capturing image GAa including the alignment marks MC1a and MW1a of the chip CP and the substrate WT and a capturing image GAb including the alignment marks MC1b and MW1b of the chip CP and the substrate WT. Then, as illustrated in FIG. 8B, the controller 90 calculates position deviation amounts $\Delta$xa and $\Delta$ya between the alignment marks MC1a and MW1a in one group being provided on the chip CP and the substrate WT, based on the capturing image GAa acquired from the capturing unit 35a. Note that, FIG. 8B illustrates a state where the alignment marks MC1a and MW1a in the one group deviate from each other. Similarly, the controller 90 calculates position deviation amounts $\Delta$xb and $\Delta$yb between the alignment marks MC1b and MW1b in another one group being provided on the chip CP and the substrate WT, based on the capturing image GAb acquired from the capturing unit 35b. Then, the controller 90 calculates the relative position deviation amounts $\Delta$x, $\Delta$y, and $\Delta\theta$ between the chip CP and the substrate WT in the X direction, the Y direction, and the rotation direction about the Z axis, based on the position deviation amounts $\Delta$xa, $\Delta$ya, $\Delta$xb, and $\Delta$yb of the two groups of the alignment marks and a geometric relationship between the two groups of the marks. Further, the controller 90 moves the head 33H in the X direction and the Y direction and rotates the head 33H about the Z axis in such a way as to reduce the calculated position deviation amounts $\Delta$x, $\Delta$y, and $\Delta\theta$. In this way, the relative position deviation amounts $\Delta$x, $\Delta$y, and $\Delta\theta$ between the chip CP and the substrate WT are reduced.

Next, chip bonding processing performed by the bonding device 1 according to the present embodiment is described with reference to FIGS. 9 to 11C. The chip bonding processing starts when a program for performing the chip bonding processing is started by the controller 90. Note that, in FIG. 9, it is assumed that the chip CP and the substrate WT are conveyed in the bonding device 1. Further, it is assumed that the first metal portion of the substrate WT and the second metal portion of the chip CP are subjected to the surface activation treatment in advance.

Figure 10A:
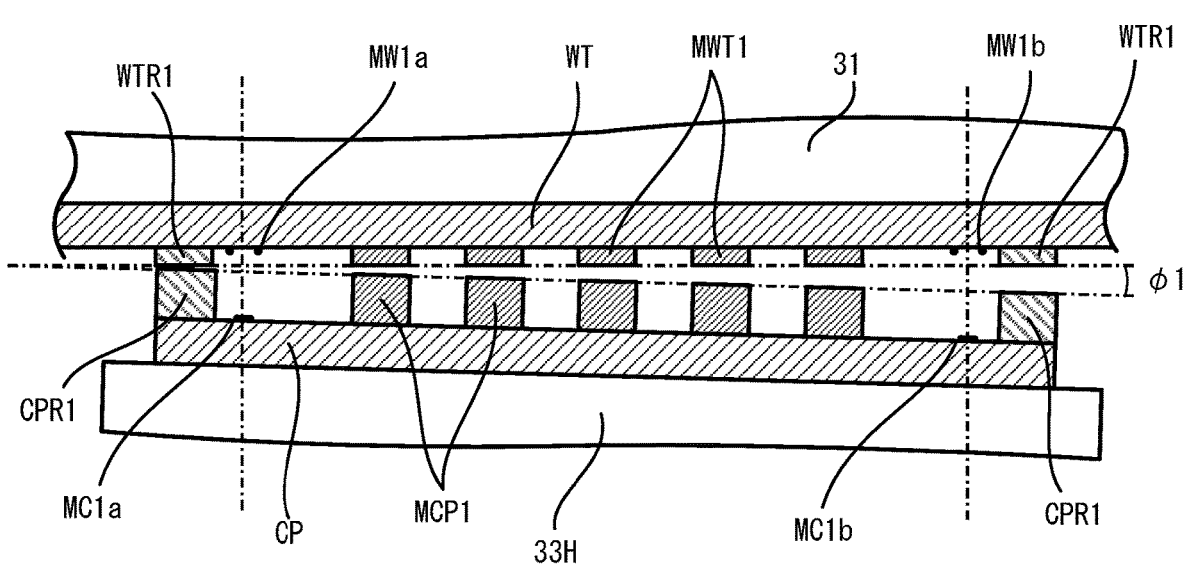
FIG. 10A is a diagram illustrating a state before the chip is bonded to the substrate in the bonding device according to Embodiment 1.

First, the bonding device 1 calculates a relative position deviation amount of the chip CP and the substrate WT in a state where the chip CP and the substrate WT are not in contact with each other (step S101). Here, as illustrated in FIG. 10A, for example, the bonding device 1 calculates a position deviation amount, based on a capturing image acquired by being captured by the capturing units 35a and 35b in a state where a surface side provided with a first metal portion MWT1 of the substrate WT and a surface side provided with the second metal portion MCP1 of the chip CP face each other. Further, the bonding device 1 captures the chip CP and the substrate WT by the capturing units 35a and 35b while maintaining the chip CP and the substrate WT at the same preset prescribed temperature. The prescribed temperature is, for example, a room temperature of 25° C. Here, the same prescribed temperature means that an absolute value of a temperature difference between a temperature of the chip CP and a temperature of the substrate WT is equal to or less than 50° C.

Figure 9:
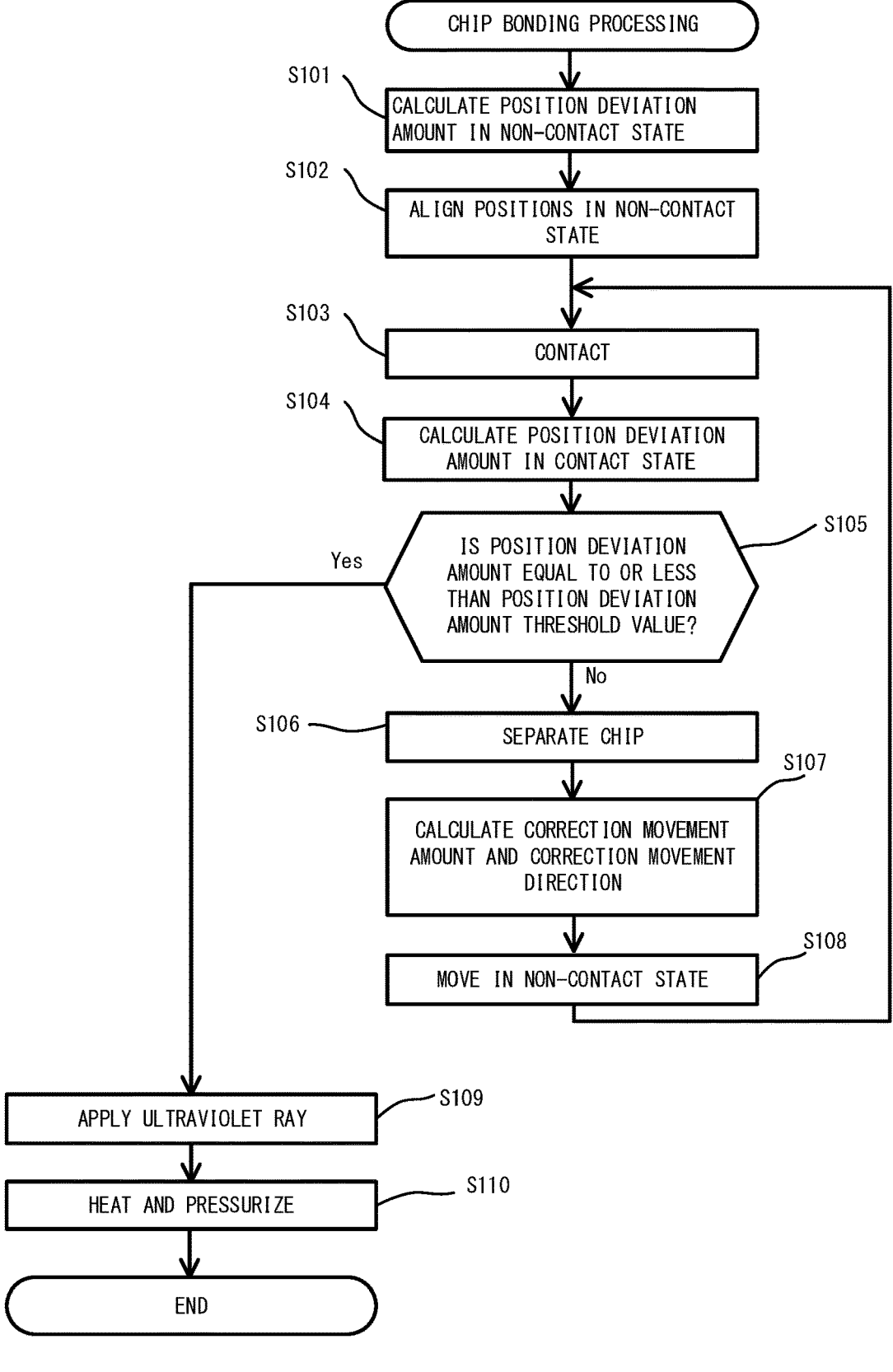
FIG. 9 is a flowchart illustrating a flow of chip bonding processing performed by the bonding device according to Embodiment 1.

Next, as illustrated in FIG. 9, the bonding device 1 aligns relative positions between the chip CP and the substrate WT, based on the calculated position deviation amount, in a state where the chip CP and the substrate WT are not in contact with each other (step S102). The processing in step S102 corresponds to a positioning step of determining a relative position of the chip CP with respect to the substrate WT in such a way as to reduce a position deviation amount of the chip CP with respect to the substrate WT while maintaining the chip CP and the substrate WT at the same preset prescribed temperature. At this time, as illustrated in FIG. 10A, a position of the alignment marks MC1a and MC1b of the chip CP coincides with a position of the alignment marks MW1a and MW1b in a position in the substrate WT in which the chip CP is mounted.

Figure 10B:
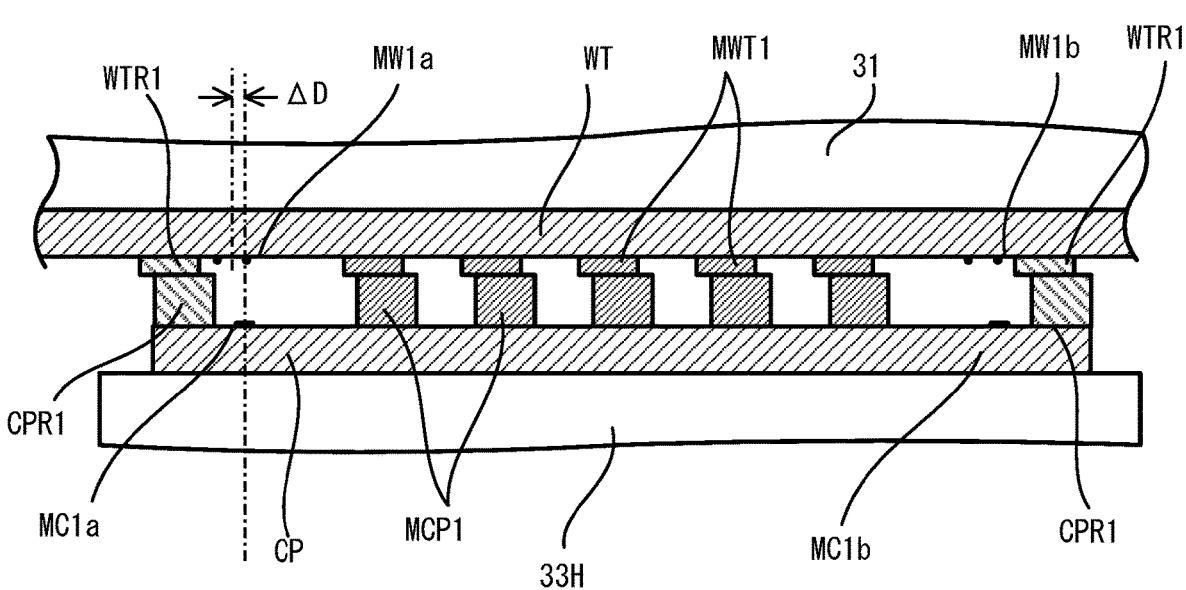
FIG. 10B is a diagram illustrating a state where the chip is in contact with the substrate in the bonding device according to Embodiment 1.
Figure 10C:
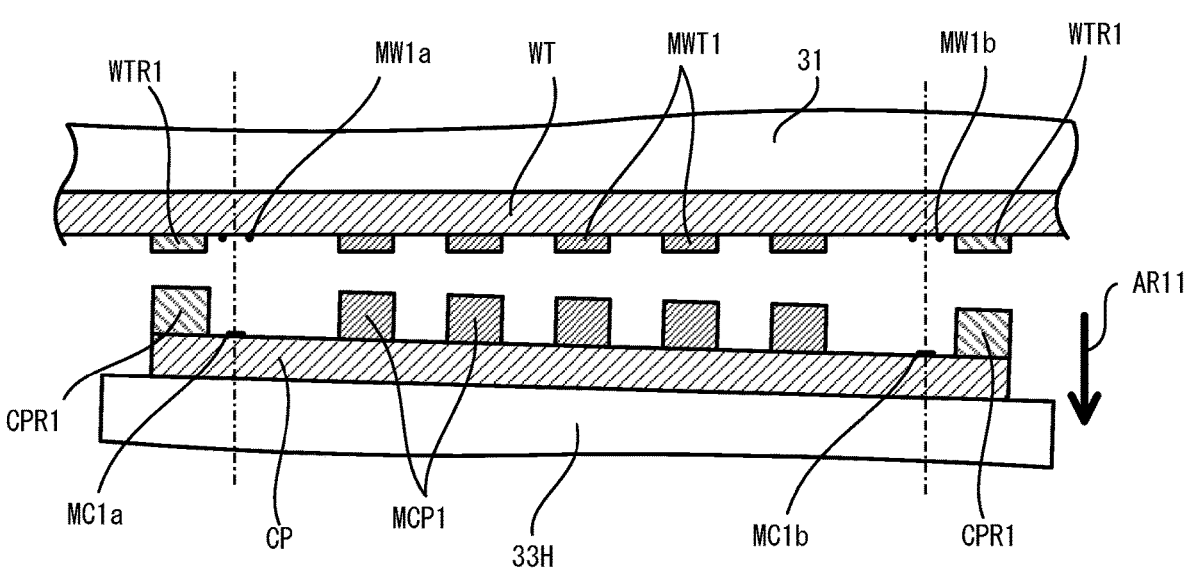
FIG. 10C is a diagram illustrating a scene where the chip is separated from the substrate in the bonding device according to Embodiment 1.

Subsequently, as illustrated in FIG. 9, the bonding device 1 brings the chip CP into contact with the substrate WT by moving the head 33H that holds the chip CP in the vertically upward direction (step S103). The processing in step S103 corresponds to a contact step of bringing the metal portion MCP1 and the resin portion CPR1 of the chip CP into contact with the substrate WT. At this time, as illustrated in FIG. 10B, the first metal portion MWT1 of the substrate WT and the second metal portion MCP1 of the chip CP are in contact with each other. Here, a force for pushing the head 33H in the vertically upward direction by the head driver 36 is sufficiently greater than a force for maintaining a posture of the head 33H by the piezoelectric actuator 333. Thus, even when the chip CP in a posture inclined by an angle $\varphi$ with respect to the substrate WT is held by the head 33H in a state before the chip CP is in contact with the substrate WT, all of the second metal portion MCP1 and the resin portion CPR1 of the chip CP can be brought into contact with the first metal portion MWT1 and the resin portion WTR1 of the substrate WT corresponding to each of the second metal portion MCP1 and the resin portion CPR1.

Subsequently, as illustrated in FIG. 9, the bonding device 1 calculates a relative position deviation amount of the chip CP with respect to the substrate WT in a state where the chip CP is in contact with the substrate WT (step S104). The processing in step S104 corresponds to a measurement step of measuring a position deviation amount of the chip CP with respect to the substrate WT. Here, the bonding device 1 captures the chip CP and the substrate WT by the capturing units 35a and 35b while maintaining the chip CP and the substrate WT at the same preset prescribed temperature. Herein, the controller 90 of the bonding device 1 first acquires, from the capturing units 35a and 35b, the two capturing images GAa and GAb (see FIG. 8B) of the chip CP and the substrate WT (see FIG. 8A) in a non-contact state. Then, the controller 90 calculates each of the position deviation amounts Δx, Δy, and Δθ of the chip CP and the substrate WT in the X direction, the Y direction, and the rotation direction about the Z axis, based on the two capturing images GAa and GAb. Specifically, the controller 90 calculates the position deviation amounts Δxa and Δya (see FIG. 8B) by using a vector correlation method, based on the capturing image GAa in which the alignment marks MC1a and MW1a located away from each other in the Z direction are read at the same time, for example. Similarly, the controller 90 calculates the position deviation amounts Δxb and Δyb by using the vector correlation method, based on the capturing image GAb in which the alignment marks MC1b and MW1b located away from each other in the Z direction are read at the same time. Then, the controller 90 calculates the position deviation amounts Δx, Δy, and Δθ of the chip CP and the substrate WT in the horizontal direction, based on the position deviation amounts Δxa, Δya, Δxb, and Δyb. Here, as illustrated in FIG. 10A, it is assumed that the chip CP in the posture inclined by the angle φ with respect to the substrate WT is held by the head 33H in the state before the chip CP is in contact with the substrate WT. In this case, as illustrated in FIG. 10B, a position of the chip CP deviates from the substrate WT by a position deviation amount ΔD. Note that, the position deviation amount ΔD corresponds to any of the position deviation amounts Δx, Δy, and Δθ.

Next, as illustrated in FIG. 9, the bonding device 1 determines whether all of the calculated position deviation amounts Δx, Δy, and Δθ are equal to or less than the preset position deviation amount threshold values Δxth, Δyth, and Δθth (step S105). Here, the position deviation amount threshold values Δxth, Δyth, and Δθth are set to, for example, about 0.2 μm. When the bonding device 1 determines that any of the calculated position deviation amounts Δx, Δy, and Δθ exceeds the position deviation amount threshold values Δxth, Δyth, and Δθth (step S105: No), the bonding device 1 separates the chip CP from the substrate WT (step S106). At this time, the bonding device 1 separates the chip CP from the substrate WT by moving the head 33H in the vertically downward direction as indicated by an arrow AR11 in FIG. 10C, for example. At this time, the chip CP in the posture inclined by the angle φ with respect to the substrate WT again is held by the head 33H.

Figure 11A:
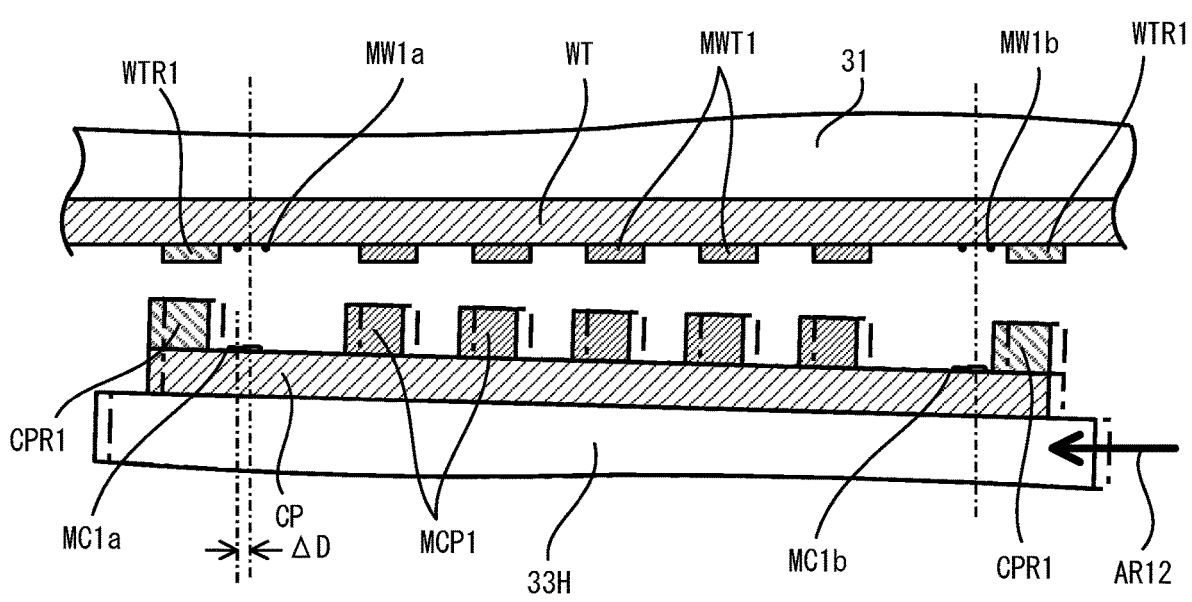
FIG. 11A is a diagram illustrating a scene where the chip is moved relatively to the substrate in the bonding device according to Embodiment 1.
Figure 11B:
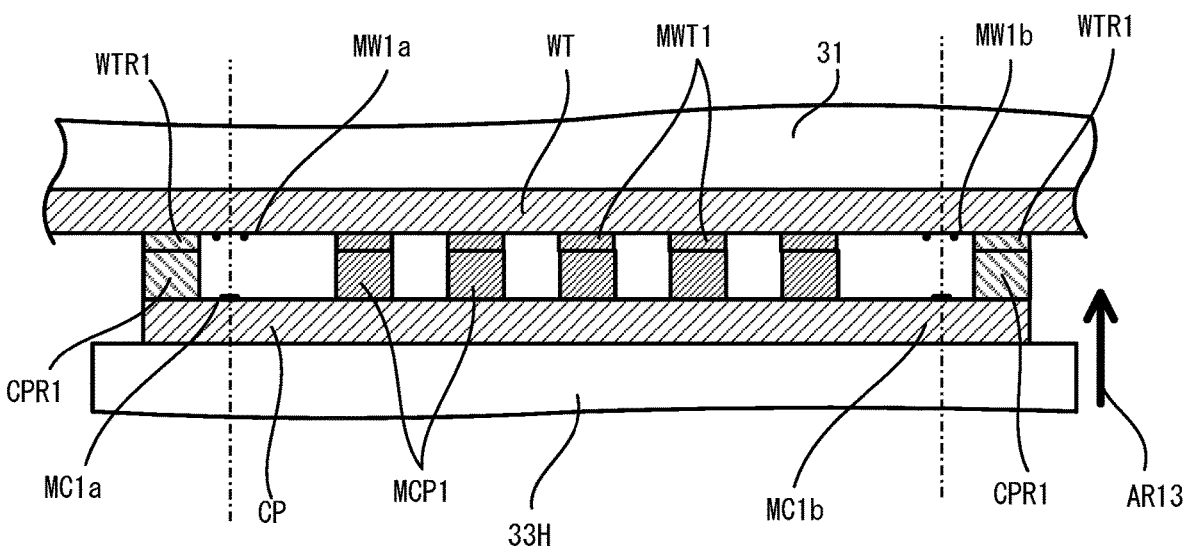
FIG. 11B is a diagram illustrating a scene where the chip is in contact with the substrate in the bonding device according to Embodiment 1.

Subsequently, as illustrated in FIG. 9, the bonding device 1 calculates a correction movement amount and a correction movement direction when the bonding device 1 moves the chip CP relatively to the substrate WT in order to eliminate a position deviation of the chip CP from the substrate WT, based on the calculated position deviation amounts Δx, Δy, and Δθ (step S107). After that, the bonding device 1 moves the chip CP by the calculated correction movement amount in the calculated correction movement direction in a non-contact state between the chip CP and the substrate WT (step S108). Here, as illustrated in FIG. 11A, for example, the bonding device 1 moves the chip CP relatively to the substrate WT by the correction movement amount corresponding to the position deviation amount ΔD in a direction opposite to a position deviation direction of the position deviation amount ΔD. Further, the processing in step S108 corresponds to a correction movement step of correcting and moving the chip CP relatively to the substrate WT in such a way as to reduce a position deviation amount of the chip CP with respect to the substrate WT, based on the position deviation amount.

After that, as illustrated in FIG. 9, the bonding device 1 brings the chip CP into contact with the substrate WT again (step S103). Here, the bonding device 1 brings the second metal portion MCP1 of the chip CP into contact with the first metal portion MWT1 of the substrate WT by bringing the head 33H close to the stage 31 as indicated by an arrow AR13 in FIG. 11B, for example.

Figure 11C:
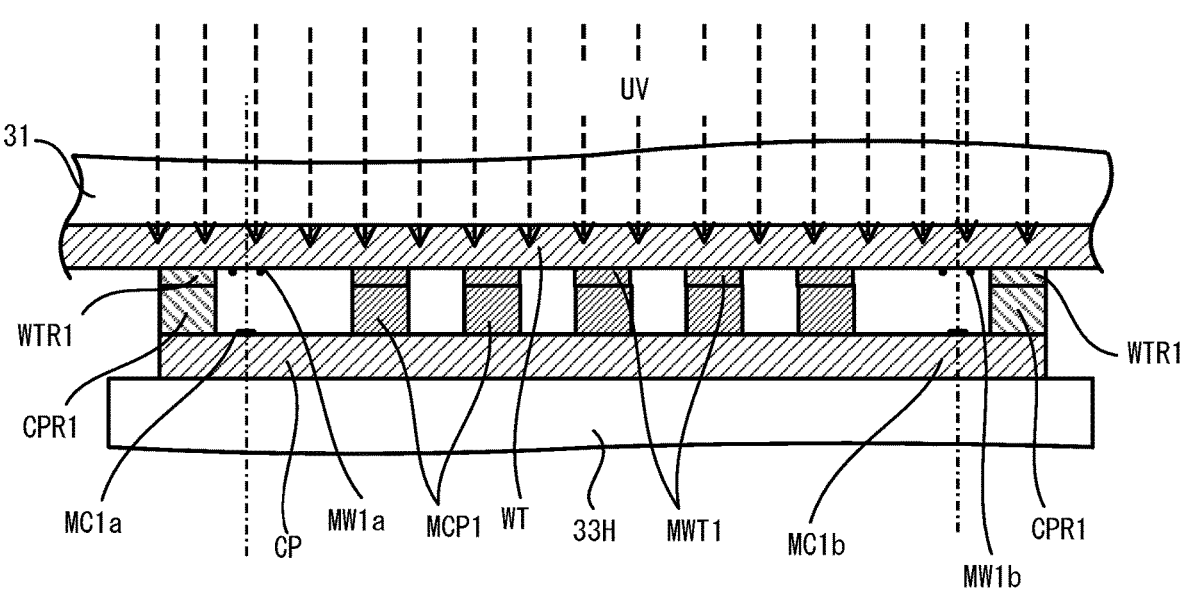
FIG. 11C is a diagram illustrating a scene where an ultraviolet ray is applied in the bonding device according to Embodiment 1.

Further, it is assumed that, in step S105 in FIG. 9, the bonding device 1 determines that all of the calculated position deviation amounts Δx, Δy, and Δθ are equal to or less than the position deviation amount threshold values Δxth, Δyth, and Δθth (step S105: Yes). In this case, while the bonding device 1 maintains the chip CP and the substrate WT at the same preset prescribed temperature, the bonding device 1 irradiates the resin portion CPR1 of the chip CP and the resin portion WTR1 of the substrate WT with an ultraviolet ray by the ultraviolet ray irradiation source 51 (step S109). The processing in step S109 corresponds to a fixing step of fixing the chip CP to the substrate WT. Here, as illustrated in FIG. 11C, for example, the bonding device 1 irradiates a side of the substrate WT opposite to the chip CP side with an ultraviolet ray UV. Then, the ultraviolet ray transmitted through the substrate WT is applied to the resin portion CPR1 of the chip CP and the resin portion WTR1 of the substrate WT. At this time, the resin portion CPR1 of the chip CP and the resin portion WTR1 of the substrate WT absorb the applied ultraviolet ray and are cured. In this way, the chip CP is in a state of being fixed to the substrate WT.

Subsequently, as illustrated in FIG. 9, the bonding device 1 pressurizes the metal portion MWT1 of the substrate WT and the bonding portion MCP1 of the chip CP in a direction of close adhesion in a state where the chip CP and the substrate WT are heated (step S110). In this way, a metal of the second metal portion MCP1 and a metal of the first metal portion MWT1 spread and are bonded to each other in a state where the second metal portion MCP1 of the chip CP is in contact with the first metal portion MWT1 of the substrate WT. Here, by simultaneously pressurizing the chip CP in a direction of being pressed against the substrate WT when the chip CP and the substrate WT are heated, metallic particles move to a void portion generated between the chip CP and the substrate WT due to a pressure difference between a portion where the chip CP and the substrate WT are in contact and the void portion. In this way, the void portion generated between the chip CP and the substrate WT is reduced. Note that, when the first metal portion MWT1 is a pad and the second metal portion MCP1 is a metal bump, at least one of the first metal portion MWT1 and the second metal portion MCP1 may be heated and melted in a state where the first metal portion MWT1 and the second metal portion MCP1 are in contact with each other. Subsequently, the head 33H is separated from the chip CP. In this way, the chip CP is bonded to the substrate WT. The processing in step S110 corresponds to a bonding step of bonding the chip CP and the substrate WT in a state where the chip CP is fixed to the substrate WT.

Here, a result of performing an experiment for confirming a reduction in a position deviation of the chip CP from the substrate WT by repeatedly performing a series of the processing in steps S103 to S108 is described. The experiment is performed by bonding 10 chips CP to the substrate WT. A result of the experiment is illustrated in Table 1 to Table 3.

TABLE 1

| | POSITION DEVIATION AMOUNT | | |
|---|---|---|---|
| CHIP NO. | $\Delta$x[μm] | $\Delta$y[μm] | $\Delta\theta$ [°] |
| 1 | 0.03 | 0.05 | 0.00151 |
| 2 | 0.02 | 0 | 0.00173 |
| 3 | −0.1 | 0.09 | 0.00239 |
| 4 | −0.07 | 0.07 | 0.00215 |
| 5 | −0.06 | 0.09 | 0.00269 |
| 6 | −0.1 | 0.09 | 0.00186 |
| 7 | −0.05 | 0.07 | 0.00181 |
| 8 | −0.07 | 0.09 | 0.00185 |
| 9 | 0.03 | 0.06 | 0.00185 |
| 10 | −0.09 | 0.1 | 0.00223 |
| Max. | 0.03 | 0.10 | 0.00269 |
| Min. | −0.10 | 0.00 | 0.00151 |
| ±Range | 0.065 | 0.05 | 0.00059 |

TABLE 2

| | POSITION DEVIATION AMOUNT | | |
|---|---|---|---|
| CHIP NO. | $\Delta$x[μm] | $\Delta$y[μm] | $\Delta\theta$ [°] |
| 1 | −0.9 | 0.8 | −0.0006 |
| 2 | −0.4 | −0.9 | −0.0011 |
| 3 | 0.4 | 0.7 | −0.0024 |
| 4 | 0.8 | 0.8 | 0.0006 |
| 5 | −0.2 | 0.7 | −0.0025 |
| 6 | −0.2 | −0.7 | −0.0015 |
| 7 | −0.2 | −0.6 | −0.0005 |
| 8 | 1 | −0.5 | 0.003 |
| 9 | 0.1 | 1 | −0.0011 |
| 10 | −0.3 | 0.8 | 0.0024 |
| Max. | 1.00 | 1.00 | 0.00300 |
| Min. | −0.90 | −0.90 | −0.00250 |
| ±Range | 0.95 | 0.95 | 0.00275 |

TABLE 3

| | POSITION DEVIATION AMOUNT | | |
|---|---|---|---|
| CHIP NO. | $\Delta$x[μm] | $\Delta$y[μm] | $\Delta\theta$ [°] |
| 1 | −0.03 | 0.08 | −0.00006 |
| 2 | −0.04 | 0.08 | −0.00011 |
| 3 | 0.04 | 0.07 | −0.00024 |
| 4 | 0 | 0.08 | 0.00006 |
| 5 | −0.02 | 0.07 | −0.00025 |
| 6 | −0.02 | 0.07 | −0.00015 |
| 7 | −0.02 | 0.07 | −0.00005 |
| 8 | 0.05 | 0.08 | 0.0003 |
| 9 | 0.01 | 0.06 | −0.00011 |
| 10 | −0.03 | 0.07 | 0.00024 |
| Max. | 0.05 | 0.08 | 0.00030 |
| Min. | −0.04 | 0.06 | −0.00025 |
| ±Range | 0.045 | 0.01 | 0.000275 |

Table 1 illustrates a position deviation amount of the chip CP with respect to the substrate WT at a point in time of completion of the processing in step S102 when the chip bonding processing described above is performed on each of the 10 chips CP. Table 2 illustrates a position deviation amount of the chip CP with respect to the substrate WT in a state where the chip CP is in contact with the substrate WT with pressure of 50 N for each of the 10 chips CP. Table 3 illustrates a position deviation amount of the chip CP with respect to the substrate WT when a position deviation amount threshold value is set to 0.05 μm and a series of the processing in steps S103 to S108 is performed in the chip bonding processing described above. It is clear from Table 1 that the position deviation amount is about ±0.1 μm at a point in time of the completion of the processing in step S102. Further, it is clear from Table 2 that the position deviation amount increases to about ±1.0 μm when a series of the processing in steps S103 to S108 is not performed. On the other hand, it is clear that the position deviation amount is reduced to about ±0.05 μm by performing a series of the processing in steps S103 to S108. As a result, it is clear that the position deviation amount is greatly reduced by performing a series of the processing in steps S103 to S108.

When the chip CP and the substrate WT are aligned in the related art, a position deviation amount is measured by inserting, between the chip CP and the substrate WT, a so-called two visual field camera including different cameras that capture each of the chip CP and the substrate WT. However, in this case, even when alignment is performed as accurately as possible, a position deviation caused by pressurizing the chip CP and the substrate WT in the direction of close adhesion when the chip CP is bonded to the substrate WT, or a position deviation caused by thermal expansion of the chip CP and the substrate WT when the chip CP and the substrate WT are heated occurs, and, as a result, a position deviation of equal to or more than 2 μm occurs between the chip CP and the substrate WT. Particularly, when thermal expansion of the chip CP and the substrate WT is great, there is a case where a position deviation of equal to or more than 5 μm occurs.

In contrast, in the bonding method according to the present embodiment, the capturing units 35a and 35b using infrared light when the substrate WT is a Si substrate, or the capturing units 35a and 35b using visible light when the substrate WT is a sapphire substrate or a transparent glass substrate perform transmission recognition on the alignment marks MW1a and MW1b of the substrate WT and the alignment marks MC1a and MC1b of the chip CP, and thus a position deviation caused by pressurizing the chip CP and the substrate WT in the direction of close adhesion is corrected. Further, for a position deviation caused by thermal expansion of the chip CP and the substrate WT, by fixing the chip CP and the substrate WT via the resin portions CPR1 and WTR1 before the chip CP and the substrate WT are heated, a position deviation amount can be increased to equal to or less than ±0.5 μm or equal to or less than ±0.05 μm after the chip CP and the substrate WT are bonded as described above.

As described above, the bonding device 1 according to the present embodiment determines a relative position of the chip CP with respect to the substrate WT, then brings the chip CP into contact with the substrate WT, and then fixes the chip CP to the substrate WT in a state where the chip CP and the substrate WT are maintained at the same prescribed temperature. In this way, after that, when the substrate WT and the chip CP are heated, the chip CP is fixed in advance to the substrate WT, and thus an occurrence of a position deviation caused by thermal expansion of the substrate WT and the chip CP can be suppressed. Therefore, the substrate WT and the chip CP can be bonded together with high position accuracy.

In a case where the chip CP is inclined with respect to the substrate WT, when the chip CP and the substrate WT are pressurized in the direction of close adhesion, a position deviation occurs due to a bonding portion of one of the chip CP and the substrate WT following another bonding portion during contact. In contrast, in the bonding device 1 according to the present embodiment, when a position deviation amount of the chip CP with respect to the substrate WT is equal to or less than a preset position deviation amount threshold value, the chip CP is fixed to the substrate WT, and, when the position deviation amount described above is greater than the position deviation amount threshold value, the chip CP is aligned with the substrate WT again. In this way, a position deviation of the chip CP from the substrate WT caused by the chip CP being inclined with respect to the substrate WT can be corrected. Therefore, the substrate WT and the chip CP can be bonded together with high position accuracy. In other words, the bonding device 1 according to the present embodiment performs both of correction of a position deviation of the chip CP from the substrate WT caused by pressurizing the chip CP and the substrate WT in the direction of close adhesion, and fixing of the chip CP to the substrate WT via the resin portions CPR1 and WTR1, and thus the bonding device 1 can suppress a position deviation of the chip CP from the substrate WT caused by thermal expansion of the chip CP and the substrate WT, and can bond the chip CP to the substrate WT with high position accuracy.

Further, in the bonding method according to the present embodiment, an ultraviolet ray is only applied after a position deviation of the chip CP from the substrate WT during contact, and thus a position deviation caused by thermal expansion of the chip CP and the substrate WT does not occur. Further, the bonding portions of the chip CP and the substrate WT more closely adhere to each other by a contractive force of the resin portions CPR1 and WTR1, but a position deviation caused by the chip CP being inclined with respect to the substrate WT is corrected by performing a series of the processing in steps S103 to S108. Therefore, the chip CP can be fixed to the substrate WT without an occurrence of a position deviation of the chip CP from the substrate WT.

Furthermore, the bonding device 1 according to the present embodiment adopts a method for holding the substrate WT in a posture that the surface WTf on which the chip CP is mounted faces in the vertically downward direction, and mounting the chip CP on the substrate WT from the vertically downward direction. In a method for holding the substrate WT in a posture that the surface WTf on which the chip CP is mounted faces in the vertically upward direction, and mounting the chip CP on the substrate WT from the vertically upward direction, when a plurality of the chips CP is mounted on the substrate WT, there is a risk that a particle may be scattered on the substrate WT, a void may be generated by the particle entering between the chip CP and the substrate WT during mounting of the chip CP on the substrate WT, and the chip CP may not be able to be bonded to the substrate WT in an excellent manner. In contrast, the bonding device 1 according to the present embodiment holds the substrate WT in a posture that the surface WTf on which the chip CP is mounted faces in the vertically downward direction on purpose, and thus suppresses adhesion of a particle to the substrate WT.

Embodiment 2

A bonding device according to the present embodiment is a so-called anode bonding device that applies a DC voltage of several hundreds of V between two bonded articles while heating the two bonded articles with the two bonded articles in contact with each other in a chamber under a reduced pressure, and thus bonds the two bonded articles. Here, for example, one of the two bonded articles is a substrate formed of a silicate glass containing an alkali ion such as Na, and the other is a substrate formed of a metal or a semiconductor.

Figure 12:
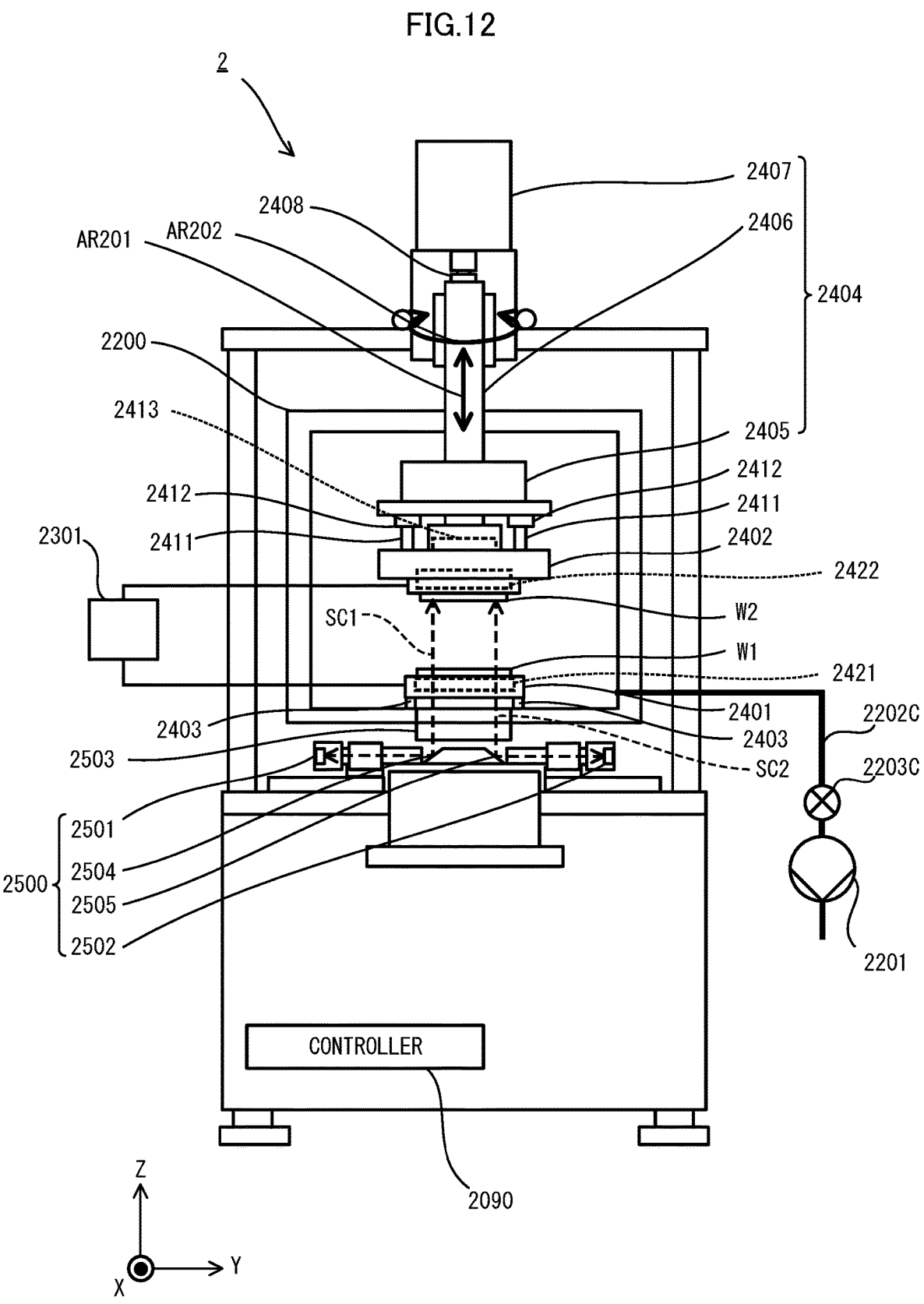
FIG. 12 is a schematic front view of the inside of a bonding device according to Embodiment 2 of the present disclosure.

As illustrated in FIG. 12, the bonding device according to the present embodiment includes a chamber 2200, a stage 2401, a head 2402, a stage driver 2403, a head driver 2404, temperature adjusters 2421 and 2422, a distance detector 2413, and a measurement unit 2500. Note that, the following description gives description as appropriate on the assumption that the ±Z direction in FIG. 12 is an up-down direction and an XY direction is the horizontal direction. The chamber 2200 is connected to a vacuum pump 2201 via an exhaust pipe 2202C and an exhaust valve 2203C. When the vacuum pump 2201 operates with the exhaust valve 2203C open, gas in the chamber 2200 is discharged to the outside of the chamber 2200 through the exhaust pipe 2202C, and atmospheric pressure in the chamber 2200 is reduced (decompressed). Further, atmospheric pressure (degree of vacuum) in the chamber 2200 can be adjusted by changing an opening and closing amount of the exhaust valve 2203C and adjusting an exhaust amount. Further, a window 2503 used for measuring relative positions between substrates W1 and W2 by the measurement unit 2500 is provided in a part of the chamber 2200.

The stage 2401 and the head 2402 are disposed in such a way as to face each other in the Z-axis direction in the chamber 2200. The stage 2401 supports the substrate W1 on the +Z direction side thereof, and the head 2402 supports the substrate W2 on the −Z direction side. The stage 2401 and the head 2402 each include a vacuum chuck (not illustrated) for holding the substrates W1 and W2. Here, the substrate W1 held by the stage 2401 is a substrate formed of a silicate glass containing an alkali ion such as Na. The substrate W2 held by the head 2402 is a semiconductor substrate such as a Si substrate, or a metal plate.

The temperature adjusters 2421 and 2422 are formed of, for example, an electric heater. The temperature adjusters 2421 and 2422 heat the substrates W1 and W2 by transmitting heat to the substrates W1 and W2 supported by the stages 2401 and the head 2402. Further, the temperature adjusters 2421 and 2422 adjust a temperature of the substrates W1 and W2 by adjusting a heating value of the electric heater thereof.

The stage driver 2403 can move the stage 2401 in the XY direction and rotate the stage 2401 about the Z axis. The head driver 2404 includes a raising and lowering driver 2406 that raises and lowers the head 2402 in the +Z direction or the −Z direction, an XY direction driver 2405 that moves the head 2402 in the XY direction, and a rotation driver 2407 that rotates the head 2402 in the rotation direction about the Z axis as indicated by an arrow AR202 in FIG. 12. Further, the head driver 2404 includes a piezoelectric actuator 2411 for adjusting an inclination of the head 2402 with respect to the stage 2401, and a pressure sensor 2412 for measuring a pressure applied to the head 2402. The XY direction driver 2405 and the rotation driver 2407 move the head 2402 relatively to the stage 2401 in the X direction, the Y direction, and the rotation direction about the Z axis, and can thus move the substrate W2 held by the head 2402 relatively to the substrate W1 held by the stage 2401.

The raising and lowering driver 2406 moves the head 2402 in the −Z direction, and thus brings the stage 2401 and the head 2402 close to each other. Further, the raising and lowering driver 2406 moves the head 2402 in the +Z direction, and thus separates the stage 2401 and the head 2402 from each other. The raising and lowering driver 2406 moves the head 2402 in the +Z direction, and thus the substrate W1 held by the stage 2401 and the substrate W2 held by the head 2402 are brought into contact with each other. Then, when the raising and lowering driver 2406 acts a driving force on the head 2402 in a direction closer to the stage 2401 in a state where the substrates W1 and W2 are in contact with each other, the substrate W2 is pressed against the substrate W1. Further, the raising and lowering driver 2406 is provided with a pressure sensor 2408 that measures a driving force acting on the head 2402 in the direction closer to the stage 2401 by the raising and lowering driver 2406. A pressure acting on bonding portions of the substrates W1 and W2 when the substrate W2 is pressed against the substrate W1 by the raising and lowering driver 2406 can be detected from a measurement value of the pressure sensor 2408. The pressure sensor 2408 is formed of, for example, a load cell.

Figure 13A:
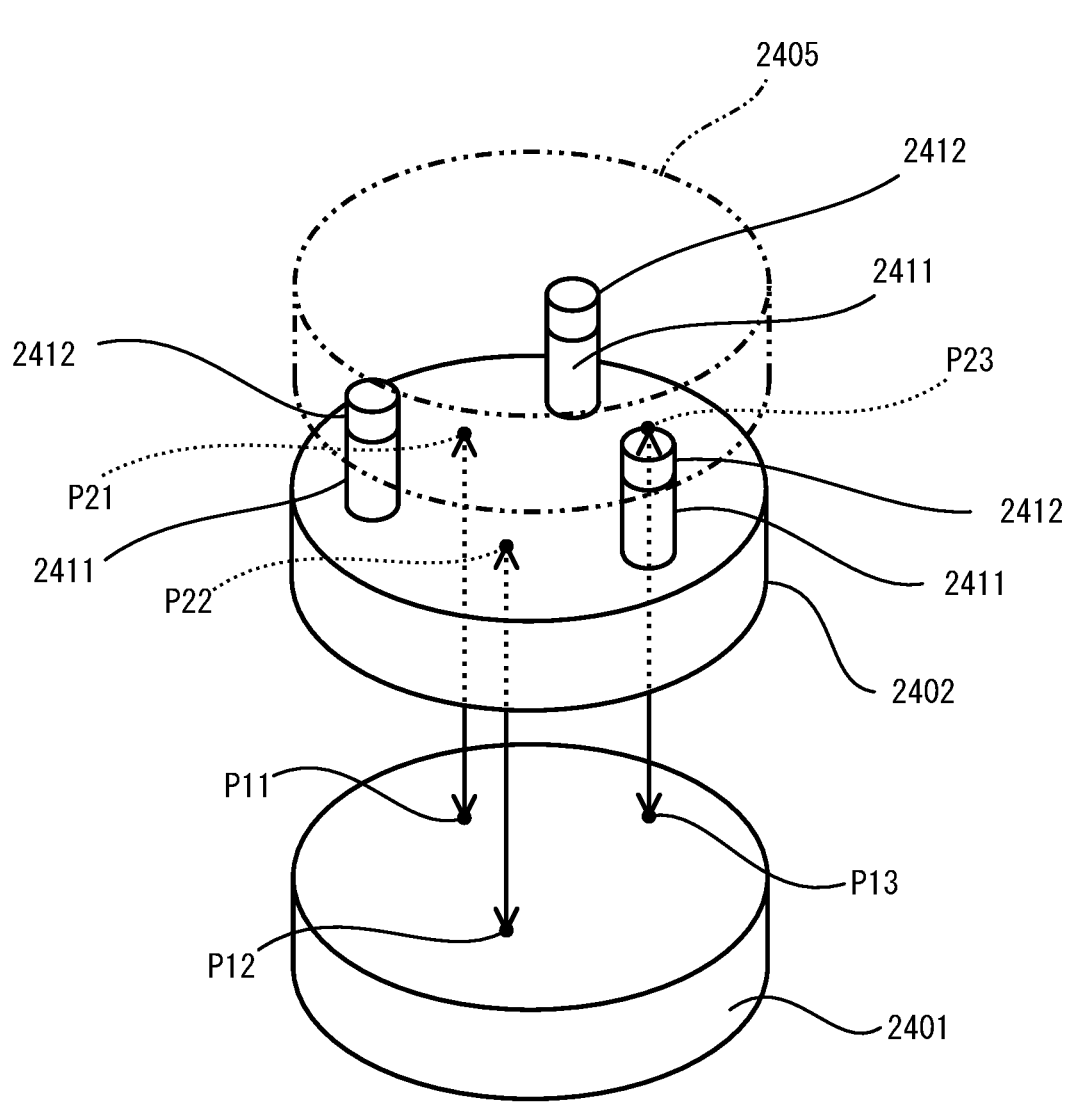
FIG. 13A is a schematic perspective view illustrating a vicinity of a stage and a head according to Embodiment 2.

As illustrated in FIG. 13A, three piezoelectric actuators 2411 and three pressure sensors 2412 are present. The three piezoelectric actuators 2411 and the three pressure sensors 2412 are disposed between the head 2402 and the XY direction driver 2405. The three piezoelectric actuators 2411 are fixed in three positions that are not on the same straight line on a surface of the head 2402 on the +Z direction side, and in three positions arranged at substantially equal intervals along a circumferential direction of the head 2402 on a circumferential portion of the surface of the head 2402 having a substantially circular shape in the plan view on the +Z direction side. The three pressure sensors 2412 are each interposed between an upper end portion of the piezoelectric actuator 2411 and a surface of the XY direction driver 2405 on the +Z direction side. The three piezoelectric actuators 2411 can each expand and contract in the Z-axis direction. Then, the three piezoelectric actuators 2411 expand and contract, and thus a fine adjustment is made to an inclination of the head 2402 around an X axis and a Y axis and a position of the head 2402 in the up-down direction. Further, the three pressure sensors 2412 measure an applied pressure in three positions in the surface of the head 2402 on the +Z direction side. Then, by driving each of the three piezoelectric actuators 2411 in such a way that applied pressures measured by the three pressure sensors 2412 are equal, the substrates W1 and W2 can be in contact with each other while the surface of the head 2402 on the +Z direction side and the surface of the stage 2401 on the +Z direction side are maintained to be substantially parallel.

The distance detector 2413 is formed of a laser distance meter or the like, and measures a distance between the stage 2401 and the head 2402 without contacting the stage 2401 and the head 2402. For example, when the head 2402 is transparent, the distance detector 2413 measures a distance between the stage 2401 and the head 2402 from a difference between reflected light by the surface of the stage 2410 on the +Z direction side and reflected light by the surface of the head 2402 on the −Z direction side when laser light is applied from above the head 2402 toward the stage 2401. The distance detector 2413 measures a distance between portions P11, P12, and P13 at three places in the surface of the stage 2401 on the +Z direction side and portions P21, P22, and P23 at three places in the surface of the head 2402 on the −Z direction side facing the portions P11, P12, and P13 in the Z-axis direction.

Figure 13B:
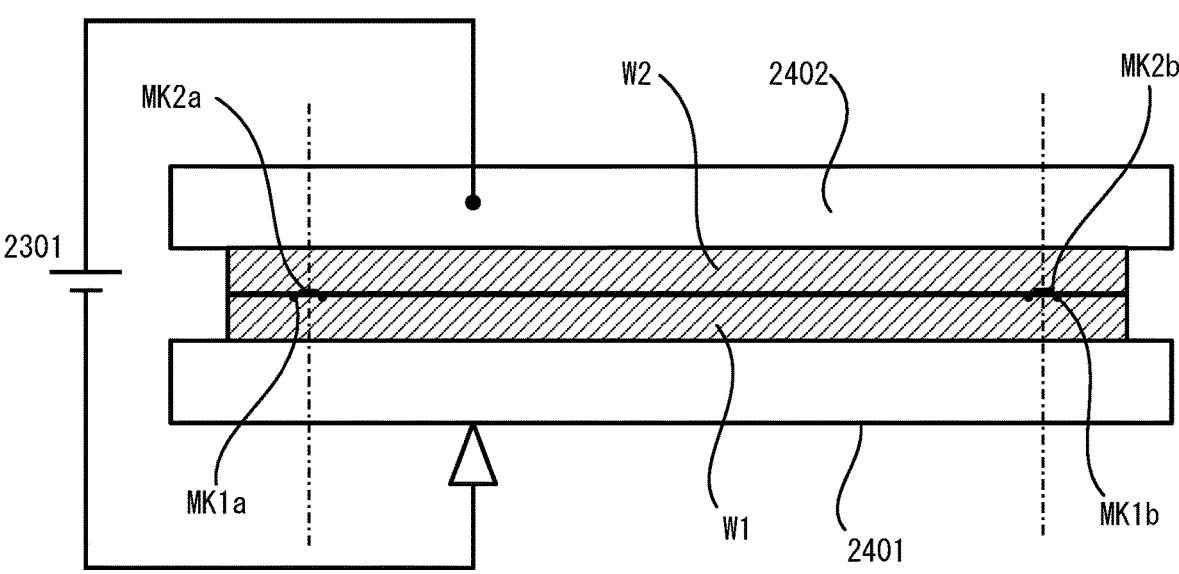
FIG. 13B is an operation explanatory diagram of a DC power source according to Embodiment 2.

As illustrated in FIG. 13B, a DC power source 2301 fixes or anode-bonds the substrate W1 to the substrate W2 by applying a DC voltage between the substrates W1 and W2 in a state where the substrates W1 and W2 are in contact with each other. The DC power source 2301 applies a DC voltage in such a way that the stage 2401 becomes a cathode and the head 2402 becomes an anode. For example, the DC power source 2301 applies a voltage in a range of 300 V or more to 900 V or less between the stage 2401 and the head 2402.

Referring back to FIG. 12, the measurement unit 2500 measures a position deviation amount of the substrate W1 and the substrate W2 in a direction (the XY direction, the rotation direction about the Z axis) orthogonal to the up-down direction. The measurement unit 2500 includes a plurality of (two in FIG. 12) capturing units 2501 and 2502 and mirrors 2504 and 2505. The capturing units 2501 and 2502 each include a capturing element (not illustrated) and a coaxial illumination system. As a light source of the coaxial illumination system of the capturing units 2501 and 2502, a light source that emits light (for example, infrared light) transmitted through the substrates W1 and W2, the stage 2401, and the window 2503 provided in the chamber 2200 is used.

Figure 14A:
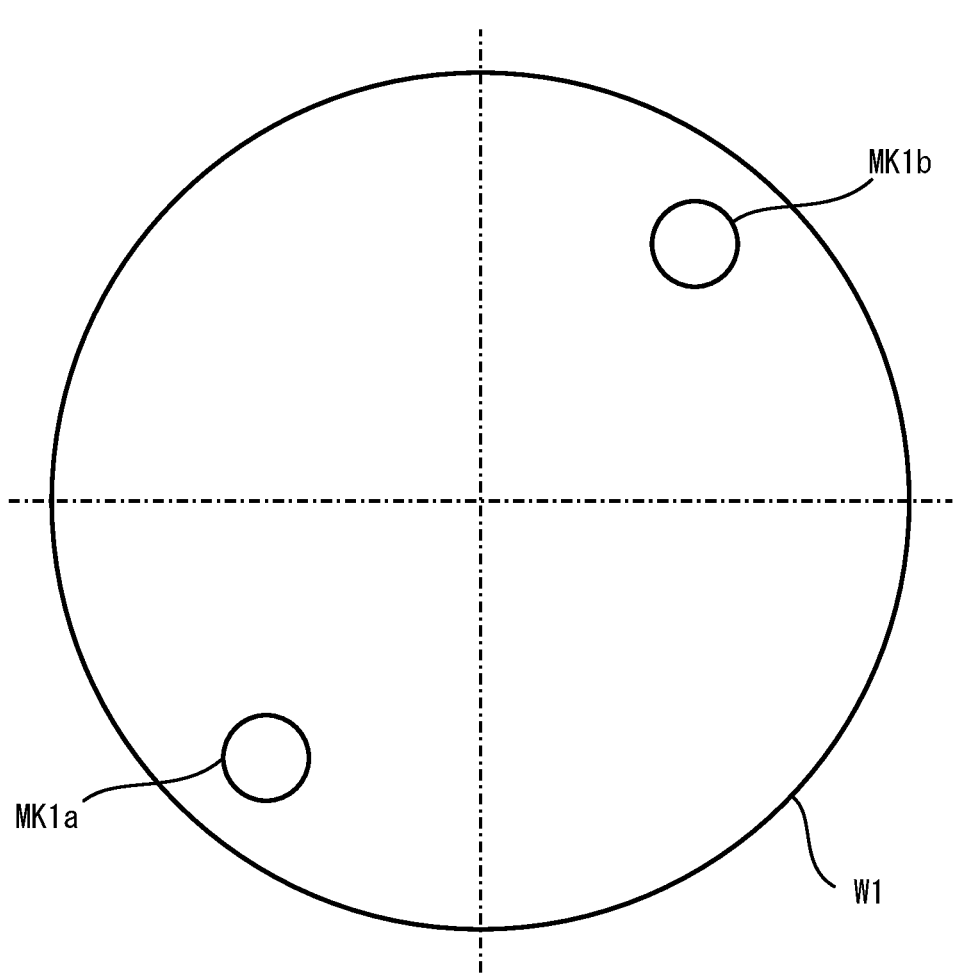
FIG. 14A is a diagram illustrating two alignment marks provided on one of two substrates to be bonded.
Figure 14B:
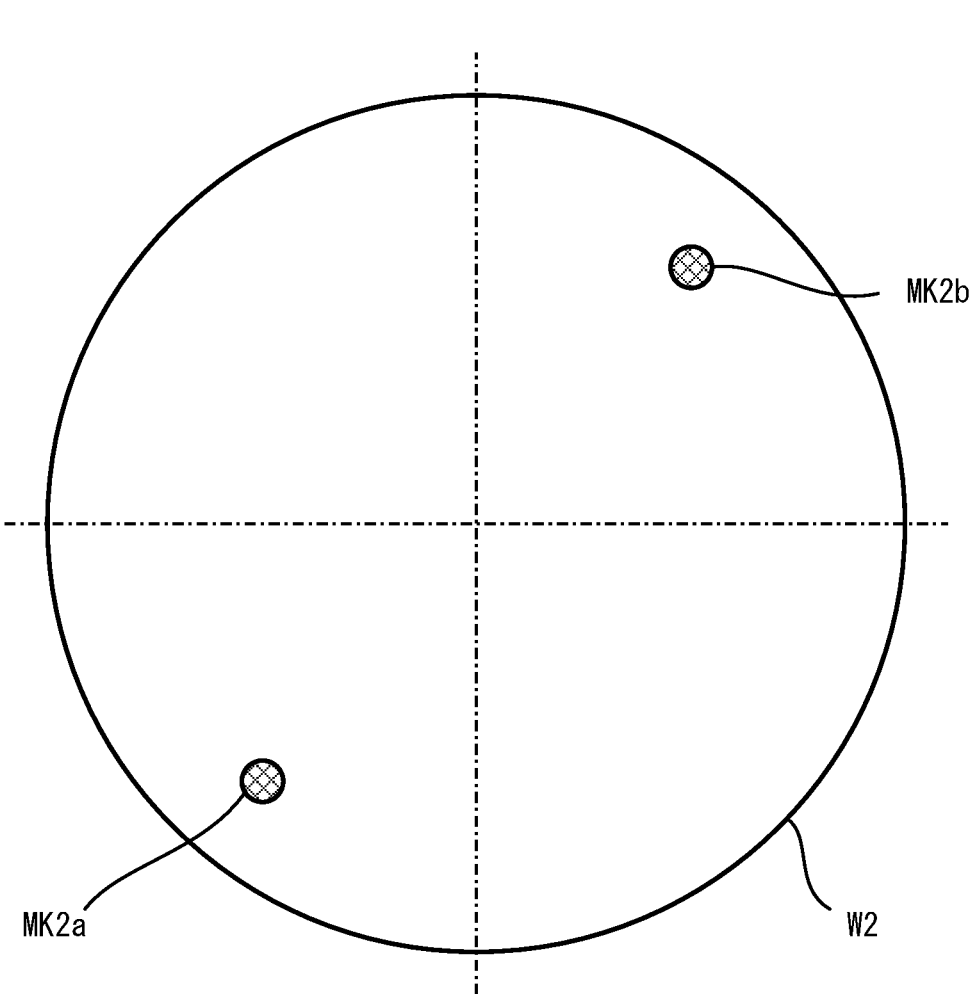
FIG. 14B is a diagram illustrating two alignment marks provided on another of the two substrates to be bonded.
Figure 15A:
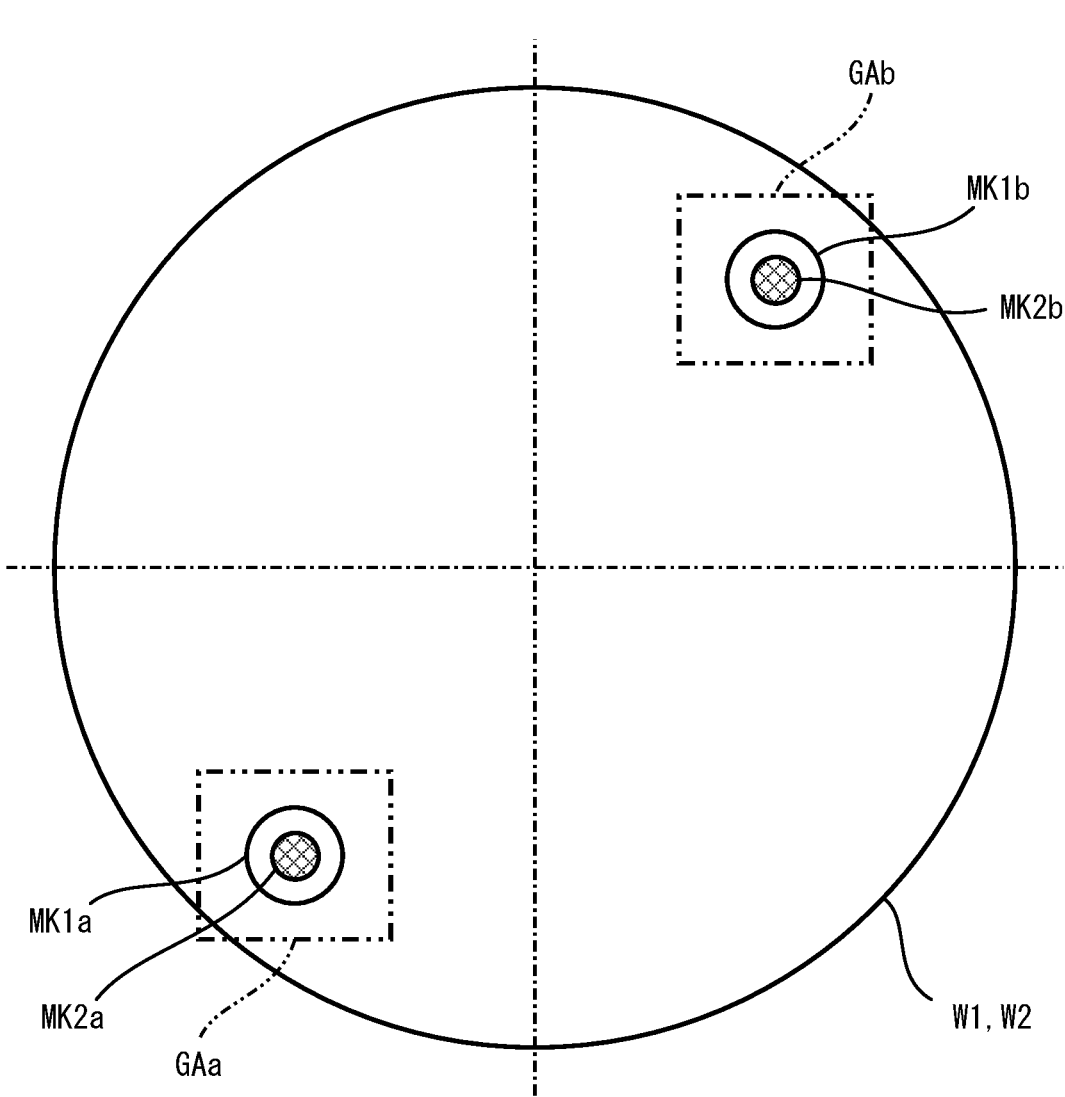
FIG. 15A is a schematic diagram illustrating a capturing image of the alignment marks of the substrate.

For example, as illustrated in FIGS. 14A and 14B, the substrate W1 is provided with two alignment marks MK1a and MK1b, and the substrate W2 is provided with two alignment marks MK2a and MK2b. A bonding device 2 performs an alignment operation of both the substrates W1 and W2 while recognizing a position of each of the alignment marks MK1a, MK1b, MK2a, and MK2b provided on both the substrates W1 and W2 by the measurement unit 2500. Herein, as illustrated in FIG. 12, light emitted from the light source (not illustrated) of the coaxial illumination system of the capturing unit 2501 is reflected by the mirror 2504, travels upward, and is transmitted through the window 2503 and the substrates W1 and W2. The light transmitted through the substrates W1 and W2 is reflected at the alignment marks MK1a and MK2a of the substrates W1 and W2, travels in the −Z direction, is transmitted through the window 2503, is reflected by the mirror 2504, and is incident on the capturing element of the capturing unit 2501. Further, light emitted from the light source (not illustrated) of the coaxial illumination system of the capturing unit 2502 is reflected by the mirror 2505, travels in the +Z direction, and is transmitted through the window 2503 and the substrates W1 and W2. The light transmitted through the substrates W1 and W2 is reflected at the alignment marks MK1b and MK2b of the substrates W1 and W2, travels in the −Z direction, is transmitted through the window 2503, is reflected by the mirror 2505, and is incident on the capturing element of the capturing unit 2502. In this way, as illustrated in FIG. 15A, the measurement unit 2500 acquires a capturing image GAa including the alignment marks MK1a and MK2a of the two substrates W1 and W2 and a capturing image GAb including the alignment marks MK1b and MK2b of the two substrates W1 and W2.

A controller 2090 includes an MPU, a main storage, an auxiliary storage, an interface, and a bus that connects the components similarly to the controller 90 according to Embodiment 1. The auxiliary storage stores a program executed by the MPU, and the like. Further, the auxiliary storage also stores position deviation amount threshold values Δxth, Δyth, and Δθth being preset for calculated relative position deviation amounts Δx, Δy, and Δθ between the substrates W1 and W2, which is described later. The interface converts a measurement signal input from the pressure sensors 2408 and 2412 and the distance detector 2413 into measurement information, and outputs the measurement information to the bus. Further, the interface converts a capturing image signal input from the capturing units 2501 and 2502 into capturing image information, and outputs the capturing image information to the bus. The MPU reads and executes, on the main storage, the program stored in the auxiliary storage, and thus outputs a control signal to each of the vacuum chuck, the piezoelectric actuator 2411, the temperature adjusters 2421 and 2422, the stage driver 2403, the head driver 2404, and the DC power source 2301 via the interface.

Figure 15B:
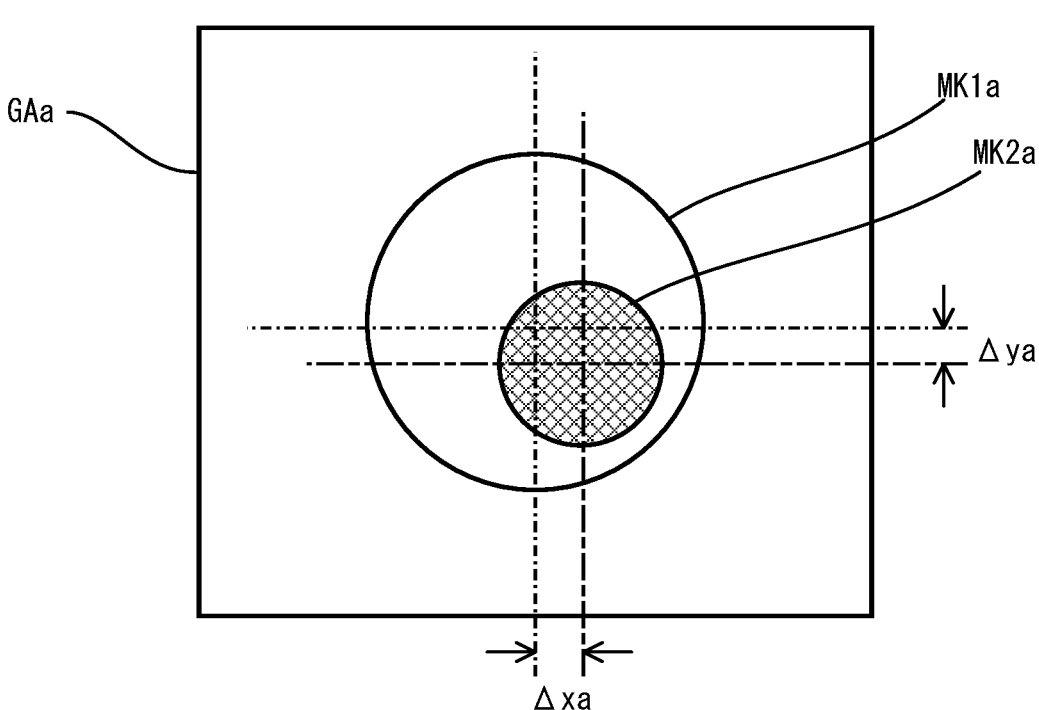
FIG. 15B is a schematic diagram illustrating a state where the alignment marks of the substrate deviate from each other.

As illustrated in FIG. 15B, the controller 2090 calculates position deviation amounts $\Delta$xa and $\Delta$ya between the alignment marks MK1a and MK2a in one group being provided on the substrates W1 and W2, based on the capturing image GAa acquired from the capturing unit 501. Note that, FIG. 15B illustrates a state where the alignment marks MK1a and MK2a in the one group deviate from each other. Similarly, the controller 2090 calculates position deviation amounts $\Delta$xb and $\Delta$yb between the alignment marks MK1b and MK2b in another one group being provided on the substrates W1 and W2, based on the capturing image GAb acquired from the capturing unit 2502. Subsequently, the controller 2090 calculates the relative position deviation amounts $\Delta$x, $\Delta$y, and $\Delta\theta$ between the substrates W1 and W2 in the X direction, the Y direction, and the rotation direction about the Z axis, based on the position deviation amounts $\Delta$xa, $\Delta$ya, $\Delta$xb, and $\Delta$yb of the two groups of the alignment marks and a geometric relationship between the two groups of the marks. Then, the controller 2090 moves the head 2402 in the X direction and the Y direction and rotates the head 2402 about the Z axis in such a way as to reduce the calculated position deviation amounts $\Delta$x, $\Delta$y, and $\Delta\theta$.

Next, substrate bonding processing performed by the bonding device 2 according to the present embodiment is described with reference to FIG. 16. The substrate bonding processing starts when a program for performing the substrate bonding processing is started by the controller 2090. Note that, in FIG. 16, it is assumed that the substrates W1 and W2 are conveyed in the bonding device 2.

First, the bonding device 2 calculates a relative position deviation amount of the substrates W1 and W2 in a state where the substrates W1 and W2 are not in contact with each other (step S201). Here, the bonding device 2 calculates a position deviation amount, based on a capturing image acquired by being captured by the capturing units 2501 and 2502 in a state where the substrates W1 and W2 face each other. Further, the bonding device 2 captures the substrates W1 and W2 by the capturing units 2501 and 2502 while maintaining the substrates W1 and W2 at the same preset prescribed temperature. Here, the prescribed temperature is set to a temperature needed for anode-bonding the substrates W1 and W2, and is set in a range of 200° C. or higher to 400° C. or lower.

Next, the bonding device 2 aligns relative positions between the substrates W1 and W2, based on the calculated position deviation amount, in a state where the substrates W1 and W2 are not in contact with each other (step S202). Subsequently, the bonding device 2 brings the substrate W2 into contact with the substrate W1 by moving the head 2402 that holds the substrate W2 in the vertically downward direction (step S203). Here, a force for pushing the head 2402 in the vertically downward direction by the raising and lowering driver 2406 is sufficiently greater than a force for maintaining a posture of the head 2402 by the piezoelectric actuator 2411. Thus, even when the substrate W2 in a posture inclined with respect to the substrate W1 is held by the head 2402 in a state before the substrate W2 is in contact with the substrate W1, the bonding portion of the substrate W2 can be brought into surface contact with the bonding portion of the substrate W1.

Subsequently, the bonding device 2 calculates a relative position deviation amount of the substrates W1 and W2 in a state where the substrates W1 and W2 are in contact with each other (step S204). Here, the bonding device 2 captures the substrates W1 and W2 by the capturing units 2501 and 2502 while maintaining the substrates W1 and W2 at the same preset prescribed temperature. Herein, the controller 2090 of the bonding device 2 first acquires, from the capturing units 2501 and 2502, the capturing images GAa and GAb of the two substrates W1 and W2 in a non-contact state as illustrated in FIG. 15A. Further, the controller 2090 calculates each of the position deviation amounts $\Delta$x, $\Delta$y, and $\Delta\theta$ of the substrates W1 and W2 in the X direction, the Y direction, and the rotation direction about the Z axis, based on the two capturing images GAa and GAb. Then, the controller 90 calculates the position deviation amounts $\Delta$x, $\Delta$y, and $\Delta\theta$ of the substrate W1 and W2 in the horizontal direction, based on the position deviation amounts $\Delta$xa, $\Delta$ya, $\Delta$xb, and $\Delta$yb.

Figure 16:
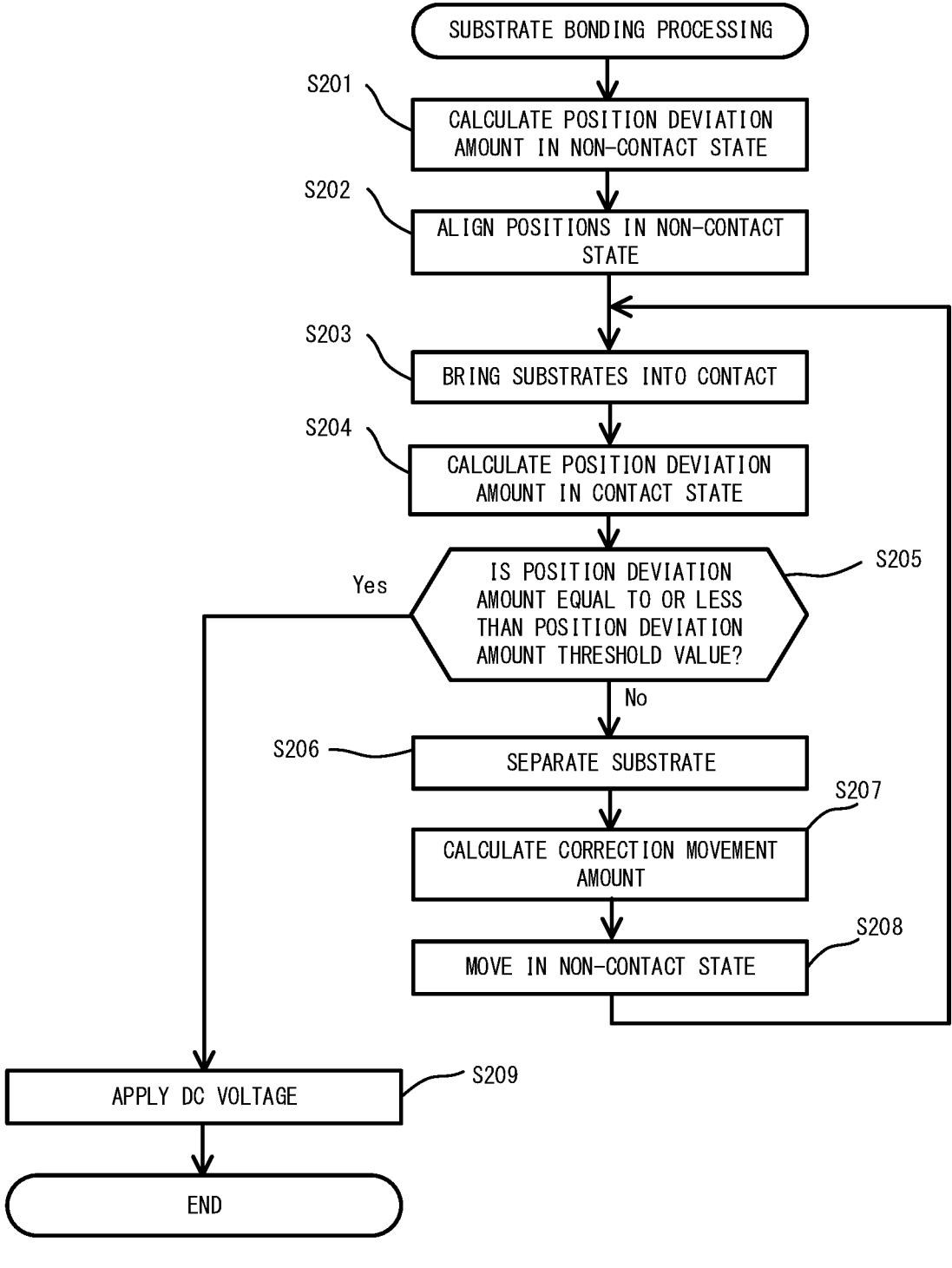
FIG. 16 is a flowchart illustrating a flow of substrate bonding processing performed by the bonding device according to Embodiment 2.

Next, as illustrated in FIG. 16, the bonding device 2 determines whether all of the calculated position deviation amounts $\Delta$x, $\Delta$y, and $\Delta\theta$ are equal to or less than the preset position deviation amount threshold values $\Delta$xth, $\Delta$yth, and $\Delta\theta$th (step S205). Here, the position deviation amount threshold values $\Delta$xth, $\Delta$yth, and $\Delta\theta$th are set to, for example, about 0.2 When the bonding device 2 determines that any of the calculated position deviation amounts $\Delta$x, $\Delta$y, and $\Delta\theta$ exceeds the position deviation amount threshold values $\Delta$xth, $\Delta$yth, and $\Delta\theta$th (step S205: No), the bonding device 2 separates the substrate W2 from the substrate W1 (step S206).

Subsequently, the bonding device 2 calculates a correction movement amount and a correction movement direction when the bonding device 2 moves the substrate W2 relatively to the substrate W1 in order to eliminate a position deviation of the substrate W2 from the substrate W1, based on the calculated position deviation amounts $\Delta$x, $\Delta$y, and $\Delta\theta$ (step S207). After that, the bonding device 2 moves the head 2402 that holds the substrate W2 by the calculated correction movement amount in the calculated correction movement direction in a non-contact state between the substrates W1 and W2 (step S208). After that, the bonding device 2 brings the substrate W2 into contact with the substrate W1 again (step S203).

Further, it is assumed that, in step S205, the bonding device 2 determines that all of the calculated position deviation amounts $\Delta$x, $\Delta$y, and $\Delta\theta$ are equal to or less than the position deviation amount threshold values $\Delta$xth, $\Delta$yth, and $\Delta\theta$th (step S205: Yes). In this case, while the bonding device 2 maintains the substrates W1 and W2 at the same preset prescribed temperature, the bonding device 2 applies, by the DC power source 2301, a DC voltage between the stage 2401 that holds the substrate W1 and the head 2402 that holds the substrate W2 (step S209). In this way, an alkaline ion-deficient layer in which an alkaline ion near a contact interface with the substrate W2 in the substrate W1 is deficient grows. Then, the substrates W1 and W2 are bonded together by strong Coulomb force generated between a strong negative charge generated in the alkaline ion-deficient layer and a positive charge generated near the contact interface with the substrate W2.

For example, when a through hole is provided in each of the substrates W1 and W2, the through holes need to be aligned with high accuracy. Further, for example, when a substrate including, on a surface thereof, a region in which a metal portion is exposed and the other region, having an interval between the metal portions of 3 $\mu$m, and having a size of the metal portion of about φ1 µm is adopted as the substrates W1 and W2, the metal portions need to be aligned with high accuracy at a submicron level. In contrast, the bonding device 2 according to the present embodiment can align the substrates W1 and W2 with high accuracy at a submicron level by performing the substrate bonding processing described above.

In a case where the substrate W2 is inclined with respect to the substrate W1, when the substrates W1 and W2 are pressurized in the direction of close adhesion, a position deviation occurs due to the bonding portion of one of the substrates W1 and W2 following the other bonding portion during contact between the substrates W1 and W2. In contrast, in the bonding device 2 according to the present embodiment, when a position deviation amount of the substrate W2 with respect to the substrate W1 is equal to or less than a preset position deviation amount threshold value, the substrate W2 is anode-bonded to the substrate W1, and, when the position deviation amount described above is greater than the position deviation amount threshold value, the substrate W2 is aligned with the substrate W1 again. In this way, a position deviation of the substrate W2 from the substrate W1 caused by the substrate W2 being inclined with respect to the substrate W1 can be corrected. Therefore, the substrates W1 and W2 can be bonded together with high position accuracy. In other words, the bonding device 2 according to the present embodiment performs both of correction of a position deviation of the substrate W2 from the substrate W1 caused by pressurizing the substrates W1 and W2 in the direction of close adhesion, and maintenance of a temperature of the substrates W1 and 2 at the same prescribed temperature, and thus the bonding device 2 can suppress a position deviation of the substrate W2 from the substrate W1 caused by thermal expansion of the substrates W1 and W2, and can bond the substrates W1 and W2 with high position accuracy. In other words, in the bonding method according to the present embodiment, while the substrates W1 and W2 are heated at the same prescribed temperature needed for anode bonding, a position deviation caused by the substrate W2 being inclined with respect to the substrate W1 is corrected by performing a series of the processing in steps S203 to S208, and the substrates W1 and W2 are anode-bonded by applying a DC voltage between the substrates W1 and W2. In this way, there is an advantage that a position deviation of the substrates W1 and W2 does not occur even when the substrates W1 and W2 are heated after that.

Embodiment 3

A substrate bonding device according to the present embodiment is a device that bonds two substrates by performing hydrophilic treatment on bonding portions of the two substrates in a chamber under a reduced pressure, and then pressurizing and heating the substrates in contact with each other. In the hydrophilic treatment, a bonding portion of a substrate is made hydrophilic by supplying water and the like to a vicinity of the bonding portion of the substrate being activated by activation treatment. In the present embodiment, for example, substrates each including, on a bonding portion, a metal portion formed of Cu and an insulating film formed of $SiO_2$ are bonded. Here, a bonding surface of the metal portion and a bonding surface of the insulating film of each of the substrates are polished by CMP, and have flatness of Ra of about 0.5 nm. Here, since the bonding surfaces of the two substrates come into contact and are bonded together, a particle and the like should not be sandwiched between the two substrates. Note that, in the hydrophilic treatment, the bonding surface of each of the two substrates is activated by plasma treatment. In the plasma treatment, for example, treatment that exposes the surface of the metal portion formed of Cu and the surface of the insulating film formed of $SiO_2$ to nitrogen plasma of 50 W to 500 W is performed, and the surfaces are then washed by water in the atmosphere, and thus a particle adhering to the bonding surface of each of the two substrates is removed simultaneously with the hydrophilic treatment being performed. The surface of each of the two substrates subjected to the hydrophilic treatment is in a terminated state by an OH radical, and, when the bonding surfaces of the two substrates are brought into contact, the two substrates are bonded together with a water molecule interposed therebetween. In this state, by heating the two substrates, dehydration occurs at a contact interface between the two substrates, and a bond between the two substrates changes from a hydrogen bond to a stronger covalent bond. The bonding method is generally referred to as hybrid bonding.

Figure 17:
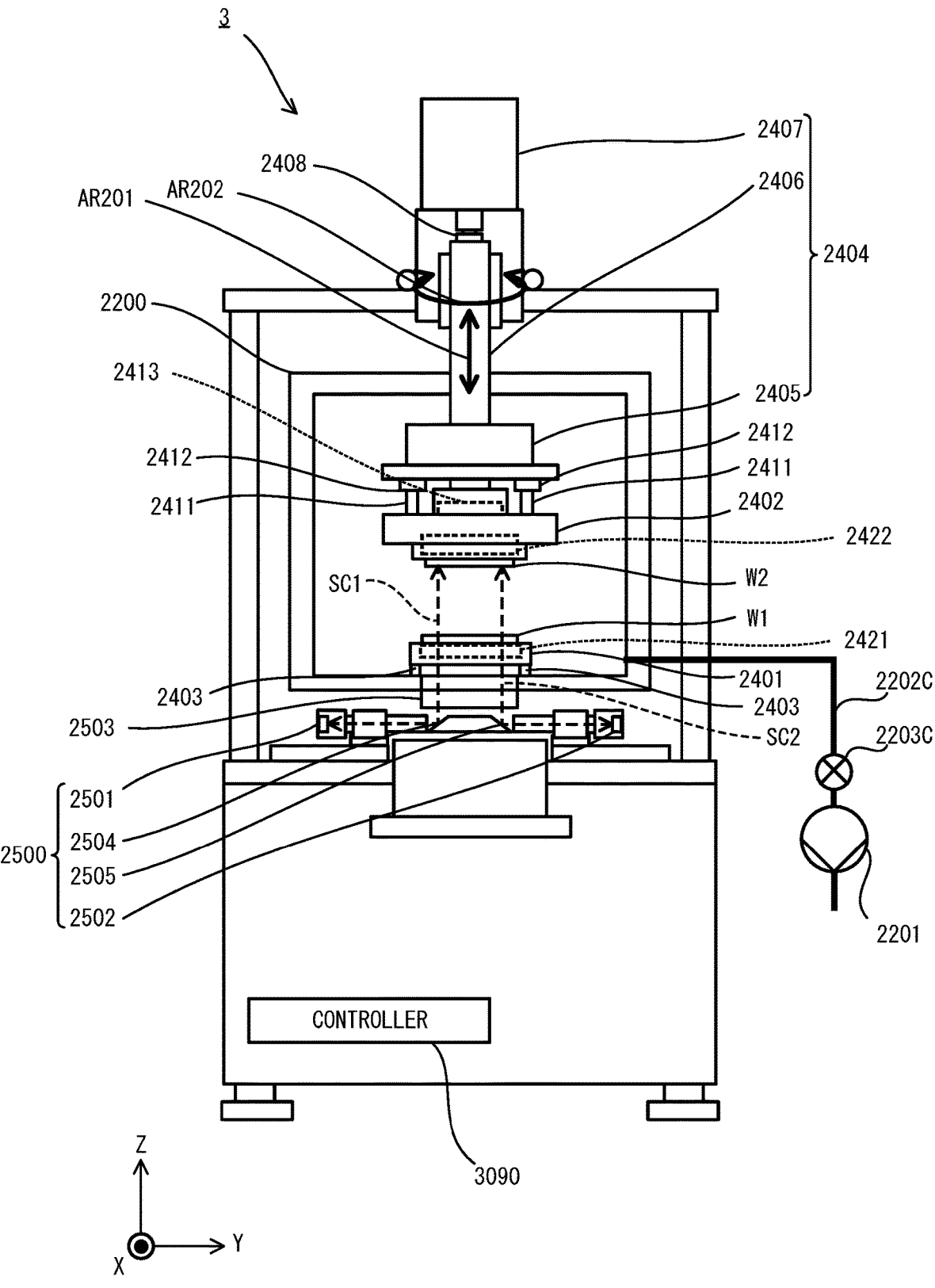
FIG. 17 is a schematic front view of the inside of a bonding device according to Embodiment 3 of the present disclosure.

As illustrated in FIG. 17, a bonding device 3 according to the present embodiment includes a chamber 2200, a stage 2401, a head 2402, a stage driver 2403, a head driver 2404, temperature adjusters 2421 and 2422, a distance detector 2413, and a measurement unit 2500. Note that, in FIG. 17, a configuration similar to that in Embodiment 2 has the same reference sign as that in FIG. 12. The bonding device 3 according to the present embodiment has a configuration in which the DC power source 2301 is omitted from the bonding device 2 according to Embodiment 2. Further, substrates W1 and W2 include bonding portions that are bonded to each other. As the substrates W1 and W2, for example, a substrate including, on a surface thereof, a region in which a metal portion is exposed and the other region is adopted. A surface of the substrates W1 and W2 is polished by chemical mechanical polishing (CMP), and surface roughness is set to Ra of equal to or less than 1 nm. Further, the metal portion is formed of Cu, Au, or the like, for example. Furthermore, in a region other than the region in which the metal portion is exposed, a layer formed of an insulator such as an oxide film, for example, is exposed.

Figure 18:
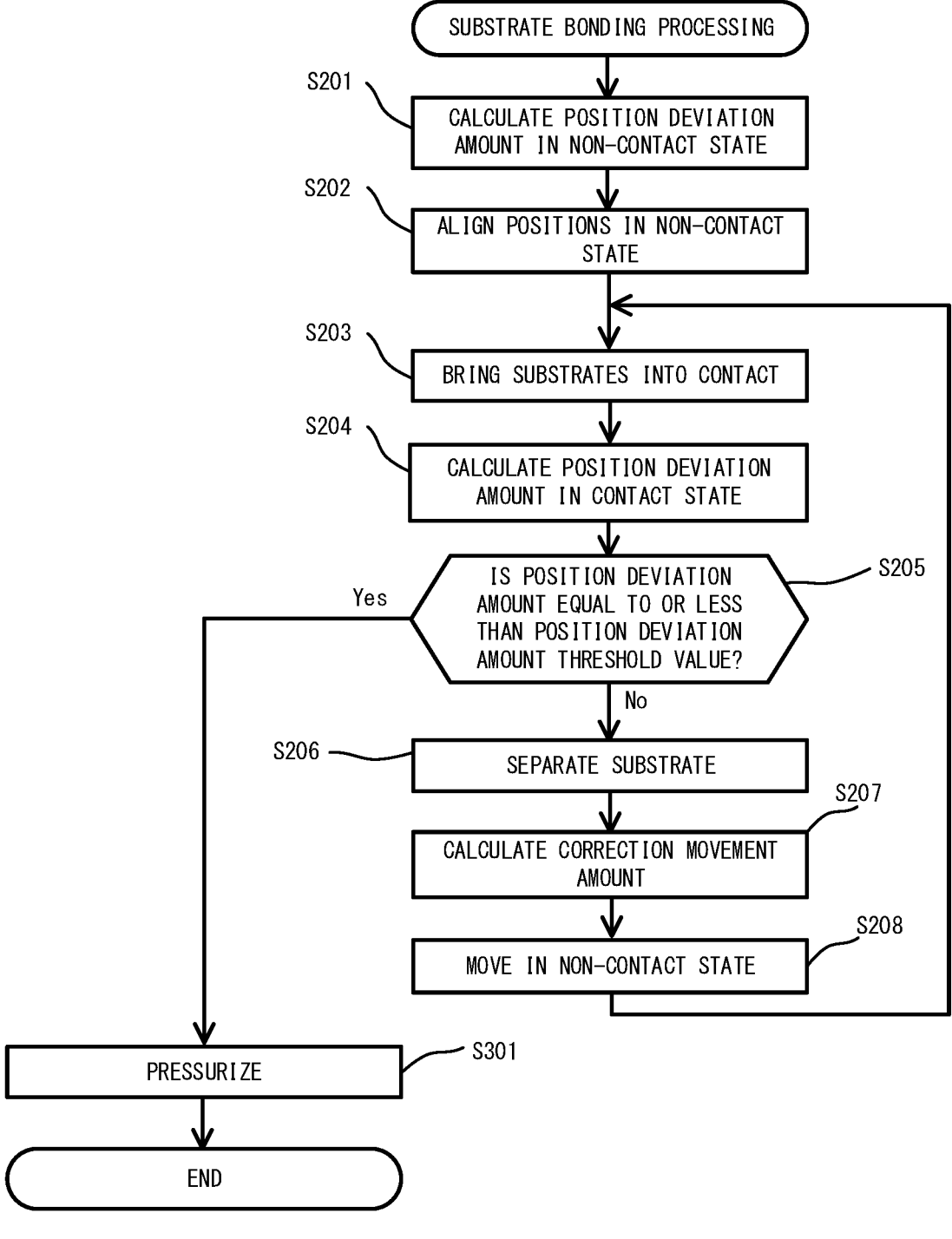
FIG. 18 is a flowchart illustrating a flow of substrate bonding processing performed by the bonding device according to Embodiment 3.

Next, substrate bonding processing performed by the bonding device 3 according to the present embodiment is described with reference to FIG. 18. The substrate bonding processing starts when a program for performing the substrate bonding processing is started by a controller 3090. Note that, in FIG. 18, it is assumed that the substrates W1 and W2 are conveyed in the bonding device 3. Further, it is assumed that the substrates W1 and W2 are subjected in advance to a hydrophilic treatment step of performing hydrophilic treatment on each bonding portion. Furthermore, in FIG. 18, processing similar to that in Embodiment 2 has the same reference sign as that in FIG. 16.

First, the bonding device 2 performs a series of processing in steps S201 to S204. Next, the bonding device 2 determines whether all of calculated position deviation amounts $\Delta x$, $\Delta y$, and $\Delta\theta$ are equal to or less than preset position deviation amount threshold values $\Delta xth$, $\Delta yth$, and $\Delta\theta th$ (step S205). Here, the position deviation amount threshold values $\Delta xth$, $\Delta yth$, and $\Delta\theta th$ are set to, for example, about 0.2 µm. When the bonding device 2 determines that any of the calculated position deviation amounts $\Delta x$, $\Delta y$, and $\Delta\theta$ exceeds the position deviation amount threshold values $\Delta xth$, $\Delta yth$, and $\Delta\theta th$ (step S205: No), the bonding device 3 performs a series of processing in and after step S206.

On the other hand, it is assumed that the bonding device 3 determines that all of the calculated position deviation amounts Δx, Δy, and Δθ are equal to or less than the position deviation amount threshold values Δxth, Δyth, and Δθth (step S205: Yes). In this case, while the bonding device 3 maintains the substrates W1 and W1 at the same preset prescribed temperature, the bonding device 3 applies a driving force to the head 2402 in a direction in which the head 2402 moves toward the stage 2401 side, and thus pressurizes the substrate W2 to the substrate W1 in a direction of close adhesion between the bonding portions of the substrates W1 and W2 with pressure equal to or more than preset reference pressure (step S301). Here, the prescribed temperature is a normal temperature (for example, 25° C.), that is, a temperature in a state where the head 2402 and the stage 2401 are not heated or a temperature in a state where the head 2402 and the stage 2401 are heated to the same temperature. In this way, the substrate W2 is in a state of being temporarily bonded to the substrate W1. The processing in step S301 corresponds to a temporary bonding step of temporarily bonding the substrates W1 and W2 together by pressurizing in the direction of close adhesion between the bonding portions of the substrates W1 and W2 in a state where the bonding portions of the substrates W1 and W2 are in contact with each other. Subsequently, by heating the substrates W1 and W2, a hydrogen bond between the substrates W1 and W2 changes to a covalent bond, and the substrates W1 and W2 are bonded together. Here, when pressurizing is performed with pressure less than the reference pressure, the substrate W2 can be separated from the substrate W1. Further, when pressurizing is performed with pressure less than the reference pressure described above in a state where central portions of the substrates W1 and W2 are bent in a direction closer to each other with respect to circumferential portions, the substrate W2 can also be separated from the substrate W1. Note that, in step S301, a position deviation due to the substrate W2 being inclined with respect to the substrate W1 is corrected, and thus a position deviation does not occur even when the substrate W2 is pressurized to the substrate W1 in the direction of close adhesion between the bonding portions of the substrates W1 and W2 with pressure equal to or more than the preset reference pressure.

For example, when a substrate having a size of the metal portion of about φ3 μm or a substrate having an interval between the metal portions of about 3 μm and having a size of the metal portion of φ1 μm is adopted as the substrates W1 and W2, the metal portions need to be aligned with high accuracy at a submicron level. In contrast, the bonding device 3 according to the present embodiment can align the substrates W1 and W2 with high accuracy at a submicron level by performing the substrate bonding processing described above.

Further, in a case where the substrate W2 is inclined with respect to the substrate W1, when the substrates W1 and W2 are pressurized in the direction of close adhesion, a position deviation occurs due to the bonding portion of one of the substrates W1 and W2 following the other bonding portion during contact between the substrates W1 and W2. In contrast, in the bonding device according to the present embodiment, when a position deviation amount of the substrate W2 with respect to the substrate W1 is equal to or less than a preset position deviation amount threshold value, the substrate W2 is fixed to the substrate W1, and, when the position deviation amount described above is greater than the position deviation amount threshold value, the substrate W2 is aligned with the substrate W1 again. In this way, a position deviation of the substrate W2 from the substrate W1 caused by the substrate W2 being inclined with respect to the substrate W1 can be corrected. Therefore, the substrates W1 and W2 can be bonded together with high position accuracy. In other words, the bonding device according to the present modification example performs both of correction of a position deviation of the substrate W2 from the substrate W1 caused by pressurizing the substrates W1 and W2 in the direction of close adhesion, and maintenance of a temperature of the substrates W1 and 2 at the same prescribed temperature, and thus the bonding device can suppress a position deviation of the substrate W2 from the substrate W1 caused by thermal expansion of the substrates W1 and W2, and can bond the substrates W1 and W2 with high position accuracy. In other words, in the bonding method according to the present embodiment, by performing a series of the processing in steps S203 to S208 while maintaining the substrates W1 and W2 at a normal temperature, that is, the same prescribed temperature being about a room temperature, a position deviation caused by the substrate W2 being inclined with respect to the substrate W1 is corrected. Therefore, in step S301, a position deviation of the substrates W1 and W2 does not occur even when the substrate W2 is pressurized to the substrate W1 in the direction of close adhesion between the bonding portions of the substrates W1 and W2 with pressure equal to or more than preset reference pressure. Further, in the bonding method according to the present embodiment, since the substrates W1 and W2 are already temporarily bonded together by a hydrogen bond with an OH radical before the processing in step S301, a position deviation does not occur even when the substrates W1 and W2 are heated after that. In other words, in a series of the processing in steps S203 to S208, a position deviation is corrected without heating the substrates W1 and W2, and, in step S301, the substrate W2 is then fixed to the substrate W1 by pressurizing the substrate W2 to the substrate W1 in the direction of close adhesion between the bonding portions of the substrates W1 and W2 with pressure equal to or more than the preset reference pressure. Then, the substrates W1 and W2 are heated after the substrates W1 and W2 are fixed, and thus a position deviation of the substrates W1 and W2 does not occur during heating of the substrates W1 and W2.

Embodiment 4

Figure 19:
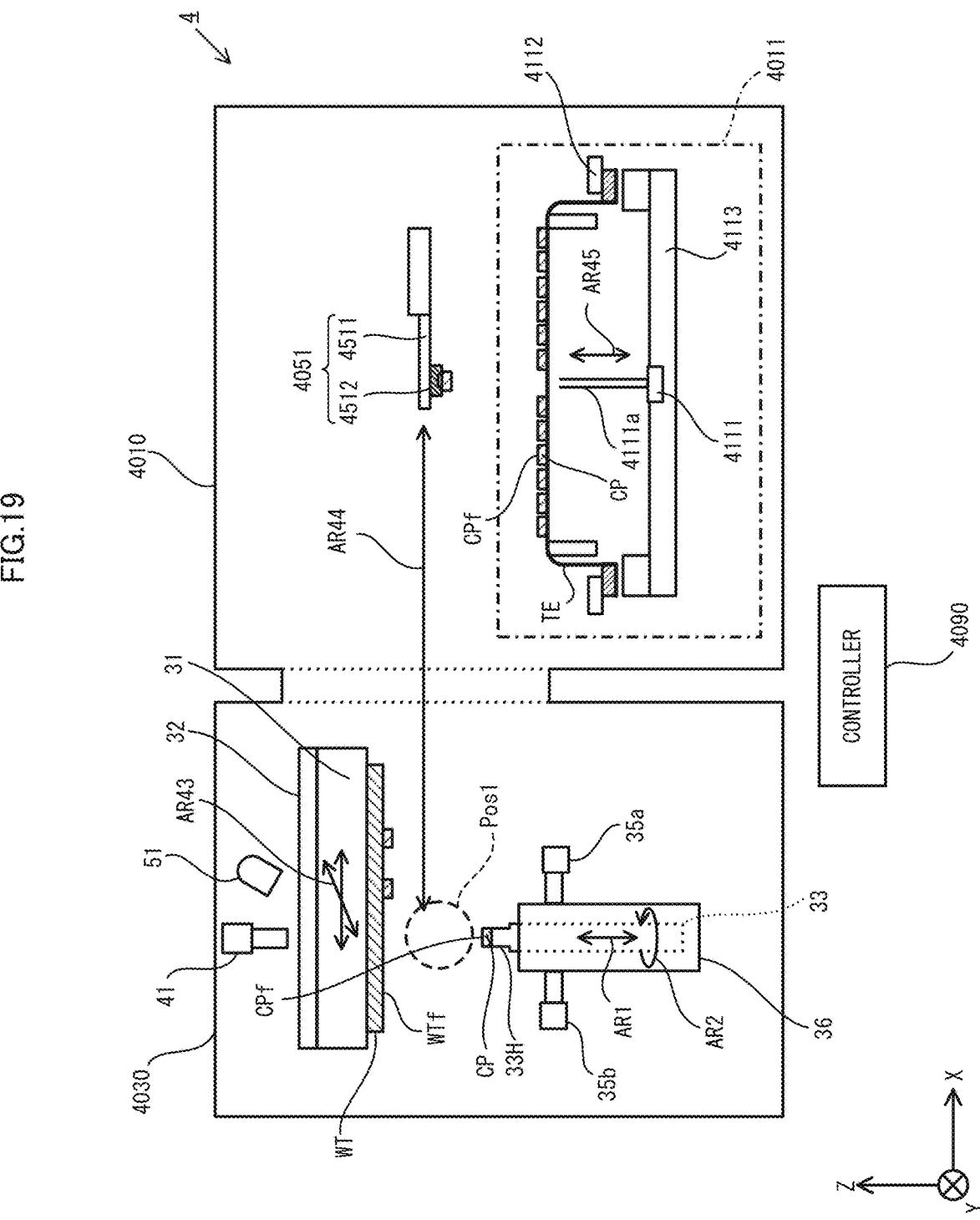
FIG. 19 is a schematic front view of the inside of a bonding device according to Embodiment 4 of the present disclosure.

A bonding device according to the present embodiment is different from the bonding device according to Embodiment 1 in a point that the bonding device according to the present embodiment includes a chip supply unit that supplies the bonding device with one chip from chips held on a sheet. As illustrated in FIG. 19, a bonding device 4 according to the present embodiment includes a chip supply unit 4010, a bonding unit 4030, and a controller 4090. Note that, the following description gives description as appropriate on the assumption that the ±Z direction in FIG. 19 is the up-down direction and the XY direction is the horizontal direction. The chip supply unit 4010 is a bonded article supplier that acquires one chip CP from a plurality of chips CP adhering to a sheet TE held by a sheet holding frame 4112, and supplies the one chip CP to the bonding unit 4030. Here, for example, an adhesive sheet that holds the plurality of chips CP on one surface side having adhesion can be adopted as the sheet IL. The chip supply unit 4010 includes a chip supplier 4011, and a chip conveyor 4051 that conveys the chip CP supplied from the chip supplier 4011 to a head 33H of the bonding unit 4030. Note that a tray may be provided instead of the sheet TE, and a plurality of chips may be placed on the tray.

The chip supplier 4011 includes a frame holder 4119 that holds the sheet holding frame 4112, and a pickup mechanism 4111 for picking up one chip CP from the plurality of chips CP. Note that, in order to prevent a particle from falling onto the plurality of chips CP (diced wafer), a cover having a hole in a take-out portion from which the pickup mechanism 4111 takes out the chip CP may be provided. Further, the chip supplier 4011 includes a holding frame driver 4113 that drives the sheet holding frame 4112 in the XY direction or the direction rotating about the Z axis. The frame holder 4119 includes the sheet holding frame 4112 in a posture with, on the vertically upward direction (+Z direction) side, a surface of the sheet TE on which the plurality of chips CP adhere. The pickup mechanism 4111 separates one chip CP among the plurality of chips CP from the sheet TE, by cutting out (pushing out) the one chip CP from a side of the sheet TE, opposite to the plurality of chips CP side. Here, the pickup mechanism 4111 includes a needle 4111*a*, and can move the needle 4111*a* in the vertical direction as indicated by an arrow AR45. Then, the pickup mechanism 4111 adsorbs and holds a circumferential portion on a side of the chip CP opposite to a surface CPf side, peels the chip CP from the adhesive sheet by pushing out by the needle 4111*a*, and cuts out the chip CP. The pickup mechanism 4111 supplies the chip CP by pushing the sheet TE by the needle 4111*a* from the vertically downward direction (−Z direction) in the sheet TE, and holding up the chip CP in the vertically upward direction (+Z direction). Then, each chip CP adhering to the sheet TE, is held up by the needle 4111*a* and is adsorbed and held while the chip conveyor 4051 abuts a resin portion CPR1 of the chip CP, and the chip CP is then cut out upward one by one by rising in the +Z direction. The holding frame driver 4113 drives the sheet holding frame 4112 in the XY direction or the direction rotating about the Z axis, and thus changes a position of the chip CP located vertically above the needle 4111*a*. Further, it is more suitable to perform positioning by performing image processing on a chip position from above with a camera. Further, the example in which the chip transfer 4051 linearly transfers a chip to the head is illustrated, but the present disclosure is not limited to this, and the chip transfer 4051 may serve as a rotation mechanism and supply a chip to the head, and the method is not limited.

Figure 20:
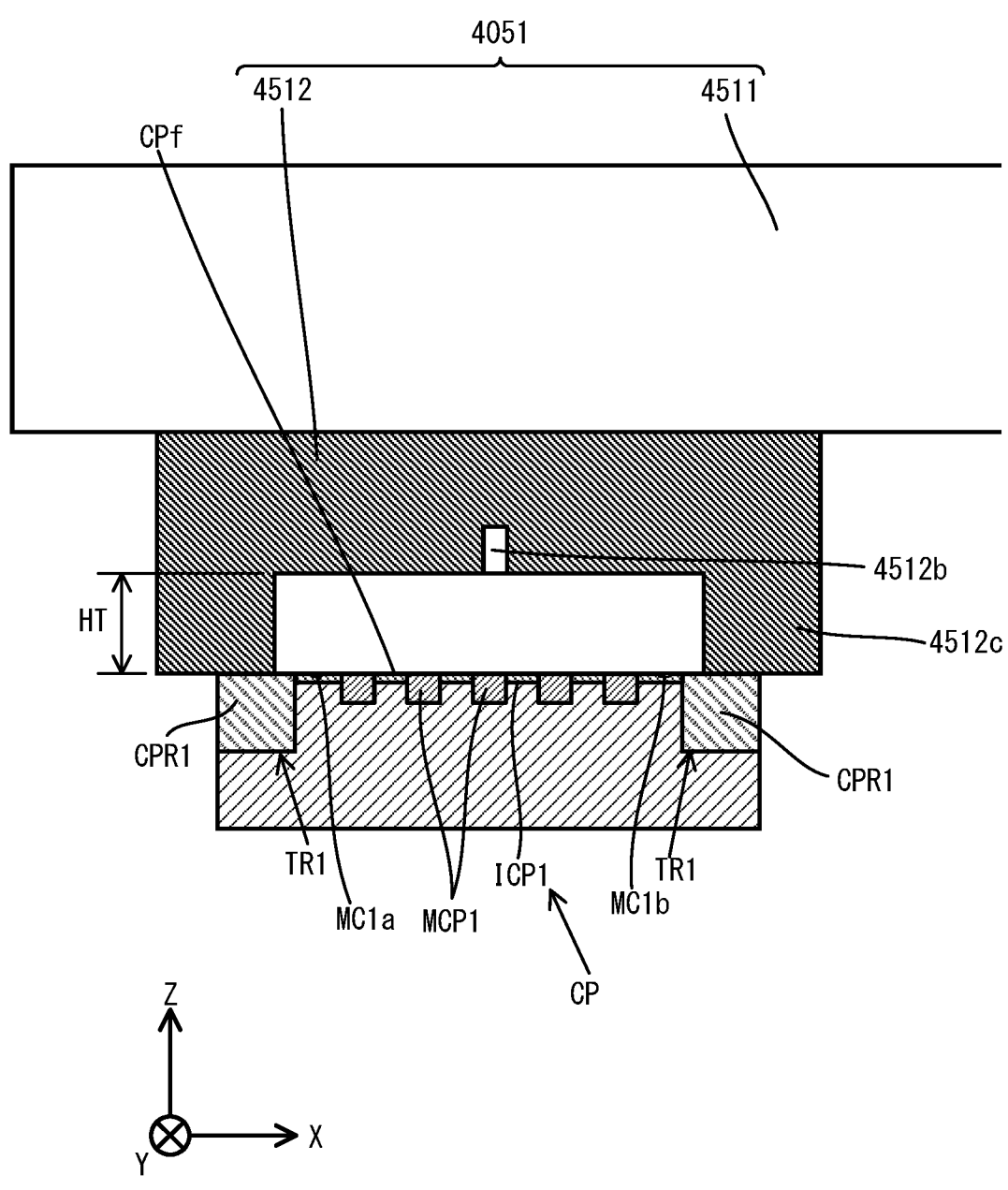
FIG. 20 is a diagram illustrating a chip holder according to Embodiment 4.

The chip conveyor 4051 is a bonded article conveyor that conveys the chip CP supplied from the chip supplier 4011 to a transfer position Pos1 in which the chip CP is transferred to the head 33H of the bonding unit 4030. The chip conveyor 4051 includes a main body 4511 and a chip holder 4512. The main body 4511 moves the chip holder 4512 in the Z-axis direction between a preset standby position and the transfer position Pos1 as indicated by an arrow AR44. As illustrated in FIG. 20, the chip holder 4512 includes an adsorption portion 4512*b*, and a protruding portion 4512*c* protruding around the adsorption portion 4512*b*. The chip holder 4512 holds an upper surface side of the chip CP in a state where the surface CPf side of the chip CP bonded to a substrate WT faces in the vertically upward direction (+Z direction). Here, it is assumed that the chip CP has the structure described in FIG. 3B in Embodiment 1, for example. In this case, a tip portion of the protruding portion 4512*c* of the chip holder 4512 abuts only the resin portion CPR1 of the chip CP. Here, a protruding amount HT of the protruding portion 4512*c* is set to magnitude that a metal portion MCP1 inside the resin portion CPR1 is not in contact with the chip holder 4512. Then, the chip holder 4512 holds the chip CP by adsorbing the chip CP by the adsorption portion 4512*b* in a state where the tip portion of the protruding portion 4512*c* abuts the resin portion CPR1. In other words, a bonding portion of the chip CP includes the metal portion MCP1 and an insulating film ICP1, and the chip holder 4512 conveys the chip CP in a non-contact state with the metal portion MCP1 and the insulating film ICP1. The metal portion MCP1 and the insulating film ICP1 each have, on a side bonded to the substrate WT, a bonding surface to be bonded to the substrate WT, and the resin portion CPR1 has, on the side bonded to the substrate WT, a contact surface to be in contact with the substrate WT. Then, the bonding surface of each of the metal portion MCP1 and the insulating film ICP1 and the contact surface of the resin portion CPR1 are located on the same plane.

The bonding unit 4030 has a configuration similar to that of the bonding device 30 described in Embodiment 1. In the bonding unit 4030, when the chip conveyor 4051 conveys the chip CP to the transfer position Pos1, the chip CP is transferred from the chip conveyor 4051 to the head 33H. The controller 4090 includes a CPU, a main storage, an auxiliary storage, an interface, and a bus that connects the units, controls a head driver 36 and a stage driver 32 of the bonding unit 4030, and controls the chip supplier 4011 and the chip conveyor 4051 of the chip supplier 4010. An MPU of the controller 4090 reads and executes, on the main storage, a program stored in the auxiliary storage, and thus outputs a control signal to each of the head driver 36, stage driver 32, the chip supplier 4011, and the chip conveyor 4051 via the interface.

In the bonding device according to the present embodiment, the pickup mechanism 4111 first moves in the vertically upward direction, and thus pushes out one chip CP from the side of the sheet TE, opposite to the plurality of chips CP side and separates the one chip CP from the sheet TE. Next, the chip conveyor 4051 receives the chip CP pushed out in the vertical direction by the pickup mechanism 4111, and then the pickup mechanism 4111 moves to a standby position in the vertically downward direction. At this time, the chip is more stably separated when the chip conveyor 4051 starts to adsorb and hold the chip while the needle pushes up the chip, and the chip rises simultaneously with pushing up and continues to further rise even after the needle stops. At this time, the chip holder 4512 holds the chip CP in a state where the tip portion of the protruding portion 4512*c* abuts only the resin portion CPR1. Next, the chip conveyor 4051 moves the chip holder 4512 to the transfer position Pos1 of the bonding unit 4030. Then, after the chip holder 4512 moves to the transfer position Pos1, the head driver 36 moves a bonding unit 33 in the vertically upward direction, brings the head 33H close to the chip holder 4512, and receives the chip CP held by the chip holder 4512. Next, the chip conveyor 4051 retracts the chip holder 4512 to the chip supply unit 4011 side. Subsequently, in the bonding unit 4030, processing similar to the chip bonding processing described by using FIGS. 9 to 11C in Embodiment 1 is performed.

As described above, the bonding device 4 according to the present embodiment includes the chip conveyor 4051, and the chip conveyor 4051 holds the chip CP in the state where the tip portion of the protruding portion 4512*c* of the chip holder 4512 abuts only the resin portion CPR1. In this way, the chip CP can be conveyed without contacting the metal portion MCP1 of the chip CP, and thus adhesion of a foreign matter to the metal portion MCP1 of the chip CP, damage to the metal portion MCP1 of the chip CP, and adhesion of a particle are suppressed.

In the chip CP, the bonding surfaces of the metal portion MCP1 and the insulating film ICP1 and the contact surface of the resin portion CPR1 are generally polished in such a way as to be flush, and there is a risk that a bonding failure may occur between the chip CP and the substrate WT with the presence of a particle on the bonding surface of the metal portion MCP1 or the insulating film ICP1. In contrast, in the bonding device 4 according to the present embodiment, the chip holder 4512 holds the chip CP while abutting only the resin portion CPR1 around the metal portion MCP1 and the insulating film ICP1, and thus adhesion of a particle to the bonding surfaces of the metal portion MCP1 and the insulating film ICP1 can be suppressed. Further, a particle may adhere to the resin portion CPR1 abutted by the chip holder 4512, but when the chip CP is bonded to the substrate WT, the adhering particle is buried in the resin portion CPR1, and thus bonding of the chip CP to the substrate WT is not affected.

Although each of the embodiments of the present disclosure has been described above, the present disclosure is not limited to each of the embodiments described above. For example, one substrate W1 may be fixed to the other substrate W2 by contacting and pressurizing the two substrates W1 and W2 each including a metal portion, and the two substrates W1 and W2 may be then bonded together by heating the two substrates W1 and W2. Here, the two substrates W1 and W2 may include a metal portion and an oxide film that are exposed from bonding portions bonded together, for example. Alternatively, a metal portion of one of the substrates W1 and W2 may be a pad, and the other metal portion may be a metal bump. In bonding between metal bumps, the metal bumps can be handled in a heated state without being subjected to oxidation in the atmosphere after surface activation by using the metal bumps formed of Au, for example. Here, by performing Ar plasma treatment on each of the bonding surfaces of the substrates W1 and W2 including the Au bump, an impurity on the Au bump surface can be removed, and the surface can also be activated. Subsequently, the surface of the Au bump is not subjected to oxidation even in the atmosphere. Further, a little impurity is adsorbed on the surface of the Au bump, but a new surface is generated on the surface when the substrates W1 and W2 are brought into contact and pressurized, which makes bonding easy. Further, since the surface of the Au bump is not subjected to oxidation, bonding is not adversely affected even when the substrates W1 and W2 in a heated state are held. A surface of a metal bump such as the Au bump has irregularities of Ra of about 4 nm to 200 nm, and a contact area is increased and bonding is performed by pressurizing in a contact state between the substrates W1 and W2. In this case, bonding can be performed at a normal temperature, but solid phase diffusion occurs when the substrates W1 and W2 are heated to a temperature of about 150° C. to 200° C., which makes bonding easy. Thus, even when the substrates W1 and W2 are in contact with each other with a low load (for example, about 10 N) to a degree that does not extend to bonding in a state where both of the substrates W1 and W2 are heated at the same temperature of 150° C., the substrate W2 can be separated from the substrate W1 again. Therefore, when a position deviation amount of the substrates W1 and W2 is measured in a contact state between the substrates W1 and W2, and the position deviation amount then exceeds a threshold value, applied pressure between the substrates W1 and W2 is released, one of the substrates W1 and W2 is returned to an alignment position by a gap, and a relative position is corrected, and the substrates W1 and W2 can be brought into contact with each other again. Then, when the position deviation amount falls within the threshold value described above, applied pressure is increased while maintaining a temperature as it is. Here, the applied pressure is increased to 50 N, for example. In this way, a contact area between the metal bumps increases, and the substrates W1 and W2 can be fixed together. Further, as a reference for increasing a contact area of the Au bump, the substrates W1 and W2 are pressurized at about 150 MPa. In this way, the irregularities on the surface of the Au bump are pressed, a new surface is generated on the surface, and firm bonding is performed. Further, after the substrates W1 and W2 are fixed together, the substrates W1 and W2 are heated at 200° C. for about an hour in a batch furnace and the like, for example, and thus solid phase diffusion can be accelerated at a bonding interface between the substrates W1 and W2, and bonding strength can be increased. Note that the bonding device according to the present modification example has a configuration similar to that of the bonding device 3 described in Embodiment 3.

Figure 21:
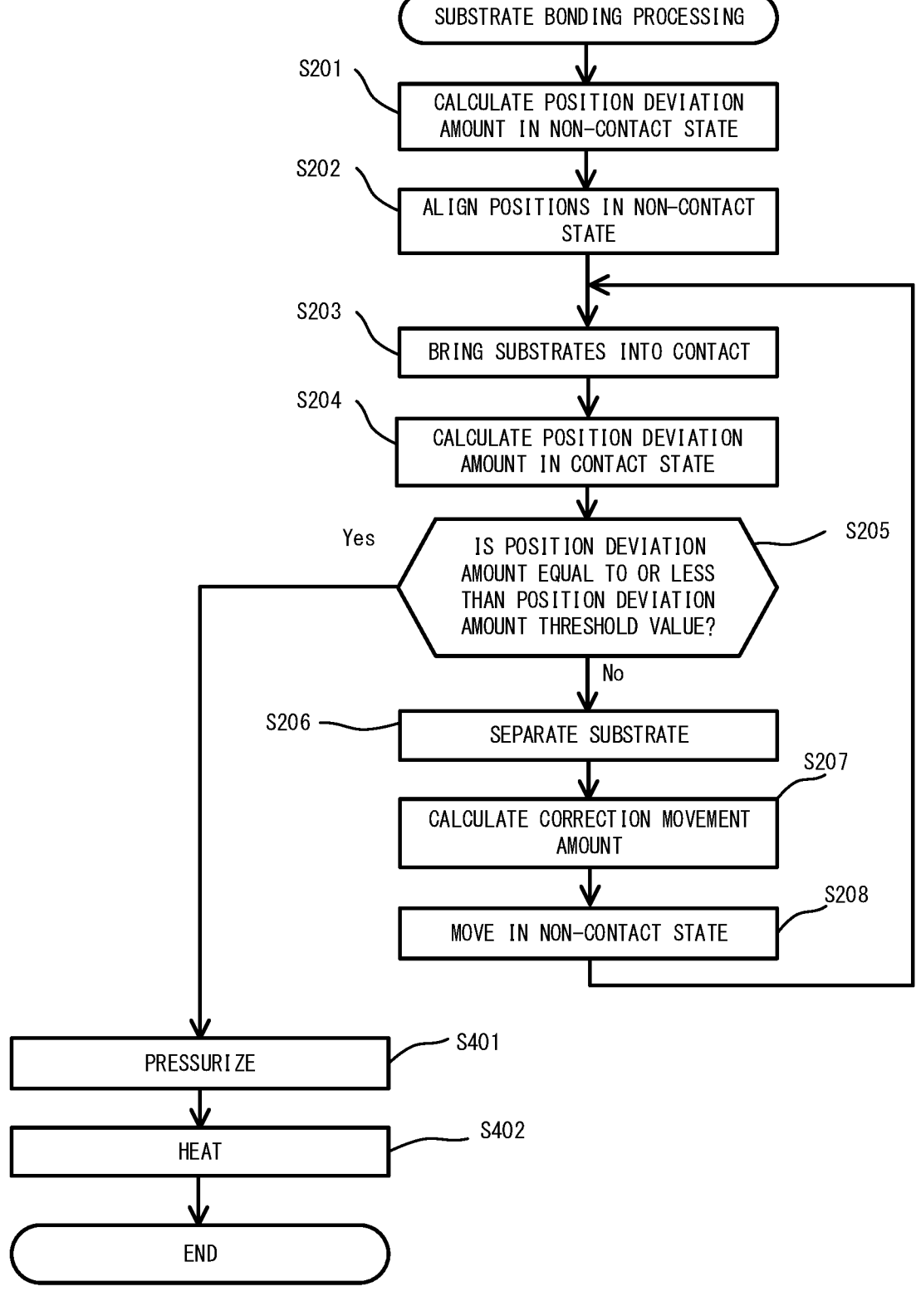
FIG. 21 is a flowchart illustrating a flow of substrate bonding processing performed by a bonding device according to a modification example.

Here, substrate bonding processing performed by the bonding device according to the present modification example is described with reference to FIG. 21. Note that, in FIG. 21, it is assumed that the substrates W1 and W2 are conveyed in the bonding device. Further, it is assumed that the metal portion of each of the substrates W1 and W2 is subjected in advance to surface activation treatment such as plasma treatment. Furthermore, in FIG. 21, processing similar to that in Embodiments 2 and 3 has the same reference sign as that in FIGS. 16 and 18.

First, the bonding device performs a series of processing in steps S201 to S204. Next, the bonding device determines whether all of the calculated position deviation amounts Δx, Δy, and Δθ are equal to or less than the preset position deviation amount threshold values Δxth, Δyth, and Δθth (step S205). When the bonding device determines that any of the calculated position deviation amounts Δx, Δy, and Δθ exceeds the position deviation amount threshold values Δxth, Δyth, and Δθth (step S205: No), the bonding device performs a series of processing in and after step S206.

On the other hand, it is assumed that the bonding device determines that all of the calculated position deviation amounts Δx, Δy, and Δθ are equal to or less than the position deviation amount threshold values Δxth, Δyth, and Δθth (step S205: Yes). In this case, while the bonding device 3 maintains the substrates W1 and W1 at the same preset prescribed temperature, the bonding device applies a driving force to the head 2402 in a direction in which the head 2402 moves toward the stage 2401 side, and thus pressurizes the substrate W2 to the substrate W1 in a direction of close adhesion between the bonding portions of the substrates W1 and W2 with pressure equal to or more than preset reference pressure (step S401). A bonding interface between the substrates W1 and W2 has irregularities at a micrometer level or a nanometer level, and a contact area between the substrates W1 and W2 changes according to magnitude of pressure during pressurization. Then, when pressurizing is performed with pressure less than the reference pressure, the contact area between the substrates W1 and W2 is small, and thus the substrate W2 can be separated from the substrate W1. For example, when the metal portion is formed of Au, the metal portion is easily bonded at a relatively low temperature while being subjected to surface activation treatment as described above. Then, since the bonding interface between the substrates W1 and W2 has irregularities at a micrometer level or a nanometer level as described above, the contact area between the substrates W1 and W2 is small when the substrates W1 and W2 are just in contact with each other with relatively low pressure less than the reference pressure. Further, for example, when the substrates W1 and W2 are in contact with each other in the atmosphere, there is an impurity adhering to the bonding surface of each of the substrates W1 and W2, and thus the substrate W2 can be separated from the substrate W1. On the other hand, when pressurizing is performed with pressure equal to or more than the reference pressure, irregularities present on the bonding surface of the substrates W1 and W2 are crushed and an impurity is also destroyed, the contact area between the substrates W1 and W2 increases, and the substrate W2 is fixed to the substrate W1. Further, in step S401, a position deviation due to the substrate W2 being inclined with respect to the substrate W1 is corrected, and thus a position deviation does not occur even when the substrate W2 is pressurized to the substrate W1 in the direction of close adhesion between the bonding portions of the substrates W1 and W2 with pressure equal to or more than the preset reference pressure.

After that, the bonding device heats the substrates W1 and W2 (step S402). In this way, the substrates W1 and W2 are bonded together. Note that, in step S402, the bonding device may heat the substrates W1 and W2 in a state where the substrate W2 is pressurized in a direction of being pressed against the substrate W1. Here, the bonding surfaces of the substrates W1 and W2 subjected to surface activation treatment are changed to amorphous by removing an oxide film, an impurity, and the like and breaking a crystalline structure, and metallic particles are easily diffused even in a solid phase. Thus, the metallic particles constituting the metal portion are diffused in a solid phase between the substrates W1 and W2, and bond strength between the substrates W1 and W2 increases. The metallic particles move to a void portion generated between the substrates W1 and W2 due to a pressure difference between a portion where the substrates W1 and W2 are in contact and the void portion. In this way, the void portion generated between the substrates W1 and W2 decreases, a bonding area between the substrates W1 and W2 increases, and the substrates W1 and W2 are more strongly bonded together.

Here, when a substrate having a size of the metal portion of about $\varphi 3$ μm or a substrate having a size of the metal portion of $\varphi 1$ μm is adopted as the substrates W1 and W2, the metal portions need to be aligned with high accuracy at a submicron level. In contrast, the bonding device according to the present modification example can perform alignment with high accuracy at a submicron level by performing the substrate bonding processing described above.

Note that, when the substrates W1 and W2 are bonded together by melting the metal portion of each of the substrates W1 and W2 and diffusing the metallic particles, a position deviation of the substrates W1 and W2 or peeling of the substrates W1 and W2 is likely to occur. In contrast, in the present modification example, since the metallic particles are diffused in a solid phase, bonding strength of the substrates W1 and W2 can be improved, and, furthermore, a void generated between the substrates W1 and W2 can be reduced, while maintaining high accuracy of relative positions between the substrates W1 and W2.

Further, in the bonding method according to the present modification example, by performing a series of the processing in steps S203 to S208 in a state where the substrates W1 and W2 are maintained at the same prescribed temperature, a position deviation caused by the substrate W2 being inclined with respect to the substrate W1 is corrected. Therefore, in step S401, a position deviation due to the substrate W2 being inclined with respect to the substrate W1 is corrected, and thus a position deviation does not occur even when the substrate W2 is pressurized to the substrate W1 in the direction of close adhesion between the bonding portions of the substrates W1 and W2 with pressure equal to or more than the preset reference pressure. Thus, there is an advantage that a position deviation of the substrates W1 and W2 does not occur even when the substrates W1 and W2 are heated after that.

The bonding device 1 according to Embodiment 1 may be configured to anode-bond the chip CP and the substrate WT. Alternatively, the bonding device 1 according to Embodiment 1 may hydrophilic-bond the chip CP and the substrate WT.

In Embodiment 1, the example in which the bonding device 1 repeatedly performs the step of fixing one chip CP to the substrate WT via the resin portions CPR1 and WTR1 and the step of bonding the chip CP and the substrate WT by heating is described. However, the present disclosure is not limited to this, and, for example, the bonding device 1 may perform the step of fixing the plurality of chips CP to the substrate WT via the resin portion, and then bond the plurality of chips CP to the substrate WT by collectively heating the plurality of chips CP and the substrate WT. Here, the resin portion is provided only on the plurality of chips CP and not provided on the substrate WT. In a case where the resin portion is provided on the entire region of the substrate WT where the plurality of chips CP is bonded, when an ultraviolet ray having an irradiation region that spreads to a region larger than a region of one chip CP is applied, the resin portion provided in a region of the substrate WT where the chip CP has not been yet bonded is cured. Thus, the plurality of chips CP cannot be fixed to the substrate WT one by one. In contrast, in the present modification example, the resin portion is provided only on the plurality of chips CP, and thus the plurality of chips CP can be fixed to the substrate WT one by one.

In Embodiment 1, the example in which the bonding device 1 fixes the chip CP to the substrate WT via the resin portions CPR1 and WTR1, and then bonds the chip CP to the substrate WT by heating and pressurizing the chip CP and the substrate WT is described. However, the present disclosure is not limited to this, and, for example, the bonding device may fix two substrates to each other via a resin portion, and then bond the two substrates by heating and pressurizing the two substrates.

In Embodiment 1, the configuration in which the resin portion is provided on both of the chip CP and the substrate WT is described, but the present disclosure is not limited to this, and, for example, a configuration in which the resin portion is provided only on the chip CP may be used. When the resin portion is provided on the substrate WT, a degree of freedom in a wiring pattern formed on the substrate WT decreases. In contrast, when a configuration in which the resin portion is not provided on the substrate WT is adopted, it is preferable from a viewpoint of increasing a degree of freedom in a wiring pattern on the substrate WT. Note that a configuration in which the resin portion is provided only on the substrate WT may be used.

In Embodiment 1, the example in which, when the chip CP is aligned with the substrate WT again, the chip CP is separated from the substrate WT once, is then moved with respect to the substrate WT, and is subsequently brought into contact with the substrate WT is described. However, the present disclosure is not limited to this, and, for example, the chip CP may be aligned with the substrate WT by moving the chip CP relatively to the substrate WT while maintaining a state where the chip CP and the substrate WT are in contact with each other. Further, in Embodiments 2 and 3, the example in which, when the substrate W2 is aligned with the substrate W1 again, the substrate W2 is separated from the substrate W1 once, is then moved with respect to the substrate W1, and is subsequently brought into contact with the substrate W1 is described. However, the present disclosure is not limited to this, and, for example, the substrate W2 may be aligned with the substrate W1 by moving the substrate W2 relatively to the substrate W1 while maintaining a state where the substrates W1 and W2 are in contact with each other. In this case, the substrate W2 is not separated from the substrate W1, and thus the substrates W1 and W2 closely adhere to each other. Therefore, a position deviation does not occur even when the substrate W2 is pressurized to the substrate W1 in the direction of close adhesion between the bonding portions of the substrates W1 and W2 with pressure equal to or more than the preset reference pressure.

In Embodiment 1, the example in which the ultraviolet ray irradiation source 51 is disposed vertically above the substrate WT and irradiates the substrate WT with an ultraviolet ray is described. However, the present disclosure is not limited to this, and, for example, a configuration in which the ultraviolet ray irradiation source is disposed on the substrate WT on the chip CP side, and an ultraviolet ray is applied to the chip CP by using the coaxial illumination systems of the capturing units 35a and 35b may be used. Here, a configuration in which an ultraviolet ray is introduced into the coaxial illumination systems of the capturing units 35a and 35b may be used, or a configuration in which the ultraviolet ray irradiation source is disposed with positions of the capturing units 35a and 35b deviating from each other may be used. In this case, for example, even when the substrate WT is an Si substrate, another semiconductor substrate, or the like, and the chip CP is formed of sapphire, the resin portions CPR1 and WTR1 interposed between chip CP and the substrate WT can be irradiated with an ultraviolet ray.

In Embodiments 2 and 3, the method for bonding the substrates W1 and W2 is described, but the present disclosure is not limited to this, and, for example, a chip may be anode-bonded or hydrophilic-bonded to a substrate. Alternatively, a plurality of chips may be anode-bonded or hydrophilic-bonded to a substrate.

In Embodiment 3, the bonding device 3 may bond the substrates W1 and W2 including the metal portions. In this case, the bonding device 3 may press the substrate W2 against the substrate W1 with preset pressure in a state where the metal portion of the substrate W1 and the metal portion of the substrate W2 are in contact, and may not then heat the substrates W1 and W2. Further, the bonding device 3 may press the substrate W2 against the substrate W1, and may then heat the substrates W1 and W2. In this case, the substrates W1 and W2 are more strongly bonded together.

In Embodiments 1 and 4, the example of adopting the method for holding the substrate WT in a posture that the surface WTf on which the chip CP is mounted faces in the vertically downward direction, and mounting the chip CP on the substrate WT from the vertically downward direction is described. However, the present disclosure is not limited to this, and, for example, the bonding devices 1 and 4 according to Embodiments 1 and 4 may adopt a method for disposing the bonding unit 33 vertically above the stage 31, holding the substrate WT in a posture that the surface WTf on which the chip CP is mounted faces in the vertically upward direction, and mounting the chip CP on the substrate WT from the vertically upward direction. In Embodiments 1 and 4, from a viewpoint of suppressing adhesion of a particle to the surface WTf of the substrate WT on which the chip CP is mounted, it is preferable to hold the substrate WT in a posture with the surface WTf facing in the vertically downward direction, but the substrate WT may be held in a posture with the surface WTf facing in the vertically upward direction.

Description is given to the example in which the bonding device 4 according to Embodiment 4 holds and conveys the chip CP in a state where the protruding portion 4512c of the chip holder 4512 abuts only the resin portion CPR1 of the chip CP, and thus a particle is prevented from adhering to the surface CPf of the chip CP mounted on the substrate WT. However, the present disclosure is not limited to this, and, for example, in the chip supplier 4010, the chip CP may be conveyed to the transfer position Pos1 of the bonding unit 4030 in a state where a circumferential lower end of the chip CP pushed up by the needle 4111a is scooped up with two arms (not illustrated) and the two arms are held. In this case, the head 33H may include a post pin (not illustrated) being movable in the vertical direction. Then, the head 33H may be configured in such a way that, when the two arms that hold the chip CP are disposed in the transfer position Pos1, the post pin is raised, a tip portion of the post pin holds a central portion of a lower surface of the chip CP, the arms move to a position other than the transfer position Pos1, the post pin is then lowered, and the post pin adsorbs and holds a tip portion of the head 33H. Also, in this case, the chip CP can be conveyed without bringing the arms into contact with the surface CPf of the chip CP bonded to the substrate WT. Further, when the substrate WT is held in a posture with the surface WTf facing in the vertically upward direction, the chip conveyor may include a first subchip conveyor that receives and conveys the chip CP from the chip supplier 4010, a reverser that receives and reverses the chip CP from the first subchip conveyor, and a second subchip conveyor that receives the chip CP from the reverser by holding a surface on a side opposite to the surface CPf side of the chip CP and conveys the chip CP to the head 33H. Also, in this case, the chip CP can be conveyed without contacting the surface CPf of the chip CP.

In Embodiment 4, the example of the bonding device 4 in which the chip CP is picked up one by one in the chip supply unit 4010 and the chip CP is mounted on the substrate WT one by one in the bonding unit 4030 is described. However, the present disclosure is not limited to this, and, for example, the chip supply unit may supply a plurality of types of chips CP, and the bonding unit may collectively receive the plurality of chips CP from the chip supply unit, cause the head to hold the plurality of chips CP, and mount the plurality of chips CP at once on the substrate WT by bringing the head close to the substrate WT.

Figure 22A:
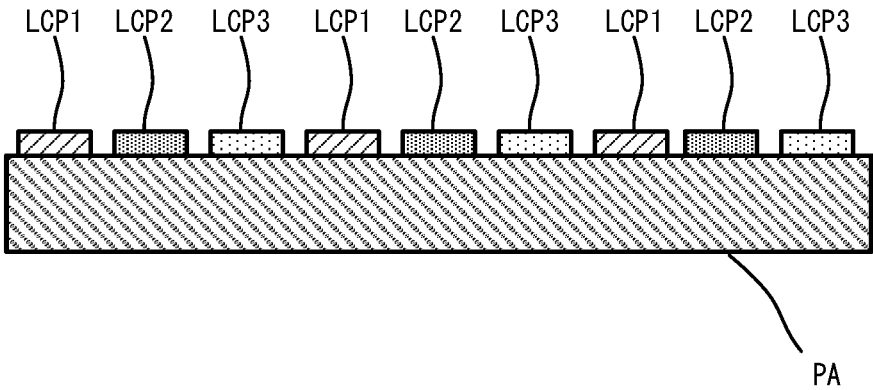
FIG. 22A is a schematic diagram illustrating one example of an LED panel.
Figure 22B:
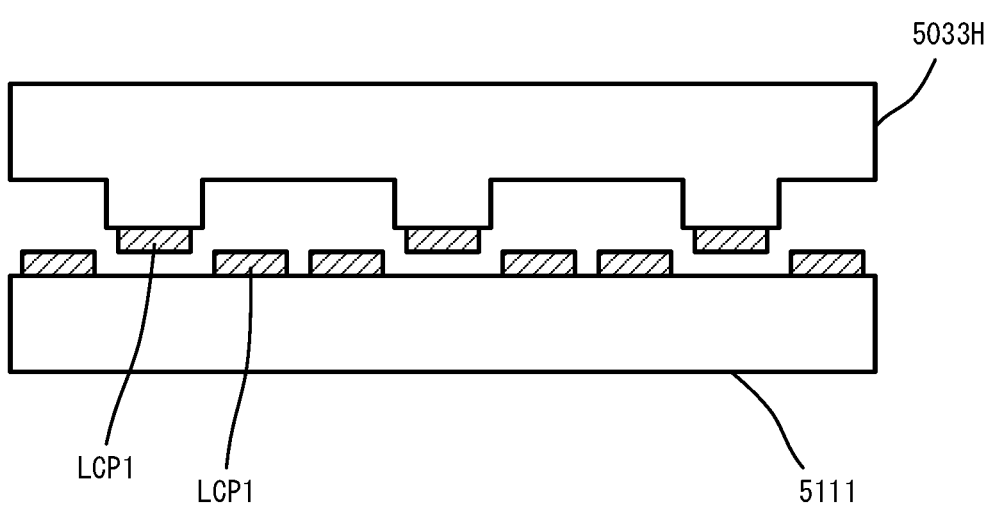
FIG. 22B is a schematic configuration diagram illustrating a part of the bonding device according to the modification example.

For example, as illustrated in FIG. 22A, a so-called light emitting diode (LED) panel may be manufactured by bonding, onto a panel PA, LED chips (hereinafter referred to as a "red LED chip", a "green LED chip", and a "blue LED chip") LCP1, LCP2, and LCP3 that emit red light, green light, and blue light in an arrangement order of the red LED chip LCP1, the green LED chip LCP2, and the blue LED chip LCP3. In this case, as illustrated in FIG. 22B, the chip supplier may include a chip substrate 5111 that supplies the plurality of LED chips (for example, the red LED chips LCP1) at once to the bonding unit. Then, a head 5033H takes out, from the chip substrate 5111, any one type of the LED chip (for example, the red LED chip LCP1) from the red LED chip LCP1, the green LED chip LCP2, and the blue LED chip LCP3 at an interval of two LED chips, and bonds the LED chip to the panel PA at an interval of two LED chips. The head 5033H collectively takes out a preset number, for example, $N^2$ (for example, nine) LED chips arranged in a lattice pattern of N×N (N is a positive integer, for example, 3×3). Here, for example, it is assumed that the red LED chip LCP1 is first bonded to the substrate WT. In this case, the green LED chip LCP2 is bonded to the substrate WT in a state where a position of the head 5033H in the horizontal direction is shifted by one LED chip from a position when the red LED chip LCP2 is bonded to the substrate WT. Next, the blue LED chip LCP3 is bonded to the substrate WT in a state where a position of the head 5033H in the horizontal direction is shifted by one LED chip from a position when the green LED chip LCP2 is bonded to the substrate WT. In this way, the red LED chip LCP1, the green LED chip LCP2, and the blue LED chip LCP3 are adjacent to each other in this order and are bonded together. The LED panel is manufactured by repeating a series of the processing until the LED chips LCP1, LCP2, and LCP3 are boded to the entire panel PA. Here, in manufacturing the chip substrate 5111, first, by passing through a semiconductor manufacturing step, the LED chips are formed into individual pieces in a state where a wafer on which the plurality of LED chips is formed with high position accuracy is bonded to a different support substrate. Next, the plurality of LED chips bonded to the support substrate are transferred to a different substrate, and the support substrate is then peeled. In this case, the bonding unit causes the head 5033H to hold a preset number of the LED chip (for example, the red LED chip LCP1) from the plurality of LED chips LCP placed on a carrier. Then, the bonding unit bonds the preset number of the LED chip to the substrate WT at once by bringing the head 5033H that holds the preset number of the LED chip close to the substrate WT. Here, when the substrate WT is larger than a chip tool of the head 5033H, the preset number of the LED chip may be bonded to the substrate WT for a plurality of times by repeating a series of the processing described above for a plurality of times.

Note that, when the chip supplier takes out a plurality of chips, the chip supplier may adsorb the plurality of chips CP or may take out the plurality of chips CP by using electrostatic force or adhesion. Further, when the chip supplier takes out a plurality of chips, the chip supplier may perform alignment of each of the plurality of chips CP. When alignment is performed, the chip tool provided on the head and the chip CP may be recognized, or a part of the chip substrate that holds the chip CP may be recognized. In this case, the chip CP can be held by the head with high position accuracy. Further, when alignment of the chip CP with the substrate WT is performed, the chip CP may be recognized, or a part of the chip tool that holds the chip CP may be recognized. Further, when the chip CP is an LED chip, the chip tool may be exchanged for each LED chip that emits red light, green light, and blue light. Further, when the chip CP is bonded to the substrate WT, a position of the substrate WT may be fixed, and the head that holds the chip CP may be moved, or a position of the head that holds the chip CP may be fixed, and the substrate WT may be moved in a direction closer to the head. Further, bonding of the chip CP to the substrate WT may use heating and pressurizing, or use a transfer technique.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-238011, filed on Dec. 27, 2019, the entire disclosure of which is incorporated by reference herein.

INDUSTRIAL APPLICABILITY

The present disclosure is suitable for manufacturing a CMOS image sensor, a memory, an arithmetic element, and an MEMS, for example.

REFERENCE SIGNS LIST 1, 2, 3, 4 Bonding device
31 Stage
32 Stage driver
33 Bonding unit
33H, 5033H Head
Z direction driver
35a, 35b, 41 Capturing unit
36, 2404 Head driver
37 θ direction driver
38 Linear guide
51 Ultraviolet ray irradiation source
90, 2090 Controller
311 X direction mover
312, 314, 316 Opening
313 Y direction mover
315 Substrate placer
321 X direction driver
323 Y direction driver
331 Z-axis direction movement member
332 First disc member
333 Piezoelectric actuator
334 Second disc member
334a, 334b Hole
336 Mirror fixing member
337 Mirror
337a, 337b Inclination surface
351a, 351b, 418 Image sensor
352a, 352b, 419 Optical system
361 Rotation member
363 Camera Z direction driver
365 Camera F direction driver
411 Chip tool
413 Head main body
415, 416 Hollow portion
2200 Chamber
2201 Vacuum pump
2202 Exhaust pipe
203 Exhaust valve
2401 Stage
2402 Head
2403 Stage driver
2405 XY direction driver
2406 Raising and lowering driver
2407 Rotation driver
2408, 2412 Pressure sensor
2411 Piezoelectric actuator
2421, 2422 Temperature adjuster
2500 Measurement unit
2501, 2502 Capturing unit
2503 Window
2504, 2505 Mirror

4010 Chip supply unit
4011 Chip supplier
4111 Pickup mechanism
4111*a* Needle
4112 Sheet holding frame
4119 Frame holder
4030 Bonding unit
4051 Chip conveyor
4511 Main body
4512 Chip holder
4512*b* Adsorption portion
4512*c* Protruding portion
5111 Chip substrate
CPf, WTf Surface
CPR1, WTR1 Resin portion
GAa, GAb Capturing image
LCP1 Red LED chip
LCP2 Green LED chip
LCP3 Blue LED chip
MC1*a*, MC1*b*, MK1*a*, MK1*b*, MK2*a*, MK2*b*, MW1*a*, MW1*b* Alignment mark
MCP1, MWT1 Metal portion
Pos1 Transfer position
TR1 Recessed portion

The invention claimed is:

1. A bonding method for bonding a first bonded article and a second bonded article, the second bonded article including a second bonding portion bonded to a first bonding portion of the first bonded article, and a resin portion located in a region other than the second bonding portion on a side bonded to the first bonded article and formed of an ultraviolet curing resin, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonding portion and the resin portion of the second bonded article into contact with the first bonded article after the positioning step;

a fixing step of fixing the second bonded article to the first bonded article by irradiating the resin portion with an ultraviolet ray and curing the resin portion in a state where the first bonded article and the second bonded article are maintained at the prescribed temperature and the resin portion of the second bonded article is in contact with the first bonded article; and a bonding step of bonding the second bonding portion of the second bonded article to the first bonding portion of the first bonded article by heating the first bonded article and the second bonded article in a state where the second bonded article is fixed to the first bonded article, wherein a plurality of the second bonded articles is present, and the bonding step is performed after all of the plurality of second bonded articles is fixed to the first bonded article by repeating the fixing step.

2. The bonding method according to claim 1, wherein the first bonding portion is a first metal portion, the second bonding portion is a second metal portion, and, in the bonding step, the second bonded article is bonded to the first bonded article via the first metal portion and the second metal portion by heating in a state where the first metal portion and the second metal portion are in contact.

3. A bonding method for bonding a first bonded article and a second bonded article, the second bonded article including a second bonding portion bonded to a first bonding portion of the first bonded article, and a resin portion located in a region other than the second bonding portion on a side bonded to the first bonded article and formed of an ultraviolet curing resin, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonding portion and the resin portion of the second bonded article into contact with the first bonded article after the positioning step;

a fixing step of fixing the second bonded article to the first bonded article by irradiating the resin portion with an ultraviolet ray and curing the resin portion in a state where the first bonded article and the second bonded article are maintained at the prescribed temperature and the resin portion of the second bonded article is in contact with the first bonded article; and a bonding step of bonding the second bonding portion of the second bonded article to the first bonding portion of the first bonded article by heating the first bonded article and the second bonded article in a state where the second bonded article is fixed to the first bonded article, wherein any one of the first bonded article and the second bonded article is (W2) a glass containing an alkaline ion, and the other is a metal or a semiconductor, and, in the bonding step, the first bonded article and the second bonded article are anode-bonded by applying a DC voltage between the first bonded article and the second bonded article.

4. A bonding method for bonding a first bonded article and a second bonded article, the second bonded article including a second bonding portion bonded to a first bonding portion of the first bonded article, and a resin portion located in a region other than the second bonding portion on a side bonded to the first bonded article and formed of an ultraviolet curing resin, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonding portion and the resin portion of the second bonded article into contact with the first bonded article after the positioning step;

a fixing step of fixing the second bonded article to the first bonded article by irradiating the resin portion with an ultraviolet ray and curing the resin portion in a state where the first bonded article and the second bonded article are maintained at the prescribed temperature and the resin portion of the second bonded article is in contact with the first bonded article;

a bonding step of bonding the second bonding portion of the second bonded article to the first bonding portion of the first bonded article by heating the first bonded article and the second bonded article in a state where the second bonded article is fixed to the first bonded article; and a hydrophilic treatment step of performing hydrophilic treatment on at least one of the first bonding portion and the second bonding portion, wherein, in the bonding step, the second bonded article is bonded to the first bonded article by heating in a state where the first bonding portion and the second bonding portion are in contact.

5. A bonding method for bonding a first bonded article and a second bonded article, the second bonded article including a second bonding portion bonded to a first bonding portion of the first bonded article, and a resin portion located in a region other than the second bonding portion on a side bonded to the first bonded article and formed of an ultraviolet curing resin, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonding portion and the resin portion of the second bonded article into contact with the first bonded article after the positioning step;

a fixing step of fixing the second bonded article to the first bonded article by irradiating the resin portion with an ultraviolet ray and curing the resin portion in a state where the first bonded article and the second bonded article are maintained at the prescribed temperature and the resin portion of the second bonded article is in contact with the first bonded article;

a bonding step of bonding the second bonding portion of the second bonded article to the first bonding portion of the first bonded article by heating the first bonded article and the second bonded article in a state where the second bonded article is fixed to the first bonded article;

a bonded article supply step of supplying the second bonded article; and a bonded article conveyance step of conveying the second bonded article to a position for bonding the second bonded article to the first bonded article while the second bonded article is held by a bonded article holder that holds the second bonded article supplied in the bonded article supply step in a state where only the resin portion is abutted.

6. A bonding method for bonding a first bonded article formed of a glass containing an alkaline ion and a second bonded article formed of a metal or a semiconductor, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonded article into contact with the first bonded article after the positioning step;

a measurement step of measuring a position deviation amount of the first bonded article with respect to the second bonded article in a state where the first bonded article and the second bonded article are in contact;

a correction movement step of correcting and moving the second bonded article relatively to the first bonded article in such a way as to reduce the position deviation amount, based on the position deviation amount; and a bonding step of bonding the second bonded article to the first bonded article by applying a DC voltage between the first bonded article and the second bonded article in a state where the first bonded article and the second bonded article are maintained at the prescribed temperature and the second bonded article is in contact with the first bonded article, wherein when the position deviation amount is equal to or less than a preset position deviation amount threshold value, the bonding step is performed, and, when the position deviation amount is greater than the position deviation amount threshold value, the measurement step and the correction movement step are performed again.

7. A bonding method for bonding a first bonded article and a second bonded article including a second bonding portion bonded to a first bonding portion of the first bonded article, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the first bonding portion and the second bonding portion into contact after the positioning step;

a measurement step of measuring a position deviation amount of the first bonded article with respect to the second bonded article in a state where the first bonding portion and the second bonding portion are in contact;

a correction movement step of correcting and moving the second bonded article relatively to the first bonded article in such a way as to reduce the position deviation amount, based on the position deviation amount;

a fixing step of fixing the second bonded article to the first bonded article by pressurizing with pressure equal to or more than preset reference pressure in a direction of close adhesion between the first bonded article and the second bonded article in a state where the first bonded article and the second bonded article are maintained at the prescribed temperature and the first bonding portion and the second bonding portion are in contact; and a bonding step of bonding the second bonded article to the first bonded article by heating the first bonded article and the second bonded article after the fixing step, wherein when the position deviation amount is equal to or less than a preset position deviation amount threshold value, the fixing step is performed, and, when the position deviation amount is greater than the position deviation amount threshold value, the measurement step and the correction movement step are performed again.

8. A bonding method for bonding a first bonded article and a second bonded article including a second bonding portion bonded to a first bonding portion of the first bonded article, the bonding method comprising:

a hydrophilic treatment step of performing hydrophilic treatment on at least one of the first bonding portion and the second bonding portion;

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the first bonding portion and the second bonding portion into contact after the positioning step;

a measurement step of measuring a position deviation amount of the first bonded article with respect to the second bonded article in a state where the first bonded article and the second bonded article are in contact;

a correction movement step of correcting and moving the second bonded article relatively to the first bonded article in such a way as to reduce the position deviation amount, based on the position deviation amount; and a temporary bonding step of temporarily bonding the second bonded article to the first bonded article by pressurizing in a direction of close adhesion between the first bonding portion of the first bonded article and the second bonding portion of the second bonded article in a state where the first bonding portion and the second bonding portion are in contact, wherein when the position deviation amount is equal to or less than a preset position deviation amount threshold value, the temporary bonding step is performed, and, when the position deviation amount is greater than the position deviation amount threshold value, the measurement step and the correction movement step are performed again.

9. A bonded article, comprising:

a second bonding portion bonded to a first bonding portion of another bonded article, and a resin portion located in a region other than the second bonding portion on a side bonded to the another bonded article, and formed of an ultraviolet curing resin, wherein the resin portion is embedded in a recessed portion provided in a region other than the second bonding portion on a side bonded to the another bonded article.

10. A bonding device that bonds a first bonded article and a second bonded article, the second bonded article including a second bonding portion bonded to a first bonding portion of the first bonded article, and a resin portion located in a region other than the second bonding portion on a side bonded to the first bonded article, and formed of an ultraviolet curing resin, the bonding device comprising:

a first bonded article holder that holds the first bonded article;

a second bonded article holder that holds the second bonded article;

a second holder driver that moves the second bonded article holder relatively to the first bonded article holder in a direction closer to the first bonded article holder or a direction farther from the second bonded article holder in a first direction in which the first bonded article holder and the second bonded article holder face each other;

a measurement unit that measures a position deviation amount of the second bonded article with respect to the first bonded article in a state where the first bonded article and the second bonded article are maintained at a same preset prescribed temperature;

a second holder driver that moves the second bonded article holder relatively to the first bonded article holder in a second direction orthogonal to the first direction;

an ultraviolet ray irradiation source that irradiates the first bonded article and the second bonded article with an ultraviolet ray; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by irradiating the resin portion with an ultraviolet ray and curing the resin portion by controlling the ultraviolet ray irradiation source when the position deviation amount is equal to or less than a preset position deviation amount threshold value.

11. The bonding device according to claim 10, further comprising:

a bonded article supplier that supplies the second bonded article; and a bonded article conveyor that includes a bonded article holder, and conveys the second bonded article to a transfer position in which the second bonded article is transferred to the bonded article holder in a state where the second bonded article is held by the bonded article holder without contacting the second bonding portion, the bonded article holder receiving the second bonded article supplied from the bonded article supplier in a state where only the resin portion is abutted, and holding the second bonded article.

12. A bonding device that bonds a first bonded article formed of a glass containing an alkaline ion and a second bonded article formed of a metal or a semiconductor, the bonding device comprising:

a first bonded article holder that holds the first bonded article;

a second bonded article holder that holds the second bonded article;

a second holder driver that moves the second bonded article holder relatively to the first bonded article holder in a direction closer to the first bonded article holder or a direction farther from the second bonded article holder in a first direction in which the first bonded article holder and the second bonded article holder face each other;

a temperature adjuster that adjusts a temperature of the first bonded article and a temperature of the second bonded article;

a measurement unit that measures a position deviation amount of the second bonded article with respect to the first bonded article in a state where the first bonded article and the second bonded article are maintained at a same preset prescribed temperature by the temperature adjuster;

a second holder driver that moves the second bonded article holder relatively to the first bonded article holder in a second direction orthogonal to the first direction;

a DC power source that applies a DC voltage between the first bonded article and the second bonded article; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by applying a DC voltage between the first bonded article and the second bonded article by controlling the DC power source when the position deviation amount is equal to or less than a preset position deviation amount threshold value.

13. A bonding device that bonds a first bonded article and a second bonded article including a second bonding portion bonded to a first bonding portion of the first bonded article, the bonding device comprising:

a first bonded article holder that holds the first bonded article;

a second bonded article holder that holds the second bonded article;

a second holder driver that moves the second bonded article holder relatively to the first bonded article holder in a direction closer to the first bonded article holder or a direction farther from the second bonded article holder in a first direction in which the first bonded article holder and the second bonded article holder face each other;

a temperature adjuster that adjusts a temperature of the first bonded article and a temperature of the second bonded article;

a measurement unit that measures a position deviation amount of the second bonded article with respect to the first bonded article in a state where the first bonded article and the second bonded article are maintained at a same preset prescribed temperature by the temperature adjuster;

a second holder driver that moves the second bonded article holder relatively to the first bonded article holder in a second direction orthogonal to the first direction; and a controller that controls the first holder driver and the second holder driver, based on the position deviation amount measured by the measurement unit, adjusts a relative position of the first bonded article with respect to the second bonded article in a direction orthogonal to the second direction, then brings the first bonded article and the second bonded article into contact, then measures a position deviation amount of the first bonded article with respect to the second bonded article by the measurement unit in a state where the first bonded article and the second bonded article are in contact, corrects and moves the second bonded article relatively to the first bonded article in such a way as to reduce the position deviation amount, based on the position deviation amount, and fixes the second bonded article to the first bonded article by pressing the second bonded article against the first bonded article with pressure equal to or more than preset reference pressure when the position deviation amount is equal to or less than a preset position deviation amount threshold value.

14. A bonding method for bonding a first bonded article and a second bonded article, the second bonded article including a second bonding portion bonded to a first bonding portion of the first bonded article, and a resin portion located in a region other than the second bonding portion on a side bonded to the first bonded article and formed of an ultraviolet curing resin, the bonding method comprising:

a positioning step of determining a relative position of the second bonded article with respect to the first bonded article in such a way as to reduce a position deviation amount of the second bonded article with respect to the first bonded article while maintaining the first bonded article and the second bonded article at a same preset prescribed temperature;

a contact step of bringing the second bonding portion and the resin portion of the second bonded article into contact with the first bonded article after the positioning step;

a fixing step of fixing the second bonded article to the first bonded article by irradiating the resin portion with an ultraviolet ray and curing the resin portion in a state where the first bonded article and the second bonded article are maintained at the prescribed temperature and the resin portion of the second bonded article is in contact with the first bonded article;

a bonding step of bonding the second bonding portion of the second bonded article to the first bonding portion of the first bonded article by heating the first bonded article and the second bonded article in a state where the second bonded article is fixed to the first bonded article;

a measurement step of measuring a position deviation amount of the first bonded article with respect to the second bonded article in a state where the first bonded article is in contact with the second bonding portion and the resin portion of the second bonded article; and a correction movement step of correcting and moving the second bonded article relatively to the first bonded article in such a way as to reduce the position deviation amount, based on the position deviation amount, wherein when the position deviation amount is equal to or less than a preset position deviation amount threshold value, the fixing step is performed, and, when the position deviation amount is greater than the position deviation amount threshold value, the measurement step and the correction movement step are performed again, a plurality of the second bonded articles is present, and the bonding step is performed after all of the plurality of second bonded articles is fixed to the first bonded article by repeating the fixing step.

* * * * *